US008207548B2

(12) United States Patent
Nagai

(10) Patent No.: US 8,207,548 B2
(45) Date of Patent: Jun. 26, 2012

(54) SEMICONDUCTOR LIGHT EMITTING DEVICE, LIGHT EMITTING MODULE, LIGHTING APPARATUS, DISPLAY ELEMENT AND MANUFACTURING METHOD OF SEMICONDUCTOR LIGHT EMITTING DEVICE

(75) Inventor: Hideo Nagai, Takatsuki (JP)

(73) Assignee: Panasonic Corporation, Osaka (JP)

( * ) Notice: Subject to any disclaimer, the term of this patent is extended or adjusted under 35 U.S.C. 154(b) by 244 days.

(21) Appl. No.: 12/615,600

(22) Filed: Nov. 10, 2009

(65) Prior Publication Data

US 2010/0078657 A1    Apr. 1, 2010

Related U.S. Application Data

(62) Division of application No. 10/567,510, filed as application No. PCT/JP2004/011713 on Aug. 9, 2004, now Pat. No. 7,675,075.

(30) Foreign Application Priority Data

Aug. 28, 2003  (JP) ................. 2003-305402
Sep. 30, 2003  (JP) ................. 2003-340020
Feb. 3, 2004   (JP) ................. 2004-026851

(51) Int. Cl.
| H01L 29/201 | (2006.01) |
| H01L 33/00 | (2010.01) |
| H01L 29/205 | (2006.01) |
| H01L 29/207 | (2006.01) |
| H01L 23/48 | (2006.01) |
| H01L 23/52 | (2006.01) |
| H01L 29/40 | (2006.01) |

(52) U.S. Cl. ............... 257/98; 257/90; 257/91; 257/93; 257/95; 257/96; 257/99; 257/100; 257/745; 257/774; 257/E33.057; 257/E33.059; 257/E33.061; 257/E33.062; 257/E33.069

(58) Field of Classification Search .................... None
See application file for complete search history.

(56) References Cited

U.S. PATENT DOCUMENTS

| 5,642,373 A | * | 6/1997 | Kamizato et al. ............ 372/50.1 |
| 5,959,316 A | | 9/1999 | Lowery |
| 6,183,100 B1 | * | 2/2001 | Suckow et al. ................. 362/35 |
| 6,373,188 B1 | | 4/2002 | Johnson et al. |
| 6,600,175 B1 | | 7/2003 | Baretz et al. |

(Continued)

FOREIGN PATENT DOCUMENTS

DE            4422660          2/1995

(Continued)

OTHER PUBLICATIONS

Taiwan Application No. 93124467 Office Action dated Jan. 2, 2012, 11 pages.

(Continued)

*Primary Examiner* — Hoang-Quan Ho

(57) ABSTRACT

An LED array chip (2), which is one type of a semiconductor light emitting device, includes an array of LEDs (6), a base substrate (4) supporting the array of the LEDs (6), and a phosphor film (48). The array of LEDs (6) is formed by dividing a multilayer epitaxial structure including a light emitting layer into a plurality of portions. The phosphor film (48) covers an upper surface of the array of the LEDs (6) and a part of every side surface of the array of LEDs (6). Here, the part extends from the upper surface to the light emitting layer.

12 Claims, 58 Drawing Sheets

U.S. PATENT DOCUMENTS

| | | |
|---|---|---|
| 6,614,103 B1 | 9/2003 | Durocher et al. |
| 6,639,354 B1 | 10/2003 | Kojima et al. |
| 6,696,704 B1 | 2/2004 | Maeda et al. |
| 6,964,877 B2 | 11/2005 | Chen et al. |
| 7,019,330 B2 | 3/2006 | Ludowise |
| 7,019,335 B2 | 3/2006 | Suenaga |
| 7,126,159 B2 * | 10/2006 | Itai et al. .................. 257/91 |
| 7,205,168 B2 * | 4/2007 | Oohata et al. ............... 438/22 |
| 7,285,801 B2 | 10/2007 | Eliashevich et al. |
| 7,301,175 B2 | 11/2007 | Izuno et al. |
| 7,320,593 B2 * | 1/2008 | Ostler et al. ................. 433/29 |
| 7,378,334 B2 | 5/2008 | Nagahama et al. |
| 7,390,684 B2 | 6/2008 | Izuno et al. |
| 7,417,259 B2 | 8/2008 | Sakai et al. |
| 2002/0028527 A1 | 3/2002 | Maeda et al. |
| 2002/0030444 A1 | 3/2002 | Muller-Mach et al. |
| 2002/0093023 A1 | 7/2002 | Camras et al. |
| 2002/0117677 A1 * | 8/2002 | Okuyama et al. ............ 257/94 |
| 2002/0123164 A1 | 9/2002 | Slater, Jr. et al. |
| 2002/0139987 A1 | 10/2002 | Collins, III et al. |
| 2002/0149298 A1 | 10/2002 | Furukawa et al. |
| 2002/0153830 A1 | 10/2002 | Andriessen |
| 2002/0185965 A1 | 12/2002 | Collins, III et al. |
| 2003/0052322 A1 | 3/2003 | Yamaguchi et al. |
| 2003/0141506 A1 | 7/2003 | Sano et al. |
| 2003/0190764 A1 | 10/2003 | Lee et al. |
| 2004/0061433 A1 | 4/2004 | Izuno et al. |
| 2004/0108511 A1 | 6/2004 | Baik et al. |
| 2004/0120155 A1 | 6/2004 | Suenaga |
| 2004/0188696 A1 | 9/2004 | Hsing Chen et al. |
| 2005/0012109 A1 | 1/2005 | Kohno et al. |
| 2005/0244993 A1 | 11/2005 | Bogner et al. |
| 2006/0180818 A1 | 8/2006 | Nagai et al. |
| 2008/0251808 A1 * | 10/2008 | Kususe et al. ............... 257/98 |
| 2008/0296609 A1 | 12/2008 | Nagahama et al. |

FOREIGN PATENT DOCUMENTS

| | | |
|---|---|---|
| DE | 10039435 | 2/2002 |
| EP | 1 020 935 | 7/2000 |
| EP | 1 198 016 | 4/2002 |
| GB | 2280061 | 1/1995 |
| JP | 07-030153 | 1/1995 |
| JP | 07-111339 | 4/1995 |
| JP | 07-178960 | 7/1995 |
| JP | 08-083929 | 3/1996 |
| JP | 10-270801 | 10/1998 |
| JP | 11-191642 | 7/1999 |
| JP | 11-251627 | 9/1999 |
| JP | 11-510968 | 9/1999 |
| JP | 2000-091628 | 3/2000 |
| JP | 2000-208822 | 7/2000 |
| JP | 2000-2088222 | 7/2000 |
| JP | 2001-015817 | 1/2001 |
| JP | 2001-298216 | 10/2001 |
| JP | 2002-076435 | 3/2002 |
| JP | 2002-176201 | 6/2002 |
| JP | 3088422 | 6/2002 |
| JP | 2002-533938 | 10/2002 |
| JP | 2002-344019 | 11/2002 |
| JP | 2002-359402 | 12/2002 |
| JP | 2003-526212 | 9/2003 |
| TW | 540169 | 3/2001 |
| WO | 97/48138 | 12/1997 |
| WO | 02/11214 | 2/2002 |
| WO | 02/089219 | 11/2002 |
| WO | 03/034508 | 4/2003 |
| WO | 03/044872 | 5/2003 |
| WO | 03/058726 | 7/2003 |
| WO | 2005/013365 | 2/2005 |

OTHER PUBLICATIONS

Japanese Application No. 2004-238614 Office Action dated Oct. 12, 2010, 3 pages.

* cited by examiner

FIG.4
STEP A1
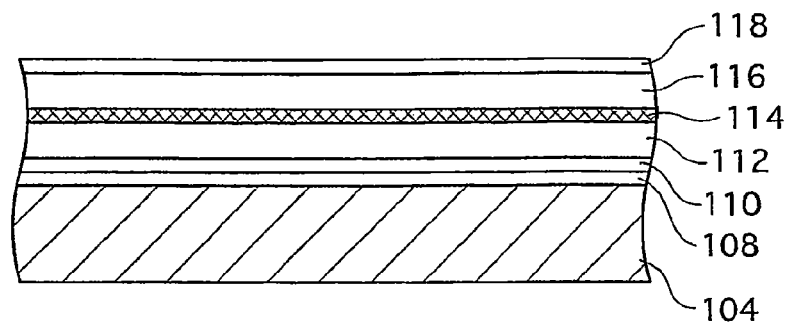
STEP B1
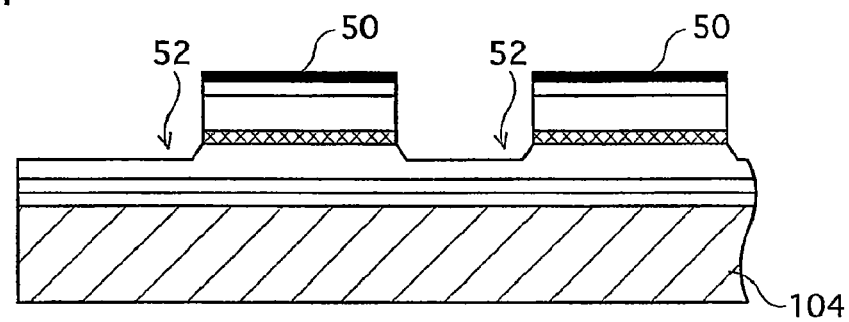
STEP C1
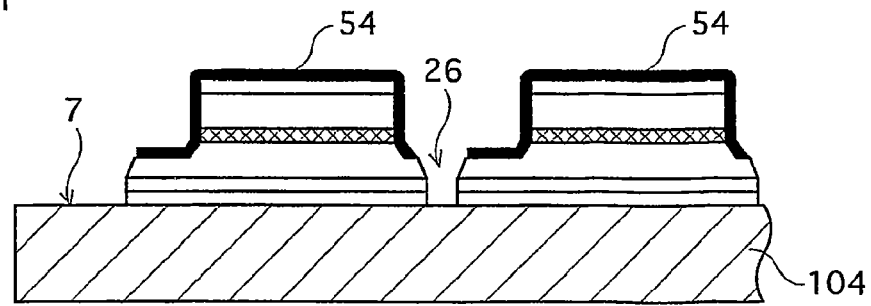

FIG.5
STEP D1
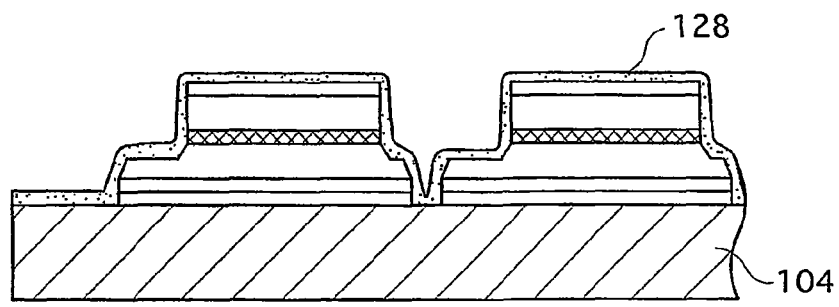
STEP E1
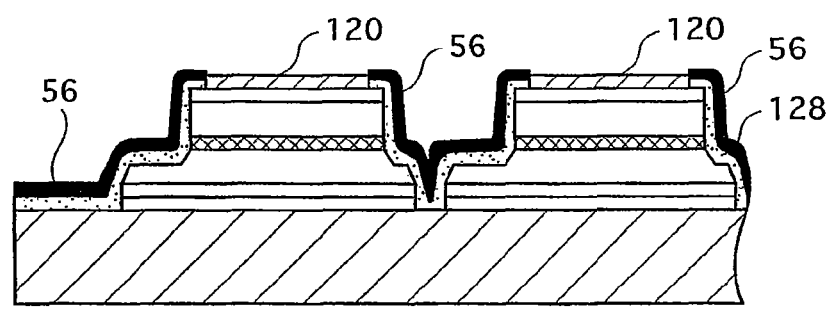
STEP F1
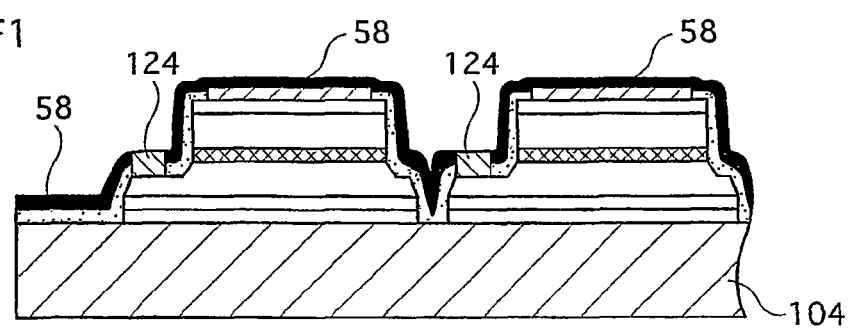

FIG.6
STEP G1
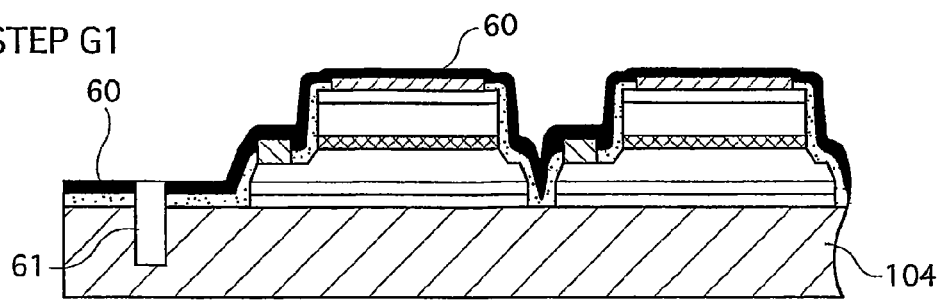
STEP H1
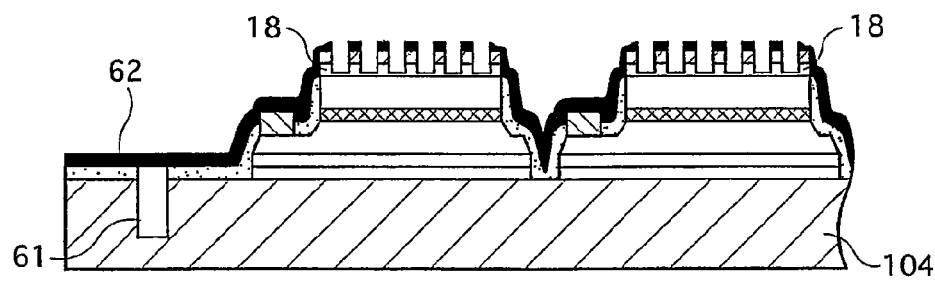
STEP I1
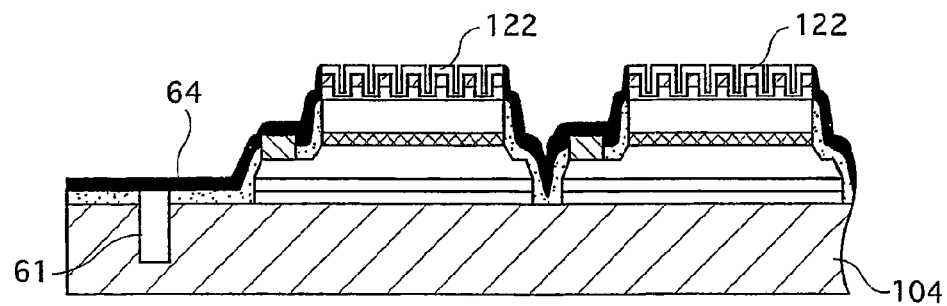

FIG. 7
STEP J1
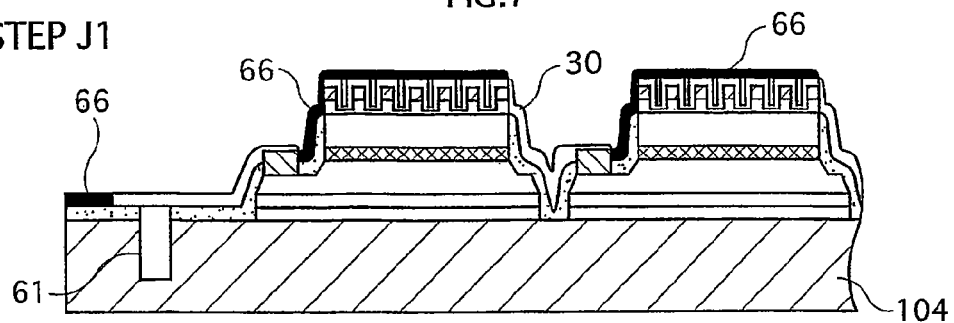
STEP K1
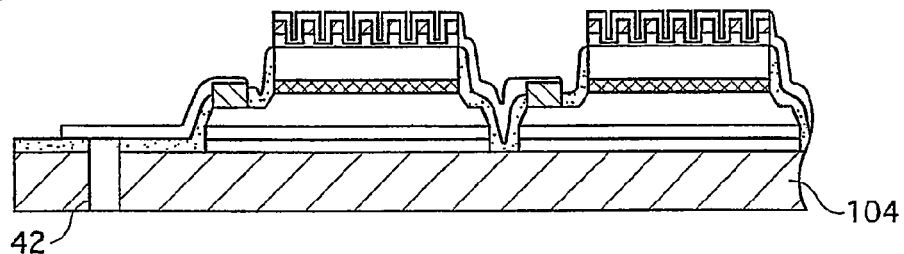
STEP L1
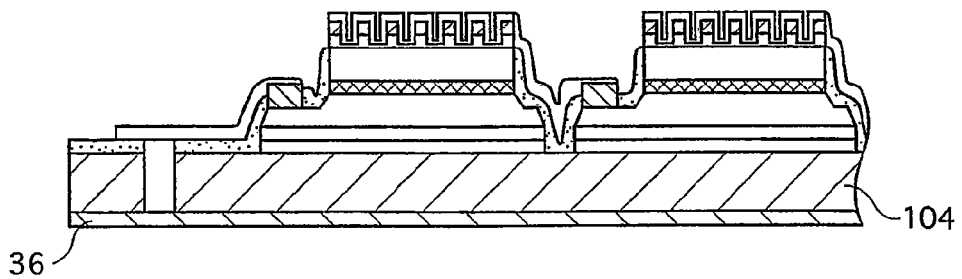
STEP M1
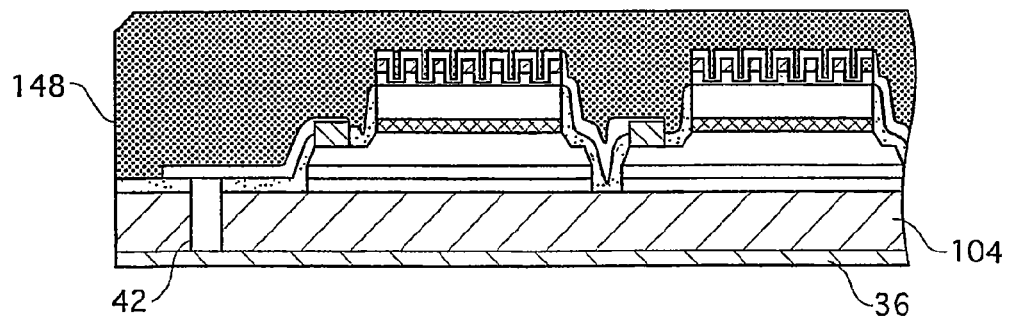

FIG.15
STEP A2
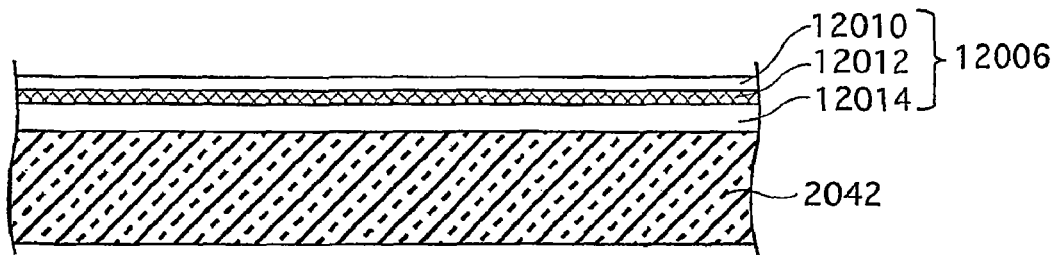
STEP B2
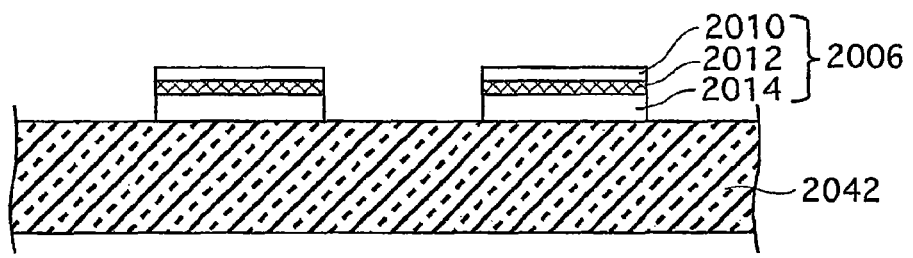
STEP C2
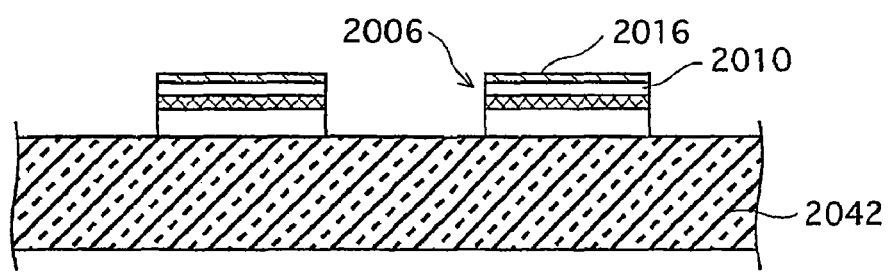

FIG.16
STEP D2
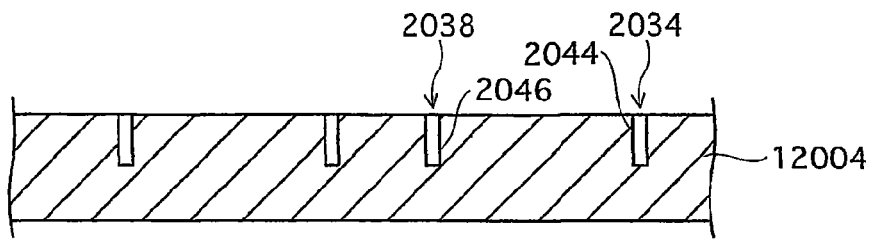
STEP E2
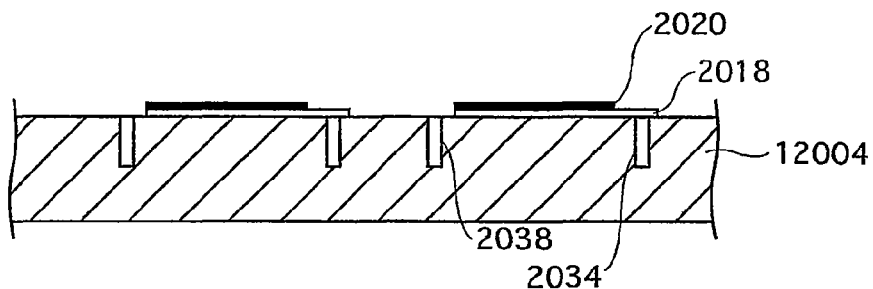
STEP F2
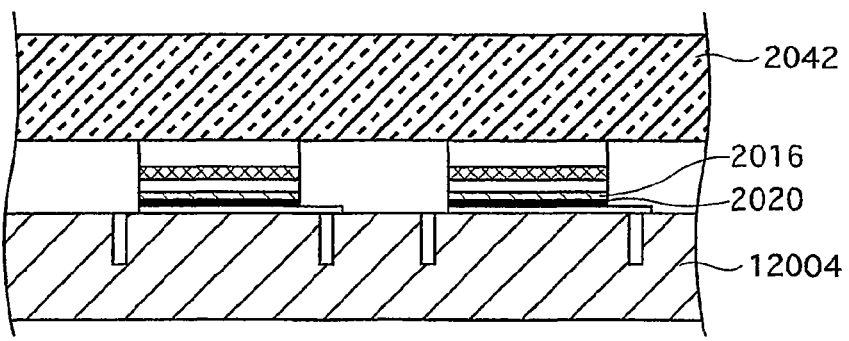

FIG. 17
STEP G2
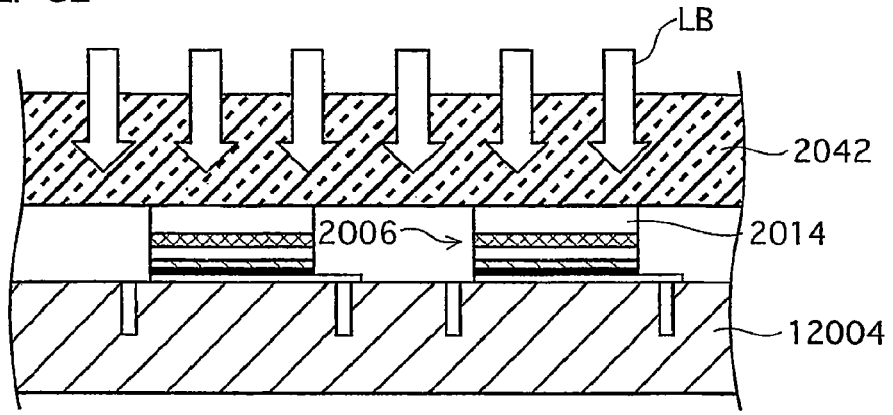
STEP H2
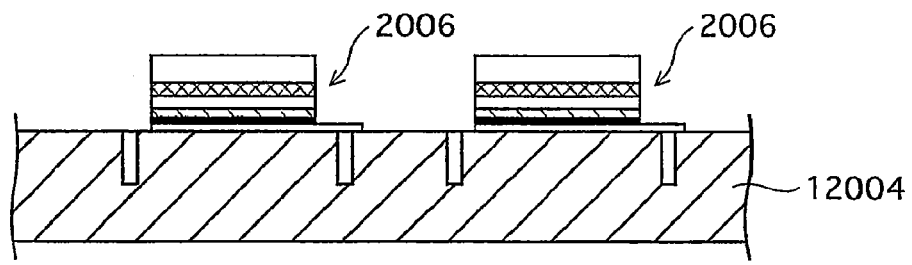
STEP I2
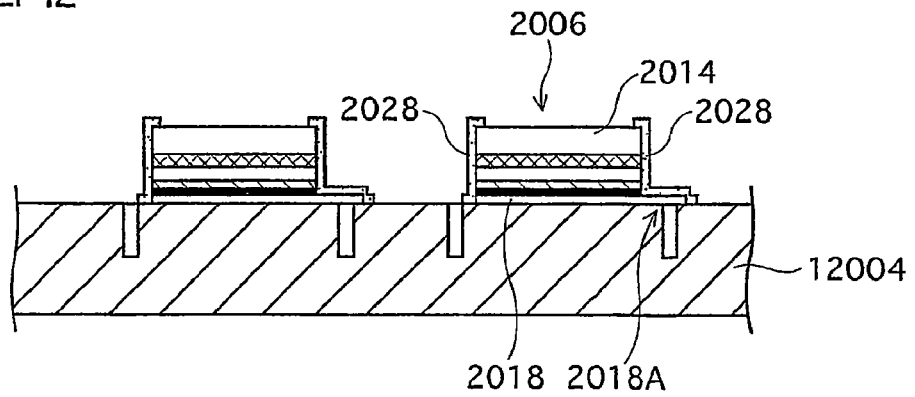

FIG.18
STEP J2
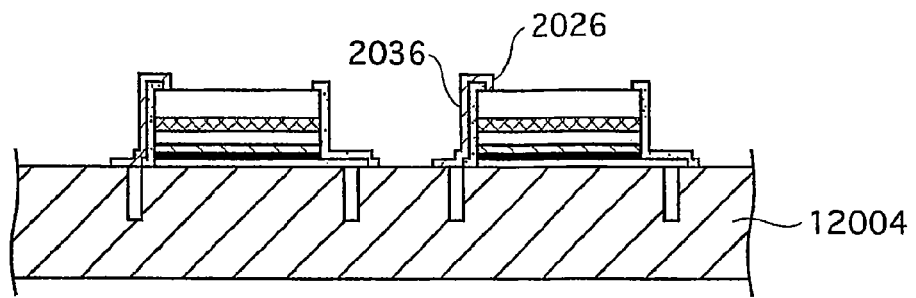
STEP K2
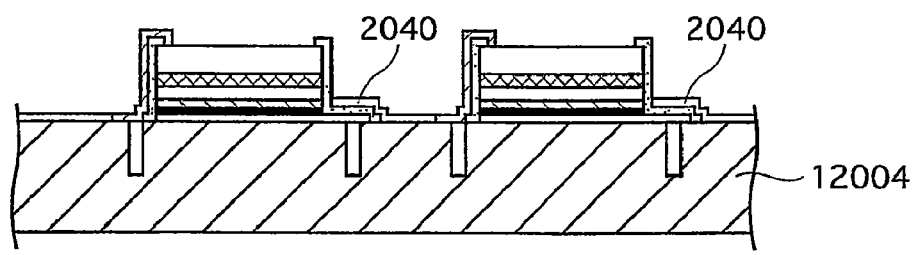
STEP L2
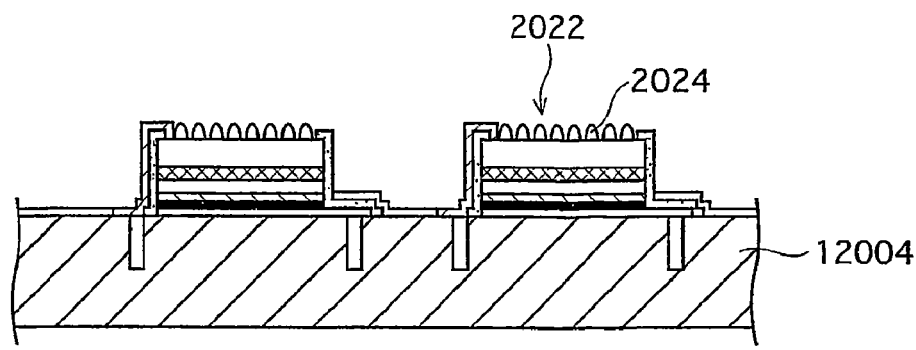

FIG.19
STEP M2
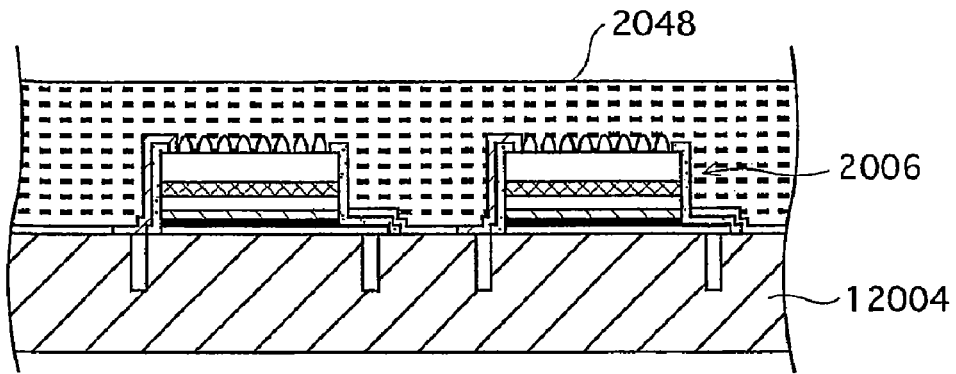
STEP N2
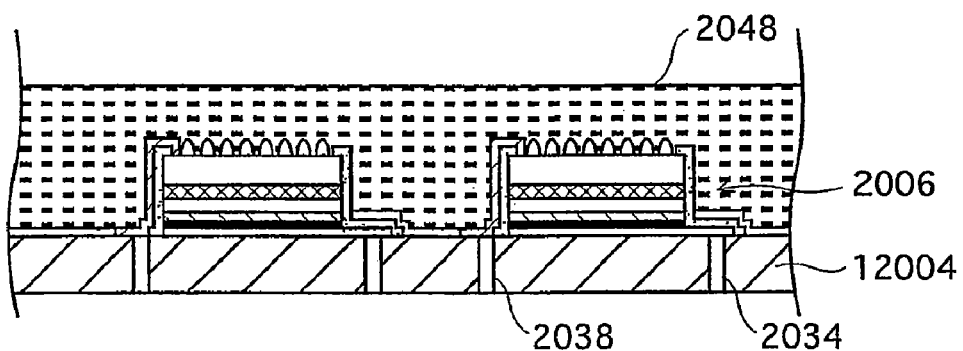
STEP O2
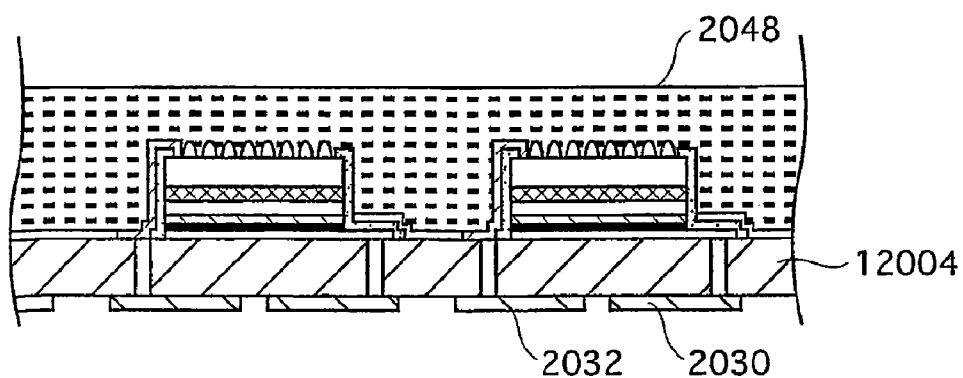

FIG.20
STEP P2
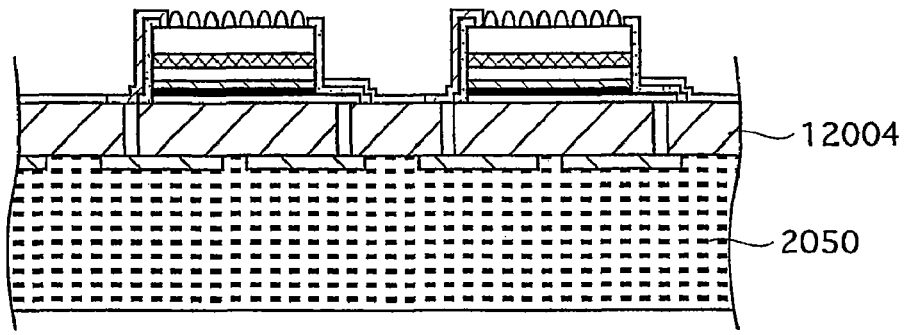
STEP Q2
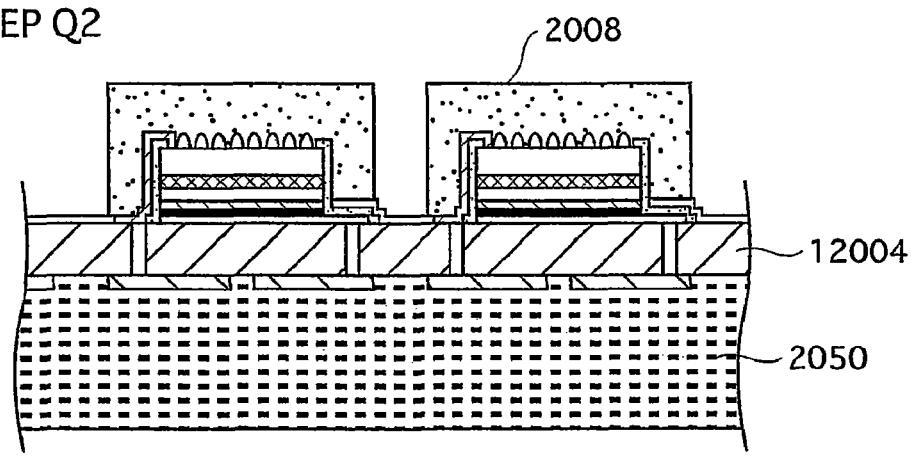
STEP R2
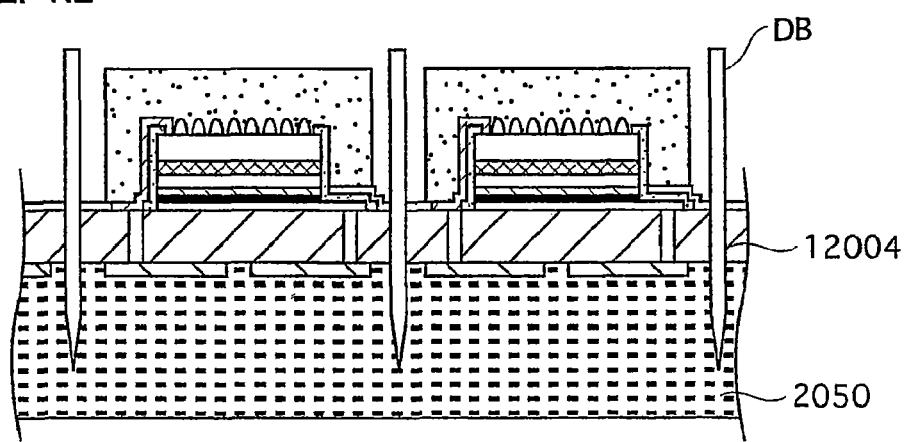

FIG.22
STEP A3
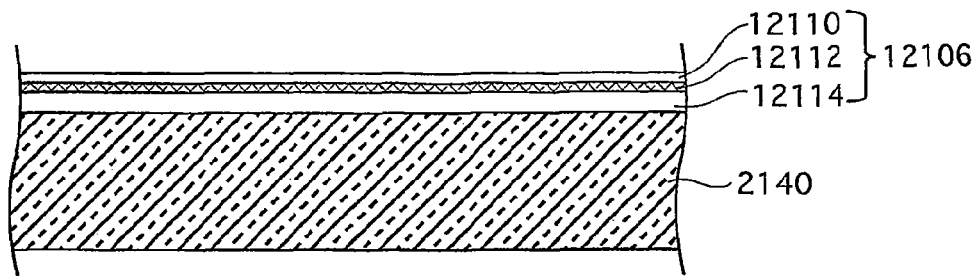
STEP B3
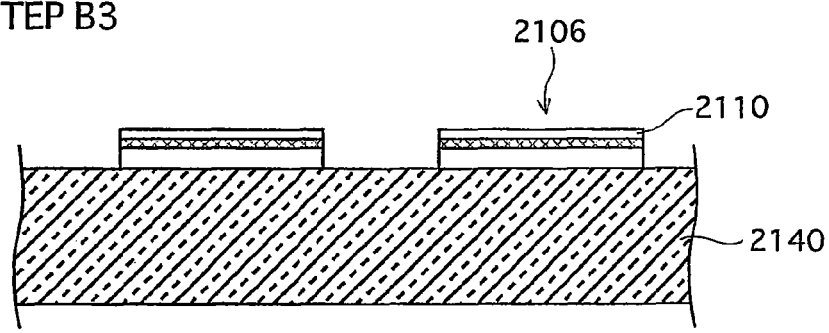
STEP C3
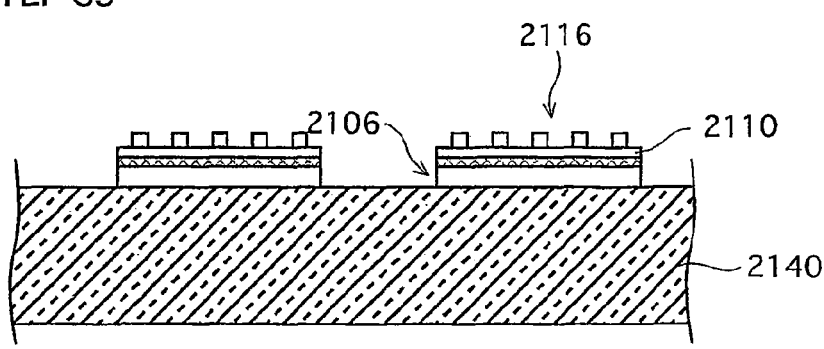

FIG.23
STEP D3
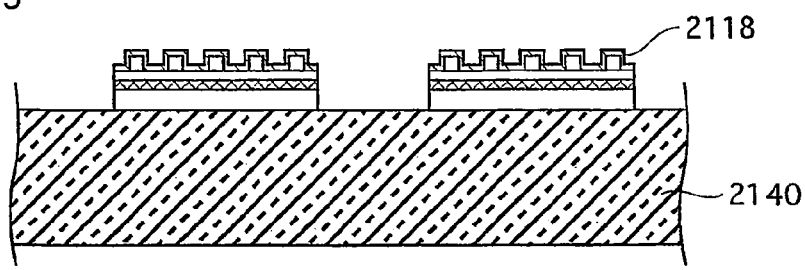
STEP E3
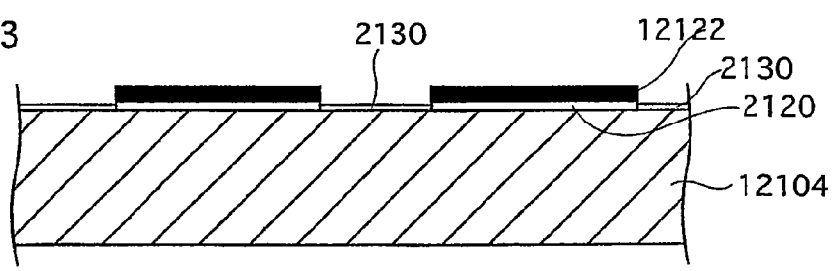
STEP F3
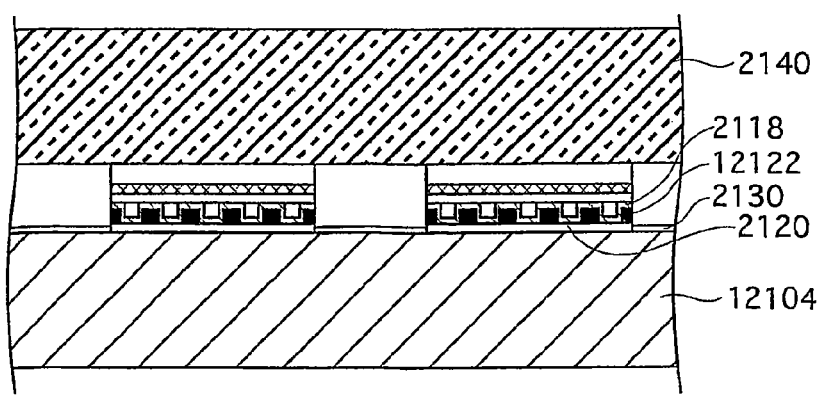

FIG.24
STEP G3
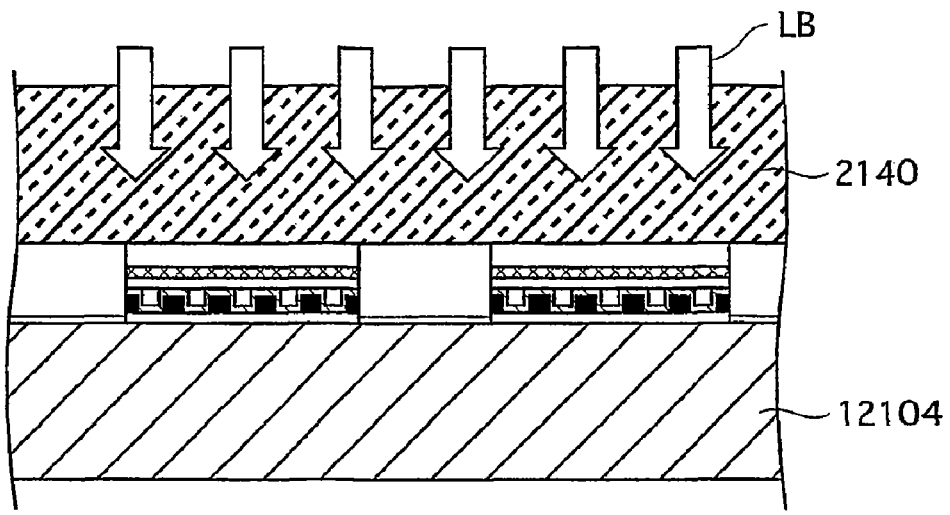
STEP H3
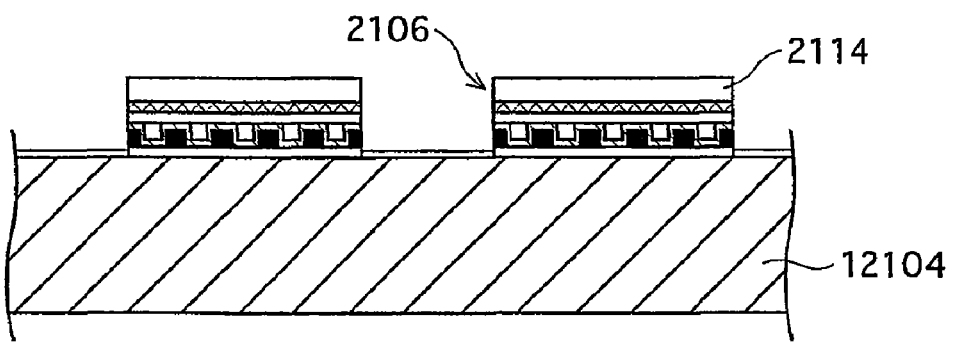
STEP I3
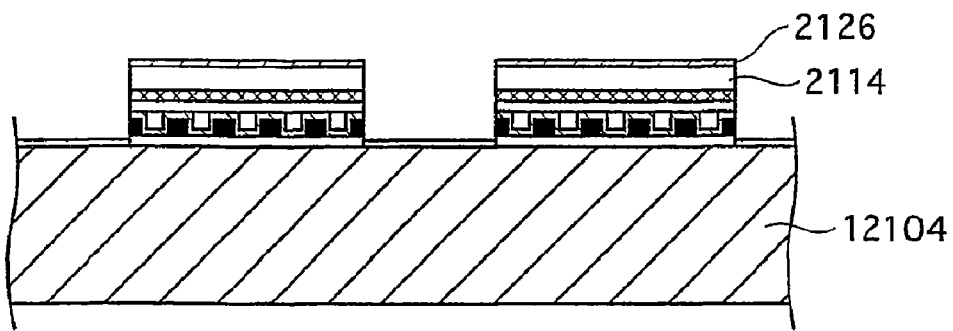

FIG.25
STEP J3
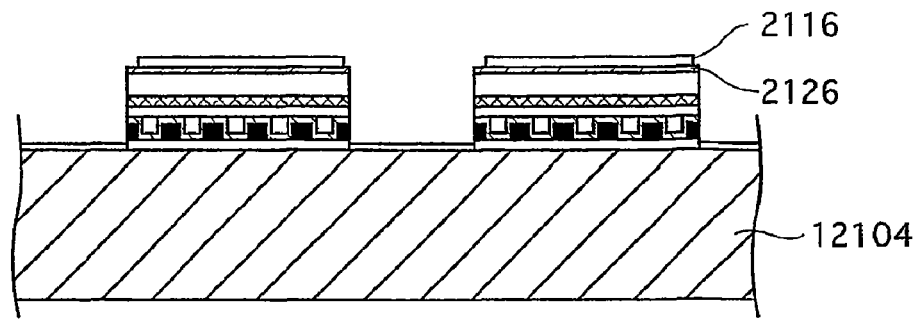
STEP K3
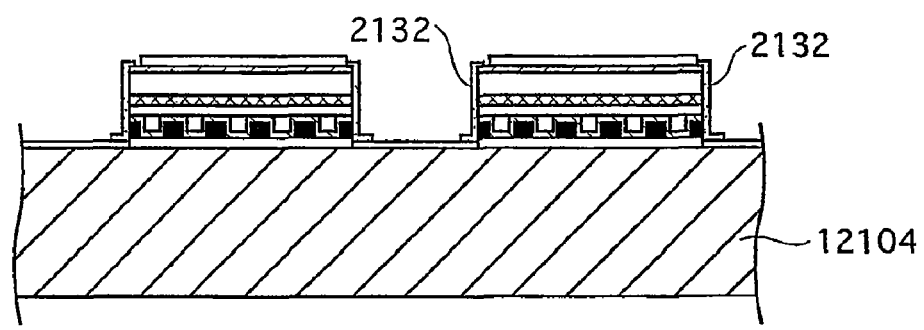
STEP L3
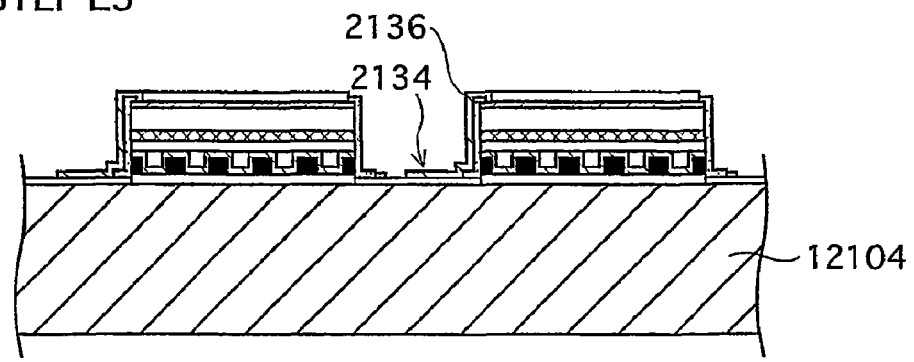

FIG.26
STEP M3
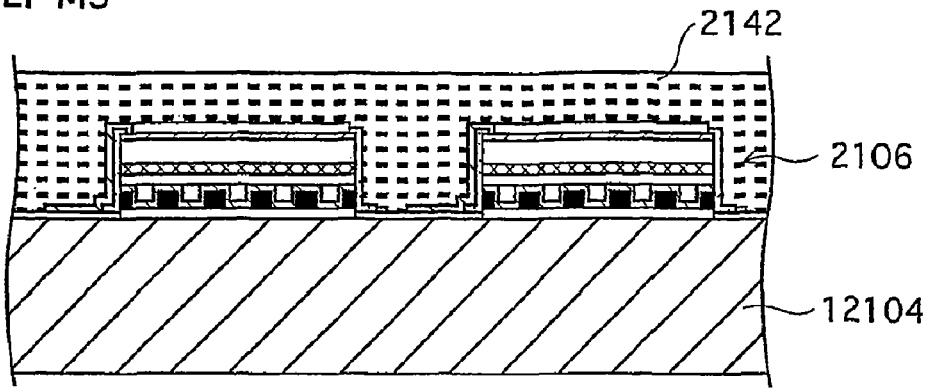
STEP N3
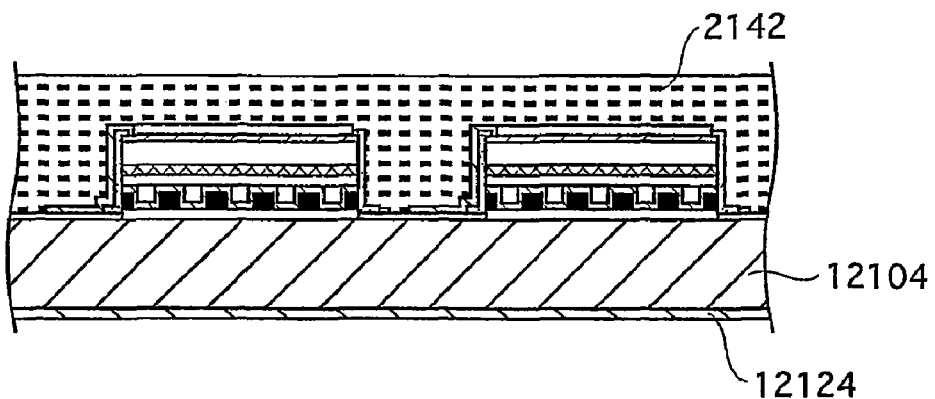
STEP O3
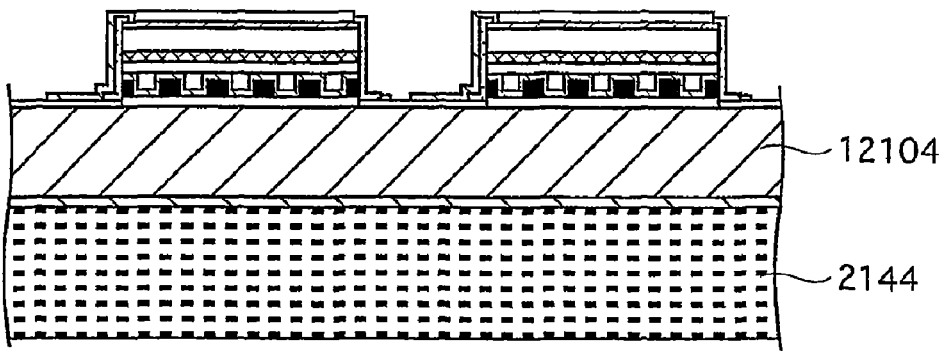

FIG.27
STEP P3
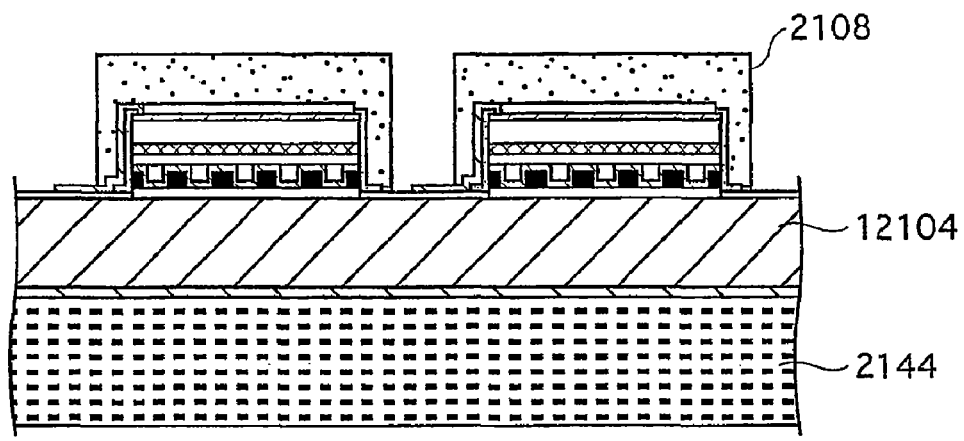
STEP Q3
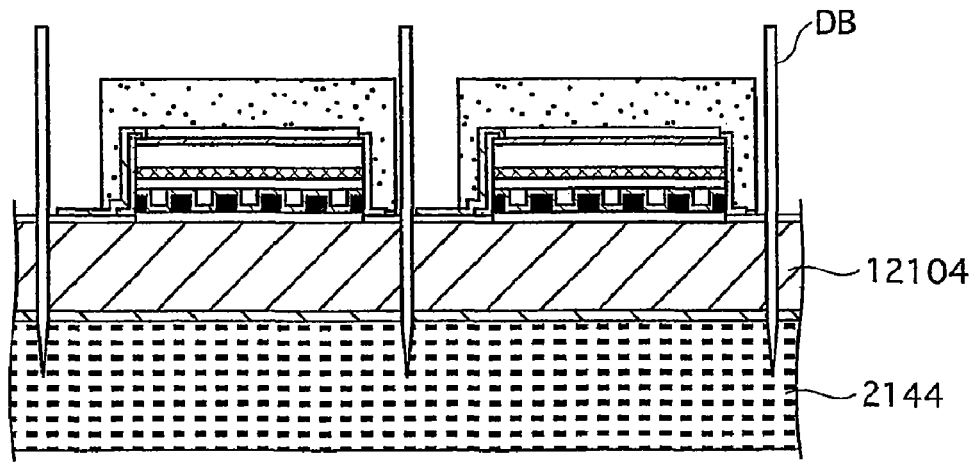

FIG.29
STEP A4
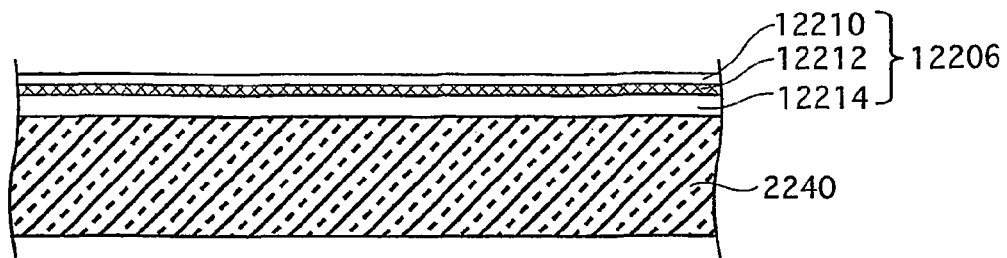
STEP B4
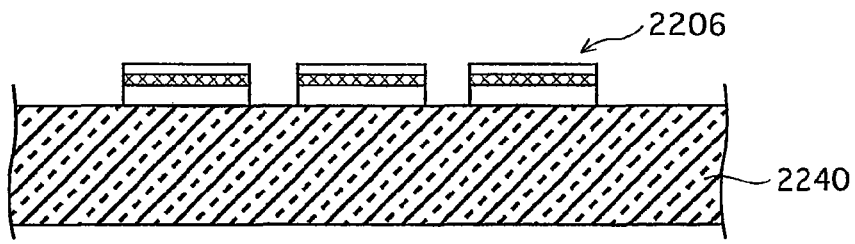
STEP C4
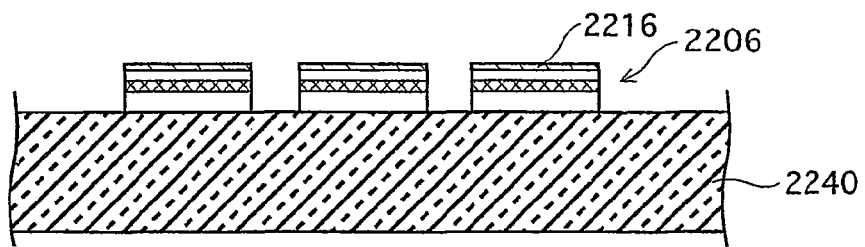

FIG.30
STEP D4
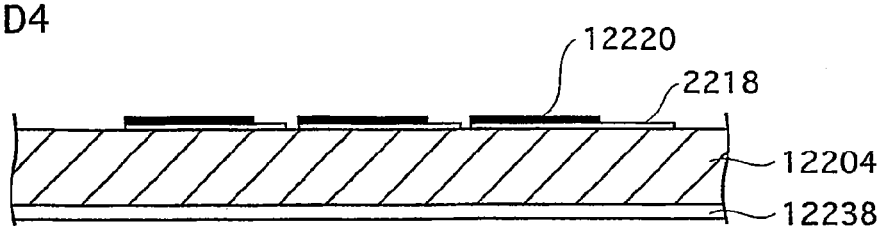
STEP E4
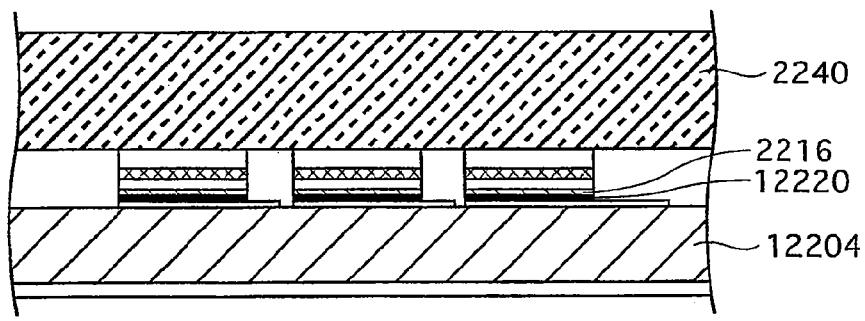
STEP F4
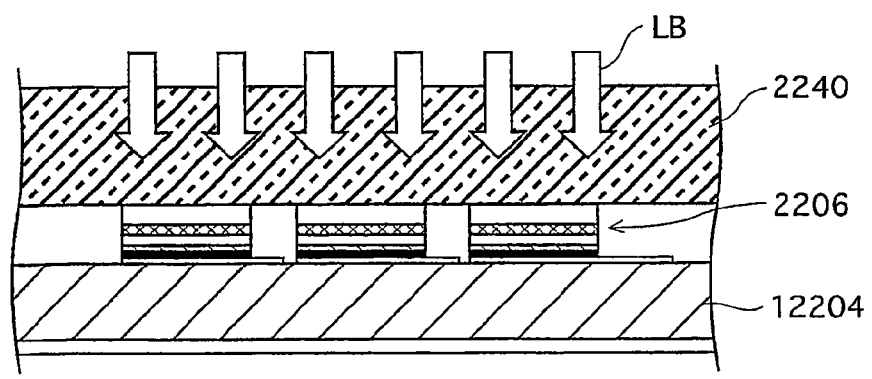

FIG.31
STEP G4
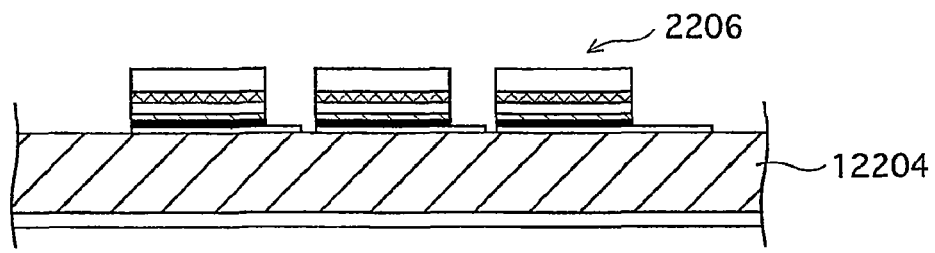
STEP H4
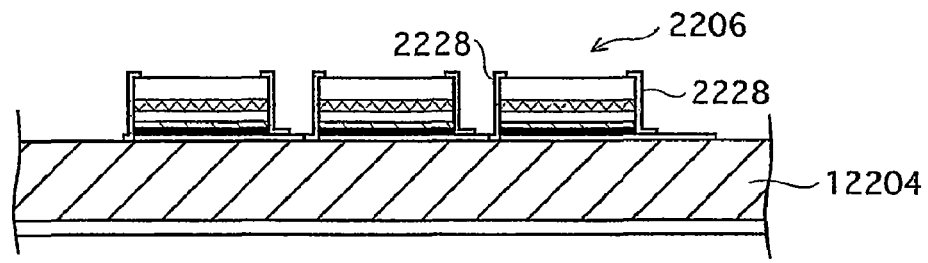
STEP I4
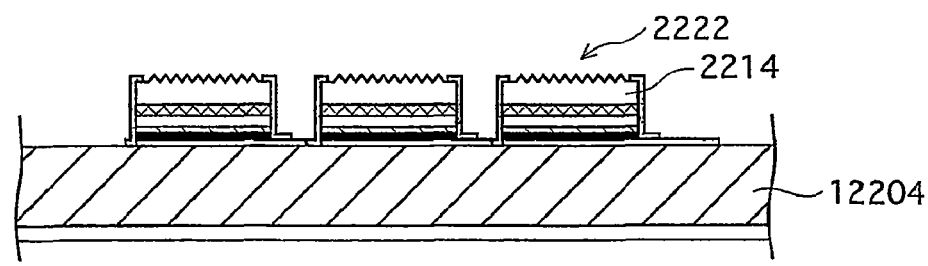

FIG.32
STEP J4
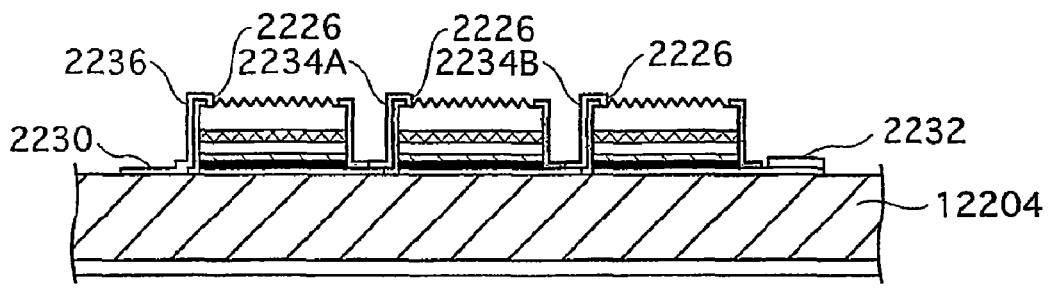
STEP K4
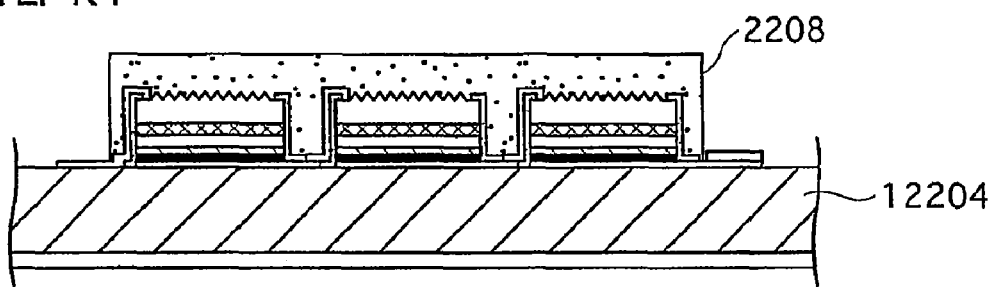
STEP L4
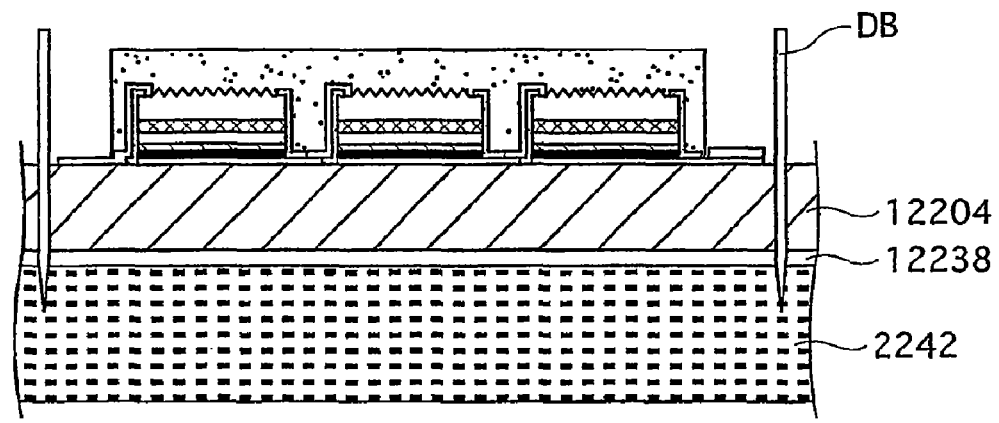

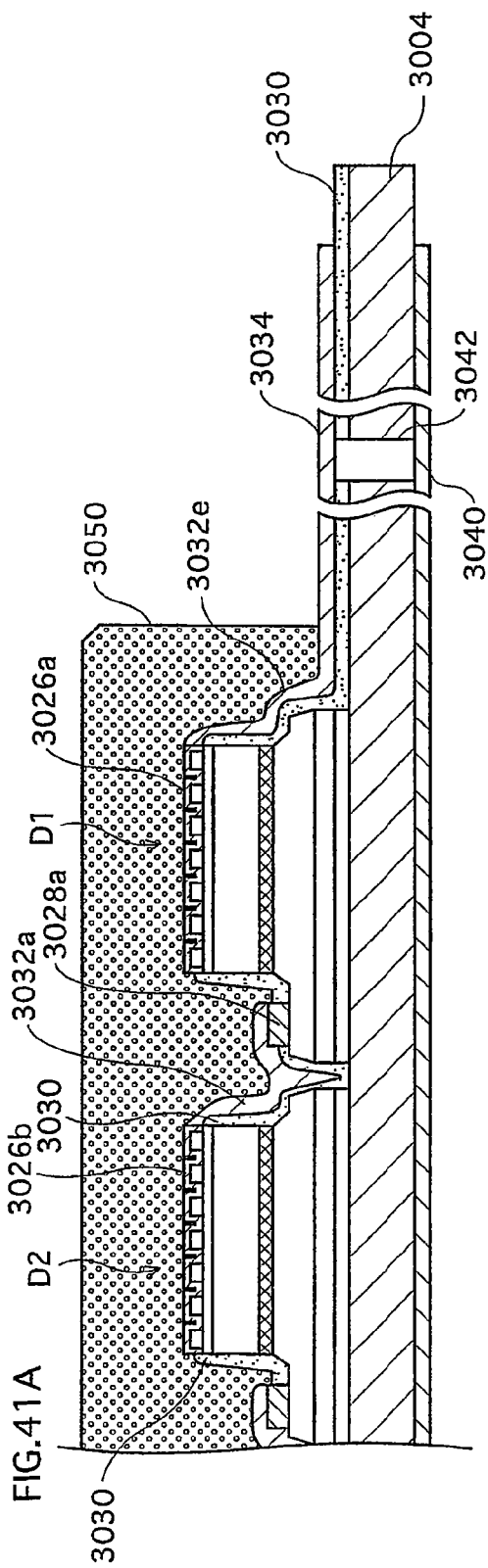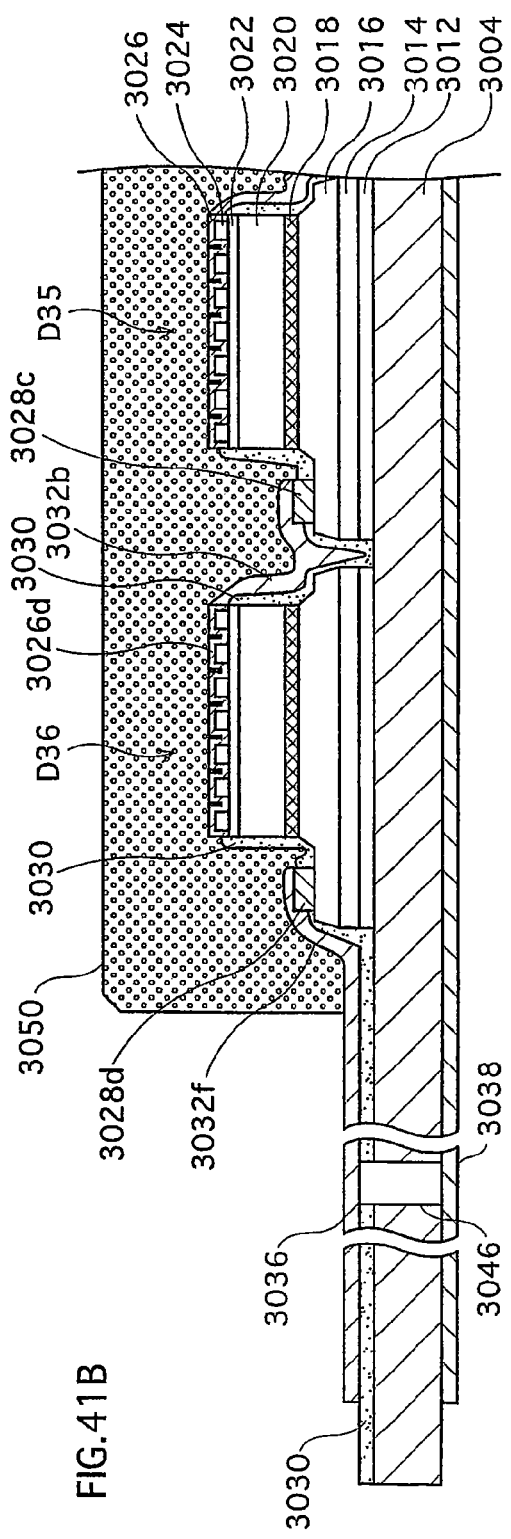

13004

3061

13004

FIG.48
STEP A5
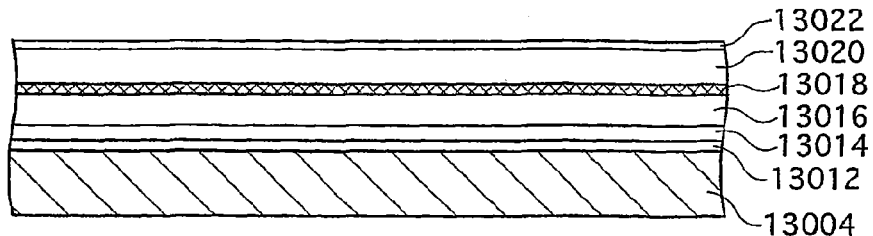
STEP B5
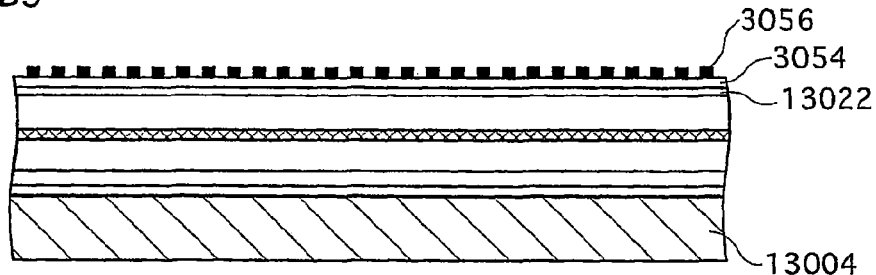
STEP C5
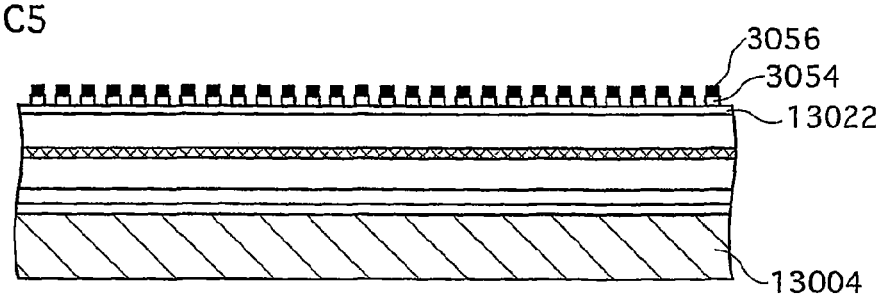
STEP D5
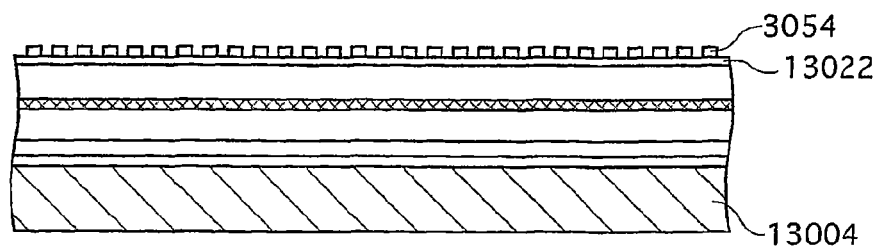

FIG.49
STEP E5
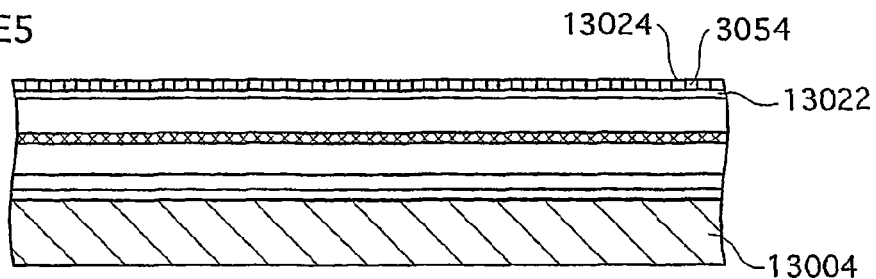
STEP F5
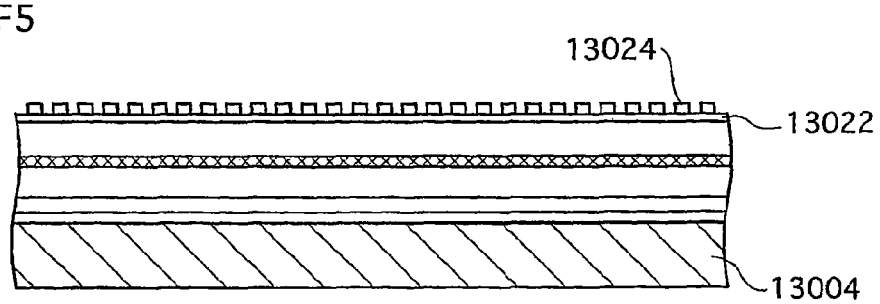
STEP G5
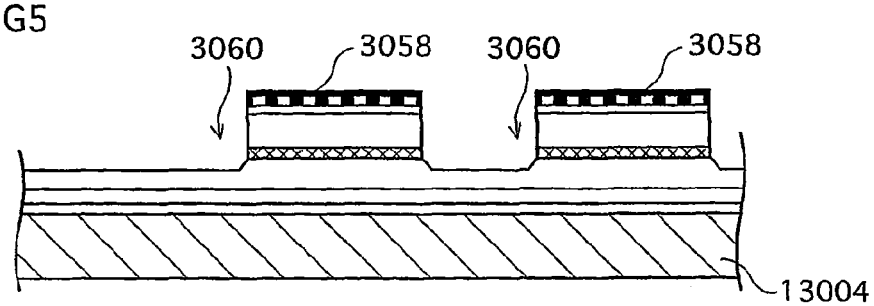
STEP H5
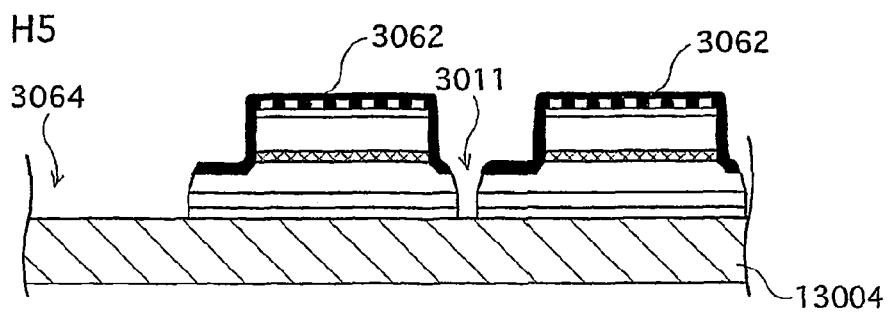

FIG.50
STEP I5
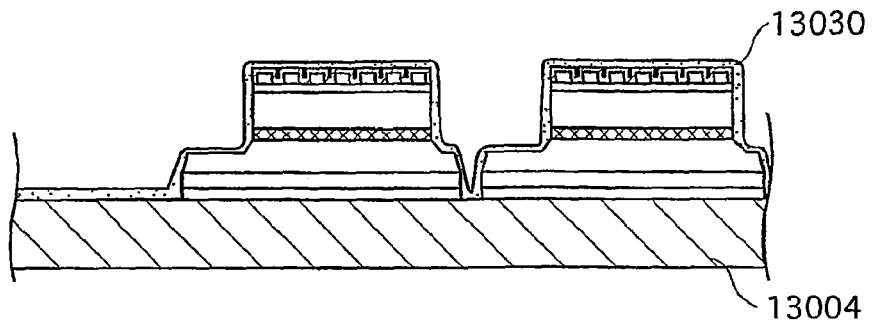
STEP J5
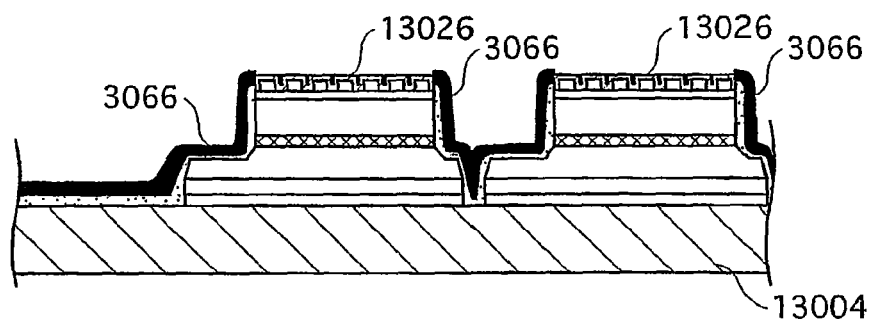
STEP K5
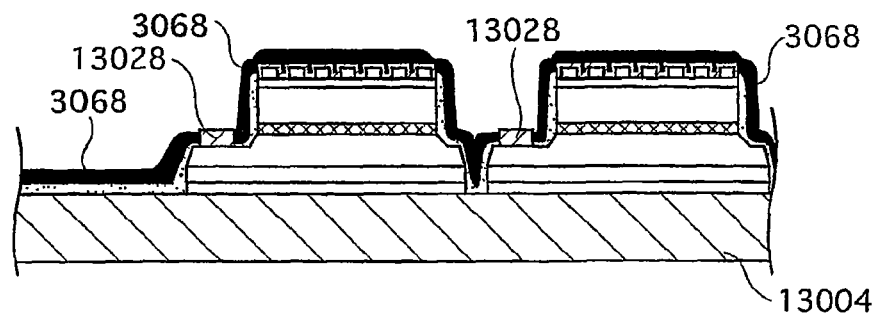
STEP L5
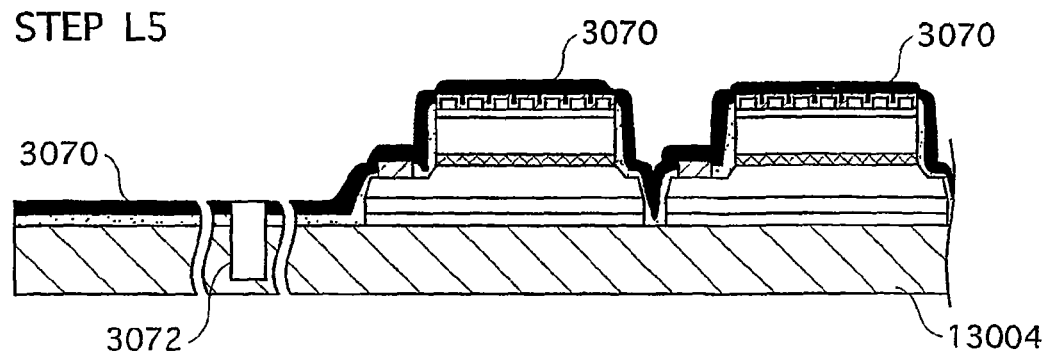

FIG. 51
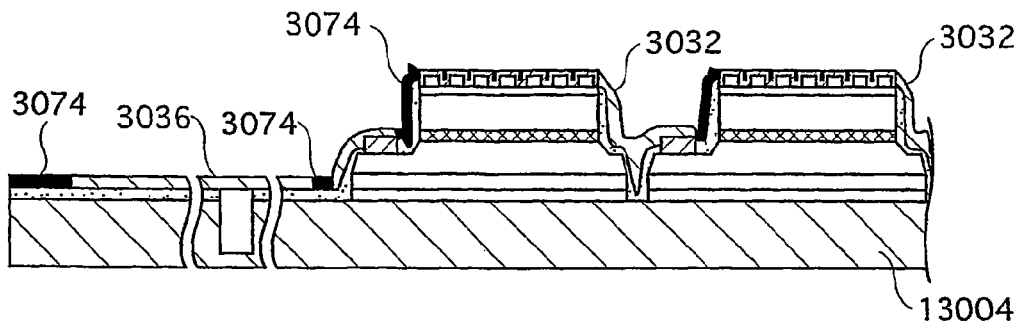
STEP M5
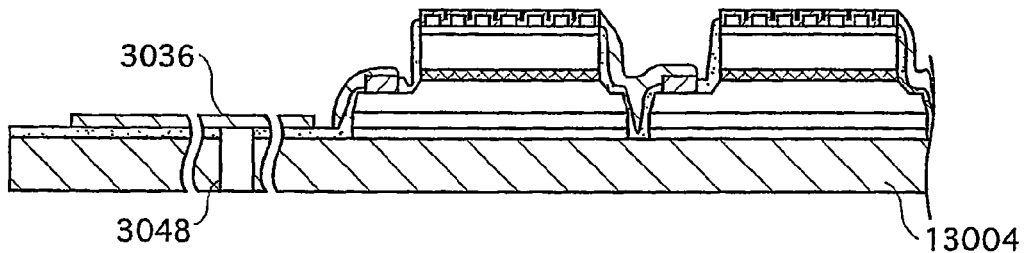
STEP N5
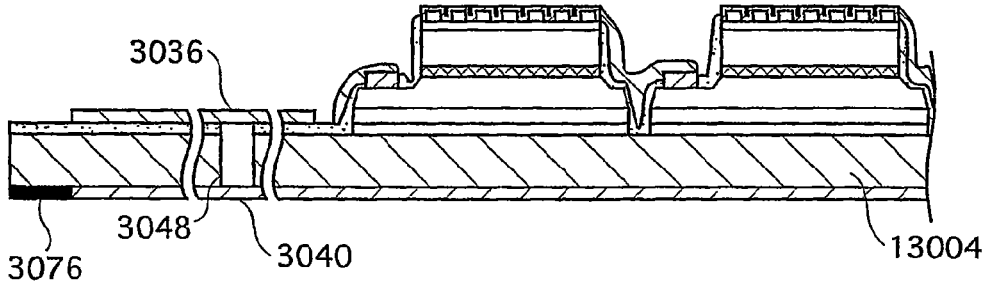
STEP O5
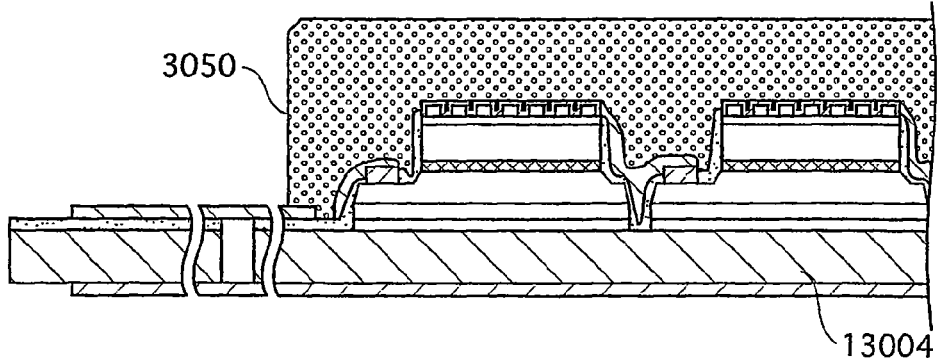
STEP P5

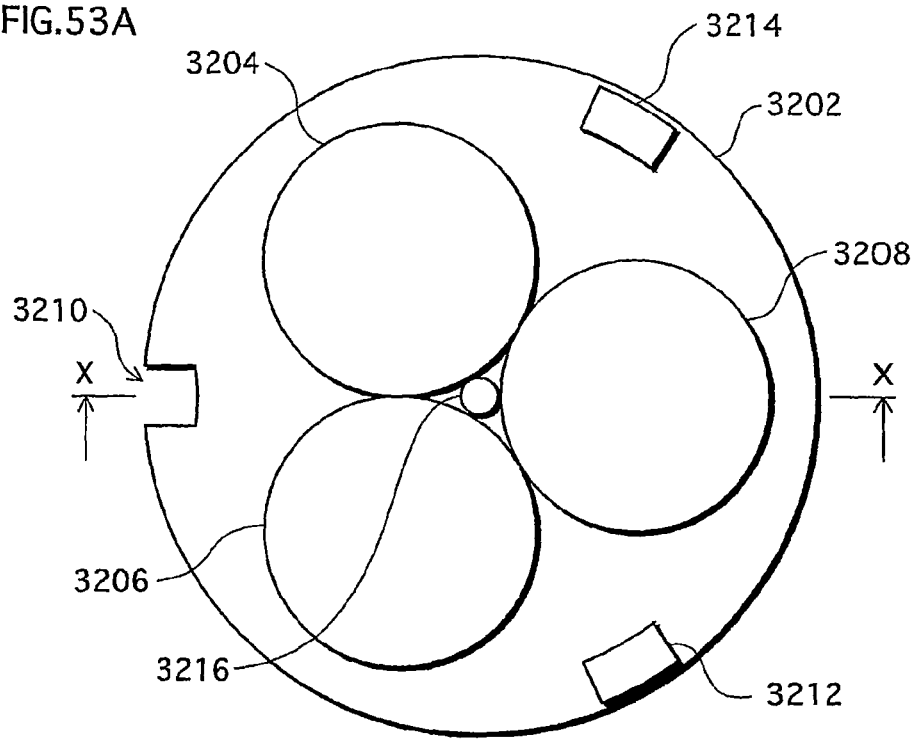
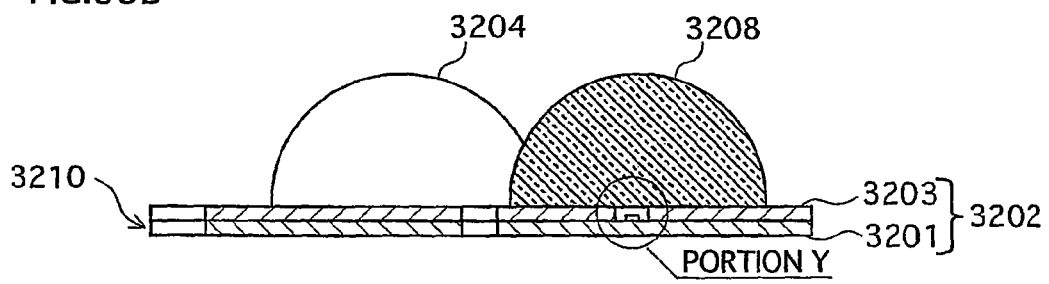
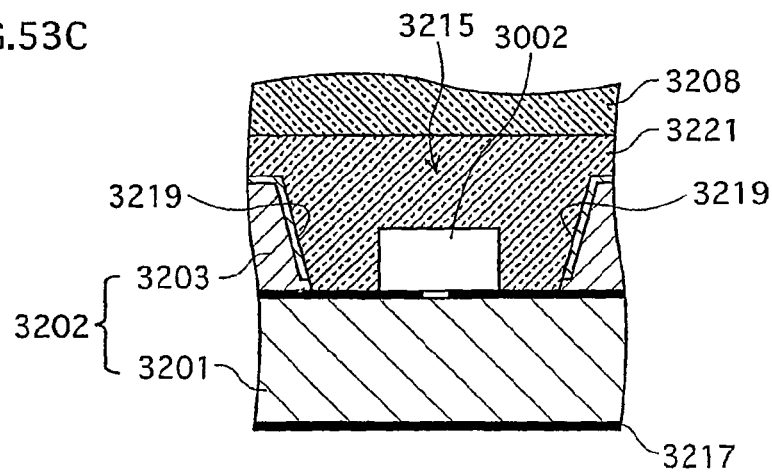

SEMICONDUCTOR LIGHT EMITTING DEVICE, LIGHT EMITTING MODULE, LIGHTING APPARATUS, DISPLAY ELEMENT AND MANUFACTURING METHOD OF SEMICONDUCTOR LIGHT EMITTING DEVICE

RELATED APPLICATIONS

The present application is a divisional application of U.S. Ser. No. 10/567,510 filed on Feb. 7, 2006, now U.S. Pat. No. 7,675,075 which claims priority from PCT/JP2004/011713 filed on Aug. 9, 2004, which claims priority from Japanese Patent Application 2003-305402 filed on Aug. 28, 2003, Japanese Patent Application 2003-340020 filed on Sep. 30, 2003, and Japanese Patent Application 2004-026851 filed on Feb. 3, 2004.

TECHNICAL FIELD

The present invention relates to a semiconductor light emitting device such as a light emitting diode chip (LED chip), and also to a light emitting module, a lighting apparatus and a display element using the semiconductor light emitting device, and a manufacturing method of the semiconductor light emitting device. The present invention particularly relates to a semiconductor light emitting device that emits light of a desired color using a phosphor.

BACKGROUND ART

LEDs have a higher efficiency and a longer lifetime than incandescent lamps and halogen lamps. In the field of LEDs, vigorous researches have recently been conducted to use white LEDs for lighting, as white LEDs with higher luminance have been developed. A common white LED at present includes a combination of an LED bare chip emitting blue light and a phosphor excited by the blue light to emit yellow light, so that the blue light and the yellow light mix together to generate white light.

A manufacturing method of this white LED includes a wafer fabrication process in which the LED bare chip is obtained and an assembly process in which the LED bare chip is packaged.

In the wafer fabrication process, the LED bare chip is typically obtained by forming a multilayer epitaxial structure including a light emitting layer on a light-transmitting substrate, such as a sapphire substrate by epitaxial growth. In addition, an anode electrode and a cathode electrode are formed on a main surface of the multilayer epitaxial structure which faces away from the sapphire substrate.

In the assembly process, the LED bare chip is mounted on a lead frame, a printed-wiring board or the like since the LED bare chip alone can not be put to use. After this, a resin mixed with a phosphor material is dropped onto the mounted LED bare chip and cured, to form a phosphor film. Subsequently, steps such as molding a periphery of the phosphor film using a resin are conducted to complete the white LED. The completed white LED is tested for its electrical and optical performance before shipped.

However, there is a high possibility that the white LED manufactured in the above-descried manner has poor optical performance. The reason is explained in the following. Firstly, the phosphor film is formed in such a manner that the resin mixed with the phosphor material is dropped onto the LED bare chip and then cured. Therefore, it is highly likely that the thickness of the phosphor film in the white LED is not equal to a designed thickness. Here, a color temperature of the white light emitted by the white LED is determined by a ratio between a quantity of the blue light and a quantity of the yellow light. This being so, if the phosphor film is thick, the quantity of the blue light is small and the quantity of the yellow light is large, so that white light of a low color temperature is produced. On the other hand, if the phosphor film is thin, white light of a high color temperature is produced. Consequently, a desired color temperature can not be realized. Secondly, the phosphor film tends to be formed at an uneven thickness. If the phosphor film is formed at an inappropriately uneven thickness, unevenness of color occurs.

White LEDs with the above-mentioned defects are rejected as a result of the optical performance test. This results in a low ratio of accepted finished products (white LEDs) to all finished products.

In an attempt to improve the ratio of accepted finished products, it has been proposed to test white LEDs for unevenness of color prior to the assembly process. This proposal has been realized by an LED chip that is disclosed in Japanese patent No. 3399440.

According to this disclosure, an LED bare chip is mounted on a substrate (an auxiliary mounting substrate) that has a slightly larger surface area than the LED bare chip, with a multilayer epitaxial structure facing downwards (i.e. a sapphire substrate of the LED bare chip faces upwards). A phosphor film is then formed on and around the LED bare chip mounted on the auxiliary mounting substrate. Thus, this LED bare chip can be tested for its optical performance prior to an assembly process in which the LED bare chip is mounted on a lead frame or a printed-wiring board. As a consequence, the ratio of accepted finished products can be improved.

However, the LED chip disclosed in the Japanese patent No. 3399440 has an extra constituent, i.e. the auxiliary mounting substrate. Accordingly, an entire thickness (height) of the LED chip increases by a thickness of the auxiliary mounting substrate, which results in an increase in chip size.

In light of the above-described problems, an object of the present invention is to provide a semiconductor light emitting device which can be tested for its optical performance before packaged without increasing a size of the semiconductor light emitting device. The object includes provision of a manufacturing method of the semiconductor light emitting device, and a light emitting module, a lighting apparatus and a display element using the semiconductor light emitting device.

DISCLOSURE OF THE INVENTION

The object can be achieved by a semiconductor light emitting device including: a base substrate; a multilayer epitaxial structure that includes a first conductive layer, a second conductive layer and a light emitting layer that is formed between the first conductive layer and the second conductive layer, where the multilayer epitaxial structure is formed on the base substrate in such a manner that the first conductive layer is positioned closer to the base substrate than the second conductive layer is; and a phosphor film that covers a main surface of the multilayer epitaxial structure which faces away from the base substrate, and every side surface of the multilayer epitaxial structure from a layer including the main surface to include at least the light emitting layer. According to this construction, the semiconductor light emitting device, which is to be mounted on a lead frame or a printed-wiring board, has the phosphor film that covers the multilayer epitaxial structure including the light emitting layer. Thus, the semiconductor light emitting device can be tested for its optical performance, such as unevenness of color, before mounted. In this way, a ratio of accepted finished products to all finished products can be improved without requiring an additional member such as an auxiliary mounting substrate as in the related art. Therefore, a size of the semiconductor light emitting device does not increase.

Here, the multilayer epitaxial structure may be epitaxially grown on the base substrate.

Here, the multilayer epitaxial structure may be first epitaxially grown on a single-crystal substrate, and then transferred to the base substrate.

Here, the multilayer epitaxial structure may be shaped as a cylinder having a substantially circular or N-sided polygonal cross-section, where N is an integer equal to or larger than five. According to this construction, a spot shape of light emitted from the semiconductor light emitting device is like a circle or N-sided polygon, where N is an integer equal to or larger than five. Which is to say, the spot shape is more like a circle than a rectangle.

The object can be achieved by a light emitting module, a lighting apparatus and a display element using the above-described semiconductor light emitting device. For the same reasons stated above, the ratio of accepted finished products (e.g. light emitting modules) can be improved.

The object can be also achieved by a manufacturing method of the semiconductor light emitting device, which achieves the above-described effects.

BRIEF DESCRIPTION OF THE DRAWINGS

FIG. 4 illustrates part of a manufacturing method of the LED array chip relating to the first embodiment.

FIG. 5 illustrates part of the manufacturing method of the LED array chip relating to the first embodiment.

FIG. 6 illustrates part of the manufacturing method of the LED array chip relating to the first embodiment.

FIG. 7 illustrates part of the manufacturing method of the LED array chip relating to the first embodiment.

FIG. 15 illustrates part of a manufacturing process of the LED chip relating to the first modification example of the second embodiment.

FIG. 16 illustrates part of the manufacturing process of the LED chip relating to the first modification example of the second embodiment.

FIG. 17 illustrates part of the manufacturing process of the LED chip relating to the first modification example of the second embodiment.

FIG. 18 illustrates part of the manufacturing process of the LED chip relating to the first modification example of the second embodiment.

FIG. 19 illustrates part of the manufacturing process of the LED chip relating to the first modification example of the second embodiment.

FIG. 20 illustrates part of the manufacturing process of the LED chip relating to the first modification example of the second embodiment.

FIG. 22 illustrates part of a manufacturing process of the LED chip relating to the second modification example of the second embodiment.

FIG. 23 illustrates part of the manufacturing process of the LED chip relating to the second modification example of the second embodiment.

FIG. 24 illustrates part of the manufacturing process of the LED chip relating to the second modification example of the second embodiment.

FIG. 25 illustrates part of the manufacturing process of the LED chip relating to the second modification example of the second embodiment.

FIG. 26 illustrates part of the manufacturing process of the LED chip relating to the second modification example of the second embodiment.

FIG. 27 illustrates part of the manufacturing process of the LED chip relating to the second modification example of the second embodiment.

FIG. 29 illustrates part of a manufacturing process of the LED array chip relating to the third modification example of the second embodiment.

FIG. 30 illustrates part of the manufacturing process of the LED array chip relating to the third modification example of the second embodiment.

FIG. 31 illustrates part of the manufacturing process of the LED array chip relating to the third modification example of the second embodiment.

FIG. 32 illustrates part of the manufacturing process of the LED array chip relating to the third modification example of the second embodiment.

FIG. 41A illustrates a cross-section of the LED array chip along a line PP shown in FIG. 40, and FIG. 41B illustrates a cross-section of the LED array chip along a line QQ shown in FIG. 40.

FIG. 48 illustrates part of the manufacturing method of the LED array chip relating to the third embodiment.

FIG. 49 illustrates part of the manufacturing method of the LED array chip relating to the third embodiment.

FIG. 50 illustrates part of the manufacturing method of the LED array chip relating to the third embodiment.

FIG. 51 illustrates part of the manufacturing method of the LED array chip relating to the third embodiment.

FIG. 53A is a plan view illustrating the LED module relating to the third embodiment, FIG. 53B illustrates a cross-section of the LED module along a line XX shown in FIG. 53A, and FIG. 53C is an enlargement view illustrating a portion Y shown in FIG. 53B.

BEST MODE FOR CARRYING OUT THE INVENTION

The following describes embodiments of the present invention with reference to the attached figures.

(First Embodiment)

Figure 1A:
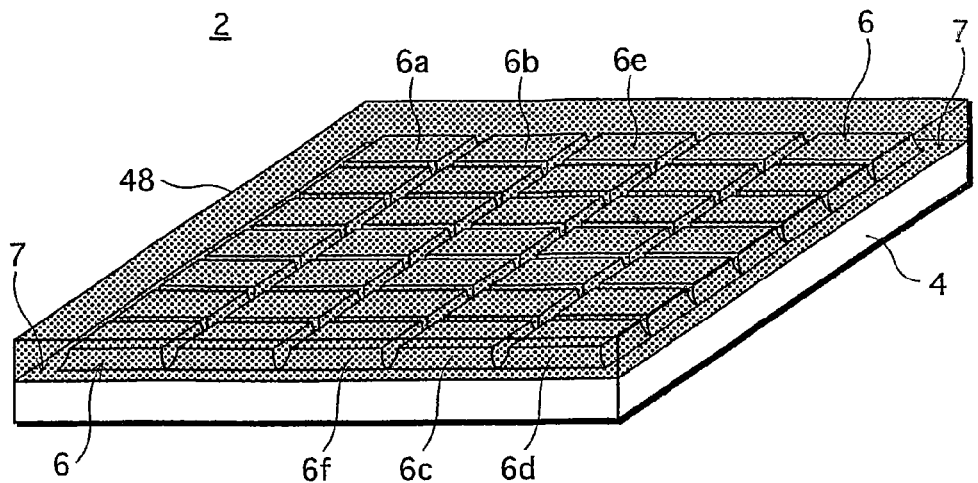
FIG. 1A is a perspective view illustrating an LED array chip relating to a first embodiment.
Figure 1B:
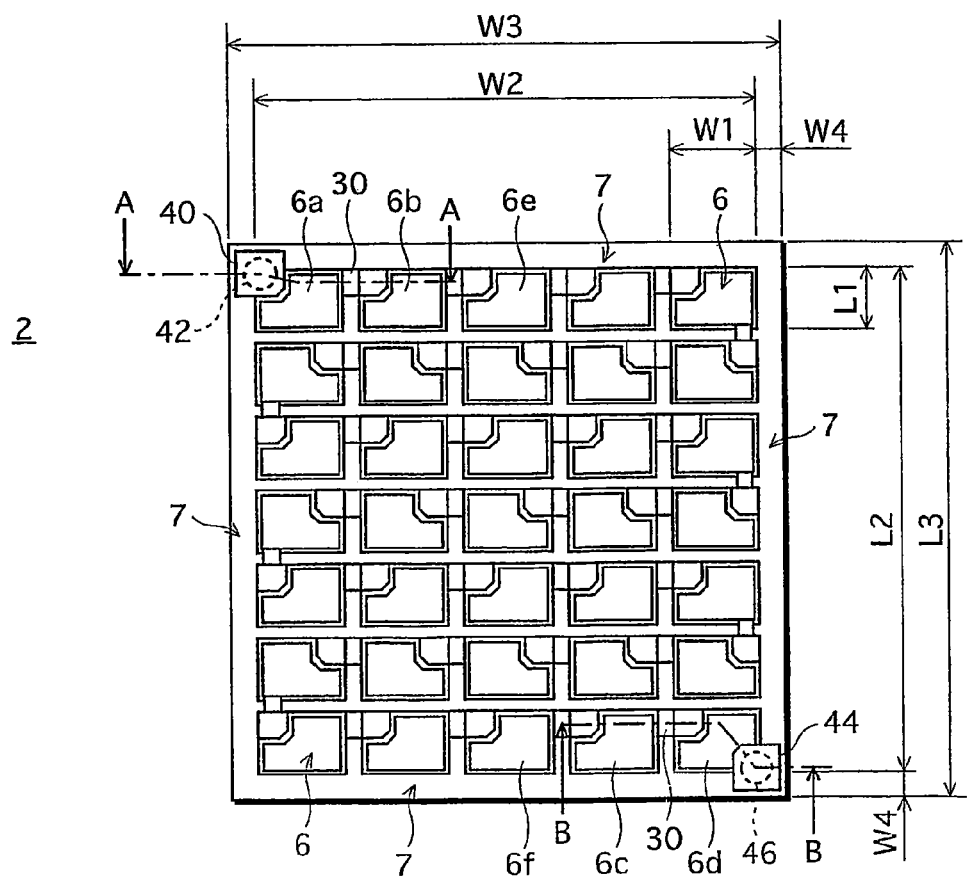
FIG. 1B is a plan view illustrating the LED array chip relating to the first embodiment.

FIG. 1A is an external perspective view illustrating a construction of an LED array chip 2, which is one type of a semiconductor light emitting device, and FIG. 1B is a plan view illustrating the LED array chip 2. FIG. 1A mainly illustrates how LEDs 6 (mentioned later) are arranged in the LED array chip 2, and therefore does not show minute depressions and protrusions on surfaces of the LEDs 6. FIG. 1B illustrates the LED array chip after removing a phosphor film 48 (mentioned later).

As shown in FIGS. 1A and 1B, the LED array chip 2 is formed in such a manner that the LEDs 6 are arranged in a matrix of N rows and M columns (in the first embodiment, a matrix of seven rows and five columns, in total, 35 LEDs 6) on a non-doped (highly resistive) SiC substrate 4 which is a semiconductor substrate (hereinafter simply referred to as "an SiC substrate 4"). The LEDs 6 are light emitting elements each of which is formed by a multilayer epitaxial structure including a light emitting layer. The 35 LEDs 6 are formed by epitaxial growth on a main surface of the SiC substrate 4 with a space having a width (W4) of 50 μm being left. The space is an area of the main surface of the SiC substrate 4 in which a multilayer epitaxial structure (the 35 LEDs 6) is not formed. In other words, the space is formed so as to surround the multilayer epitaxial structure. The space is hereinafter referred to as an exposed portion 7.

A size L1×W1 of each LED 6 is 285 μm×400 μm. A size L2×W2 of an area in which the LEDs 6 are formed is 2 mm×2 mm. A size L3×W3 of the LED array chip 2 is 2.1 mm×2.1 mm.

The following part describes, in more detail, the construction of the LED array chip 2 with reference to cross-sectional views.

Figure 2A:
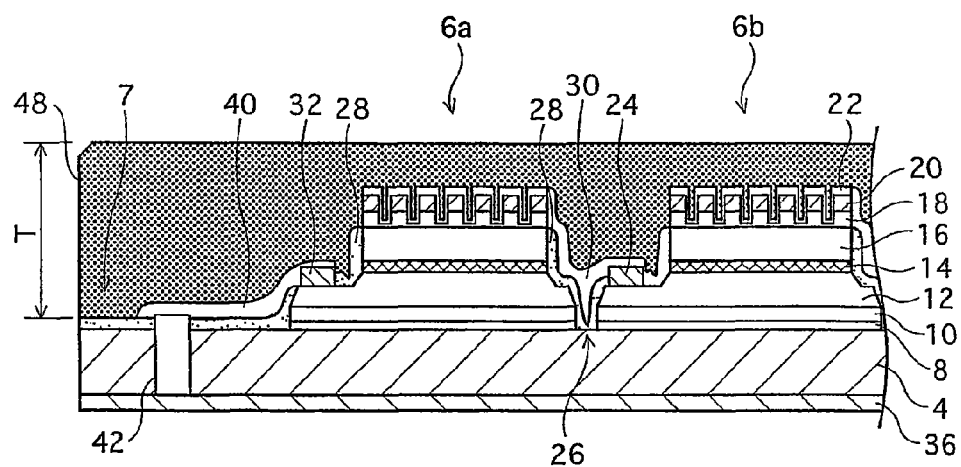
FIG. 2 is a cross-sectional view illustrating a part of the LED array chip relating to the first embodiment.
Figure 2B:
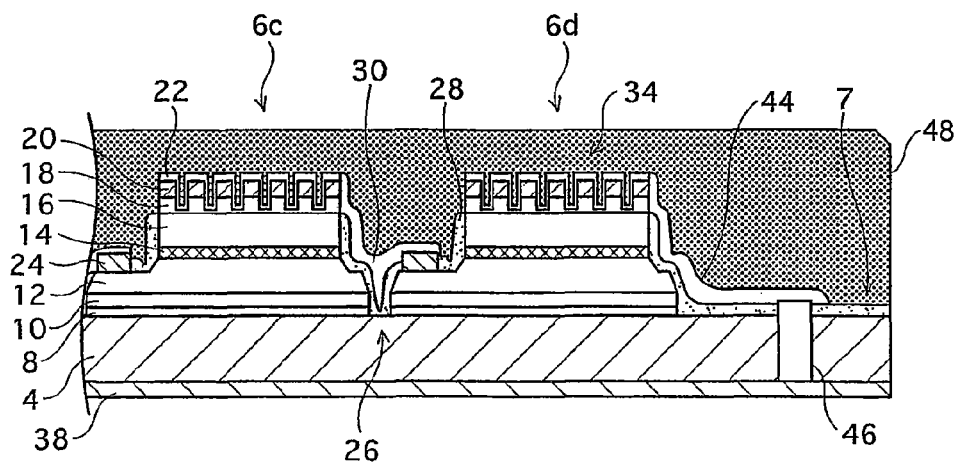

FIG. 2A illustrates a cross-section of the LED array chip 2 along a line AA shown in FIG. 1B, and FIG. 2B illustrates a cross-section of the LED array chip 2 along a line BB shown in FIG. 1B. Specifically speaking, FIG. 2A illustrates a cross-section of an LED 6a of the first row and the first column and an LED 6b of the first row and the second column, and FIG. 2B illustrates a cross-section of an LED 6c of the seventh row and the fourth column and an LED 6d of the seventh row and the fifth column.

Each LED 6 is formed by a multilayer epitaxial structure made up of an n-AlGaN buffer layer 8 (having a thickness of 30 nm), a distributed bragg reflector (DBR) layer 10 composed of 30 periods of n-AlGaN/GaN (having a total thickness of 3 μm), an n-GaN clad layer 12 (having an Si-doping amount of $3 \times 10^{18}$ cm$^{-3}$ and a thickness of 200 nm), an InGaN/GaN multiple quantum well (MQW) light emitting layer 14 composed of six periods of InGaN (having a thickness of 2 nm)/GaN (having a thickness of 8 nm), a p-GaN clad layer 16 (having an Mg-doping amount of $1 \times 10^{19}$ cm$^{-3}$ and a thickness of 200 nm), and a p-GaN contact layer 18 (having an Mg-doping amount of $3\times10^{19}$ cm$^{-3}$ and a thickness of 200 nm). These layers 8, 10, 12, 14, 16 and 18 are formed on the SiC substrate 4 in the stated order. Which is to say, the LED 6 basically has a construction in which a light emitting layer (the MQW light emitting layer 14) is sandwiched between a conductive layer (the n-GaN clad layer 12 on a side of the SiC substrate 4) and a conductive layer (the p-GaN contact layer 18 and the p-GaN clad layer 16 on a side of a light extraction surface).

An Ni/Au thin film 20 and an ITO transparent electrode 22 are formed on the p-GaN contact layer 18 in this order. A Ti/Au electrode 24, which is an n-electrode, is formed on the n-GaN clad layer 12.

When power is supplied to this LED 6 through the ITO transparent electrode 22 and the Ti/Au electrode 24, the light emitting layer 14 emits blue light having a wavelength of 460 nm. The Ni/Au thin film 20 and the ITO transparent electrode 22 are used as a p-electrode in the first embodiment to improve transmission of the light emitted from the light emitting layer 14.

Figure 3A:
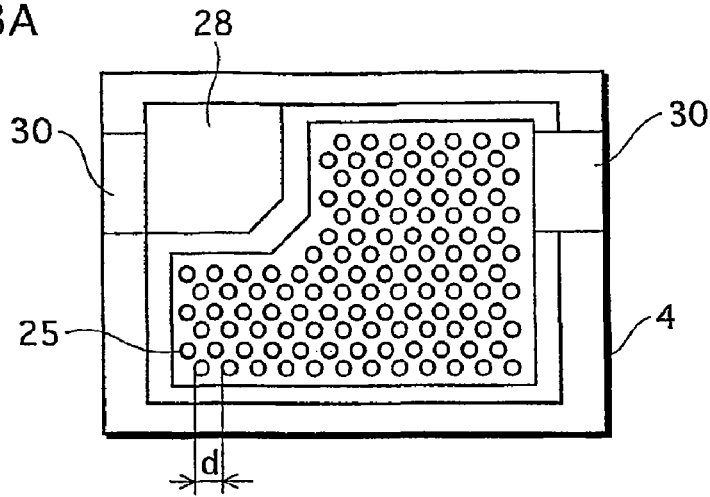
FIG. 3A is a plan view illustrating an LED in the LED array chip relating to the first embodiment.

A main surface of the p-electrode of the LED 6 from which light is extracted is made regularly uneven in order to improve light extraction efficiency. To be more specific, as shown in FIG. 3A, which is a plan view illustrating the LED 6, circular depressions 25 are formed at a predetermined interval (d) of 1 µm in the first embodiment. Here, a planar shape of each depression 25 is not limited to a circle as described above, but may be a quadrangle or a hexagon. Furthermore, the uneven surface may be achieved by creating linear grooves at a predetermined interval, or simply by irregularly damaging the surface of the p-electrode.

The 35 LEDs 6 described above are connected in series on the SiC substrate 4.

FIGS. 2A and 2B are used to explain how the LEDs 6 are connected in the LED array chip 2.

As shown in FIG. 2A, the adjacent LEDs 6a and 6b are divided from each other by a division groove 26 that is deep enough to reach the SiC substrate 4. The same holds true for all pairs of adjacent LEDs 6 including the LEDs 6c and 6d shown in FIG. 2B.

Figure 3B:
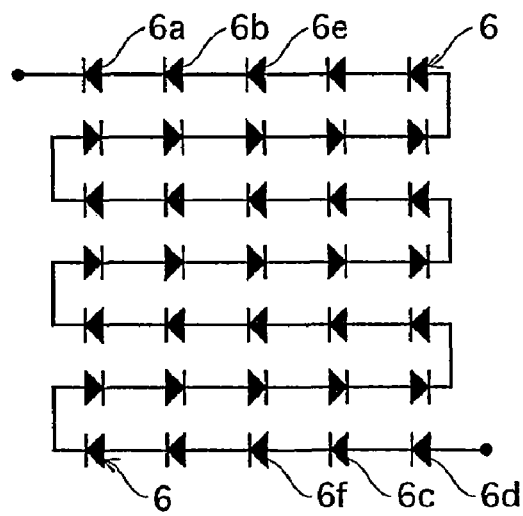
FIG. 3B illustrates how LEDs are connected in the LED array chip relating to the first embodiment.

An insulating film (Si$_3$N$_4$ film) 28 is formed so as to cover side surfaces of each of the LEDs 6a, 6b, 6c and 6d and the division grooves 26. A bridging wire 30 is formed on the insulating film 28 to connect a p-electrode of the LED 6a (an Ni/Au thin film 20 and an ITO transparent electrode 22) to an n-electrode of the LED 6b (a Ti/Au electrode 24). Similarly, another bridging wire 30 formed on the insulating film 28 connects a p-electrode of the LED 6c and an n-electrode of the LED 6d as shown in FIG. 2B. In the same manner, bridging wires 30 connect LEDs 6 from an LED 6e of the first row and the third column to an LED 6f of the seventh row and the third column. As a result, all of the LEDs 6 are connected in series as shown in FIG. 3B. Among the 35 LEDs 6 connected in series in the LED array chip 2, the LED 6a is an LED on a lower potential end of the LED array chip 2. Therefore, a Ti/Au electrode 24 of the LED 6a is a cathode electrode 32 of the LED array chip 2. The LED 6d is an LED on a higher potential end. Therefore, an Ni/Au thin film 20 and an ITO transparent electrode 22 of the LED 6d are an anode electrode 34 of the LED array chip 2.

Figure 3C:
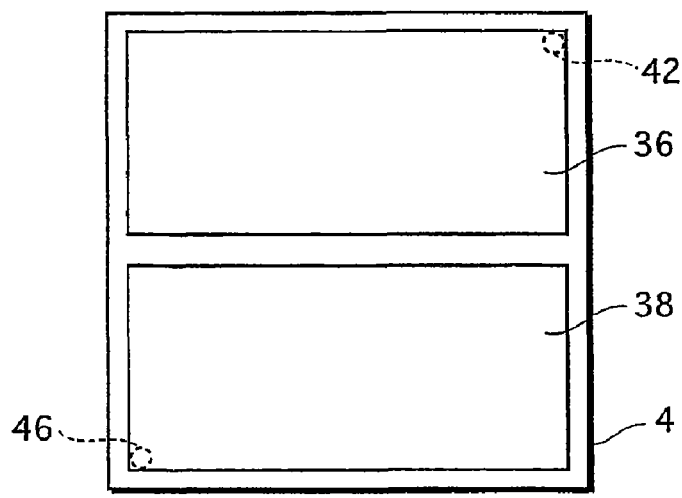
FIG. 3C is a bottom plan view illustrating the LED array chip relating to the first embodiment.

FIG. 3C illustrates a back surface of the LED array chip 2. As shown in FIG. 3C, two power supply terminals 36 and 38 are formed on the back surface, which is opposite to a front surface of the SiC substrate 4 on which the LEDs 6 are formed. The power supply terminals 36 and 38 are each formed by a Ti/Pt/Au film.

As shown in FIGS. 2A and 2B, the cathode electrode 32 is connected to the power supply terminal 36 by a bridging wire 40 and a through hole 42 provided in the SiC substrate 4, and the anode electrode 34 is connected to the power supply terminal 38 by a bridging wire 44 and a through hole 46 provided in the SiC substrate 4. The through holes 42 and 46 are each formed by filling an opening with a diameter of 30 µm provided in the SiC substrate 4 with Pt. When an electric current of 50 mA is supplied to the 35 LEDs 6 connected in series through the power supply terminals 36 and 38 with heat dissipation being ensured, an operation voltage of 120V is observed.

The phosphor film 48 is formed on the front surface of the SiC substrate 4 so as to cover the LEDs 6 and the entire exposed portion 7 the SiC substrate 4. The phosphor film 48 is made of a light-transmitting resin, for example, silicone in which particles of a yellow phosphor (Sr, Ba)$_2$SiO$_4$:Eu$^{2+}$ and fine particles of SiO$_2$ are dispersed. The phosphor film 48 has a thickness T (shown in FIG. 2A) of 50 µm. The light-transmitting resin may be an epoxy resin or a polyimide resin, instead of silicone.

The phosphor in the phosphor film 48 converts part of the blue light emitted from the light emitting layer 14 of each LED 6 into yellow light. Here, the blue light from each LED 6 and the yellow light from the phosphor mix together, to generate white light. Since the DBR layer 10, which is a light reflective layer, is formed between the light emitting layer 14 and the SiC substrate 4, 99% or more of blue light emitted from the light emitting layer 14 towards the SiC substrate 4 is reflected towards the light extraction surface. This improves light extraction efficiency of each LED 6. It should be noted that blue light indicates light having a wavelength from 400 nm inclusive to 500 nm exclusive, and yellow light indicates light having a wavelength from 550 nm inclusive to 600 nm exclusive, in this description. Taking this into consideration, the LEDs 6 may be configured to emit light having a peak emission wavelength that falls within the above-mentioned range, instead of a peak emission wavelength of 460 nm as described above.

The following part describes a manufacturing method of the LED array chip 2 described above, with reference to FIGS. 4, 5 and 6.

In FIGS. 4, 5 and 6, a material to form each constituent of the LED array chip 2 is identified by a three-digit number whose first digit is one. The last two digits of the three-digit number represents a reference numeral identifying the corresponding constituent of the LED array chip 2.

Firstly, as shown in FIG. 4, an n-AlGaN buffer layer 108, a DBR layer 110 composed of 30 periods of n-AlGaN/GaN, an n-GaN clad layer 112, an InGaN/GaN MQW light emitting layer 114, a p-GaN clad layer 116 and a p-GaN contact layer 118 are formed on a non-doped SiC substrate 104 in the stated order using a metal organic chemical vapor deposition (MOCVD) method (step A1). Here, the non-doped SiC substrate 104 has a diameter of two inches and a thickness of 300 µm.

After this, a mask 50 is formed, so as to mask an area, on the lamination made up of the layers 118, 116, 114, 112, 110 and 108, that is slightly larger than an area in which the Ni/Au thin film 20 (and the ITO transparent electrode 22) of each LED 6 is to be formed. An unmasked area of the lamination is removed by etching to a depth of approximately half of the thickness of the n-GaN clad layer 112 is removed (step B1). Thus, a surface to connect the Ti/Au electrode 24 (an n-electrode formation surface) 52 is formed. The mask 50 is removed prior to the next step.

After this, a mask 54 is formed so as to cover the resulting surface after the step B1 except for areas in which the exposed portion 7 and the division groove 26 are to be formed. Unmasked areas of a lamination made up of the remaining layer 112 and the layers 110 and 108 are removed by etching to such a depth that the SiC substrate 104 is exposed, to create the exposed portion 7 and the division groove 26 (step C1). Which is to say, the exposed portion 7 is created by removing a corresponding part of the multilayer epitaxial structure composed of the layers 108 to 118 (the corresponding part of the multilayer epitaxial structure which has been removed is hereinafter referred to as a removed multilayer portion.). After the etching is performed, the mask 54 is removed prior to the next step.

An $Si_3N_4$ film 128, which is an insulating film, is formed by sputtering or the like for insulation and surface protection (step D1).

A mask 56 is then formed so as to mask the $Si_3N_4$ film 128 except for an area in which the Ni/Au thin film 20 (and the ITO transparent electrode 22) of each LED 6 is to be formed. An unmasked area of the $Si_3N_4$ film 128 is removed by etching, and an Ni/Au thin film 120 is then formed by deposition. Thus, the Ni/Au thin film 20 is formed (step E1). A portion of the Ni/Au thin film 120 which is formed on the mask 56 (no shown in FIG. 5) is removed together with the mask 56 prior to the next step.

The same procedure as in the step E1 is conducted to form the Ti/Au electrode 24. Specifically speaking, a mask 58 is formed so as to mask the resulting surface after the step E1, except for an area on the $Si_3N_4$ film 128 in which the Ti/Au electrode 24 for each LED 6 is to be formed. After an unmasked area of the $Si_3N_4$ film 68 is removed by etching, a Ti/Au film 124, which is a thin metal film, is applied by deposition. Thus, the Ti/Au electrode 24 is formed (step F1). A portion of the Ti/Au film 124 which is formed on the mask 58 (not shown in FIG. 5) is removed together with the mask 58 prior to the next step.

After this, a mask 60 is formed so as to cover the resulting surface after the step F1 except for an area in which the through holes 42 and 46 are to be formed. An unmasked area of the resulting surface is removed by etching, to form an opening 61 having a depth of 200 μm. Then, the opening 61 is filled with Pt by electroless deposition or the like (step G1). The mask 60 is removed prior to the next step.

Subsequently, a mask 62 is formed to mask the resulting surface after the step G1 except for areas in which the depressions 25 are to be formed. Unmasked areas of the resulting surface are removed by etching to such a depth that the p-GaN contact layer 118 is exposed, to form the depressions 25 (step H1). The mask 62 is removed prior to the next step.

After this, a mask 64 is formed so as to mask the resulting surface after the step H1 except for an area in which the ITO transparent electrode 22 of each LED 6 is to be formed. Then, an ITO film 122 is applied by sputtering, to form the ITO transparent electrode 22 for each LED 6 (step I1). A portion of the ITO film 122 which is formed on the mask 64 (not shown in FIG. 6) is removed together with the mask 64 prior to the next step.

In the next step, the bridging wires 30, 40 and 44 are formed in the following manner. A mask 66 is formed so as to mask the resulting surface after the step I1, except for areas in which the bridging wires 30, 40 and 44 are to be formed. Then, a Ti/Pt/Au film, which is a thin metal film, is applied by deposition, to form the bridging wires 30, 40 and 44 (step J1). A portion of the Ti/Pt/Au film which is formed on the mask 66 (not shown in FIG. 7) is removed together with the mask 66 prior to the next step.

After this, a back surface of the SiC substrate 104 is polished so that the thickness of the SiC substrate 104 becomes 150 μm. Thus, the through holes 42 and 46 are exposed on the back surface of the SiC substrate 104 (step K1).

Subsequently, a mask (not shown in FIG. 7) is formed so as to mask the back surface of the SiC substrate 104 except for areas in which the power supply terminals 36 and 38 are to be formed. After this, a Ti/Pt/Au film, which is a thin metal film, is applied by deposition. Thus, the Ti/Pt/Au power supply terminals 36 and 38 are formed (step L1). A portion of the Ti/Pt/Au film which is formed on the mask (not shown in FIG. 7) is removed together with the mask prior to the next step.

After this, silicone in which particles of a yellow phosphor $(Sr, Ba)_2SiO_4:Eu^{2+}$ and fine particles of $SiO_2$ are dispersed is applied by printing so as to cover the exposed portion 7 and the LEDs 6. The silicone is heated to be cured, to form the phosphor film 48. Subsequently, the phosphor film 48 is polished so that the thickness of the phosphor film 48 becomes 50 μm (step M1). Here, it should be noted that color of white light emitted from the LED array chip 2 is determined by a ratio between blue light emitted from the LEDs 6 and yellow light generated by converting the blue light. This ratio can be adjusted by changing the percentage of the phosphor particles included in the silicone resin and the thickness of the phosphor film 48. Specifically speaking, when the percentage of the phosphor particles is higher, or the thickness of the phosphor film 48 is larger, the ratio of the yellow light becomes higher. Here, a high ratio of the yellow light means that the white light has a low color temperature. According to the first embodiment, the silicone resin including the phosphor particles is first applied at a thickness larger than a designed thickness of the phosphor film 48. The applied resin is then polished after heated to be cured, to achieve the designed thickness. In this way, the phosphor film 48 can be formed at an even thickness. This reduces unevenness of color with it being possible to produce white light having a predetermined color temperature reliably.

Lastly, the SiC substrate 104 is divided into individual LED array chips 2 by dicing, to obtain the LED array chip 2 (shown in FIGS. 1A and 1B).

Here, the phosphor film 48 may be formed by applying a resin including a phosphor after a mesa etching step but before a dicing step in a conventional wafer fabrication process. However, a groove created by conventional mesa etching has such a width that only one or two phosphor particles can be arranged in a widthwise direction. In this case, blue light emitted from side surfaces of the light emitting layer 14 of each LED 6, to a large extent, goes through the phosphor layer 48 without exciting the phosphor. As a result, the blue light emitted from the side surfaces becomes noticeable, which causes unevenness of color. According to the first embodiment, however, the resin including the phosphor is applied on side surfaces of the multilayer epitaxial structure (the side surfaces of the light emitting layer 14) at a thickness having an equal length to the width (W4) of the exposed portion 7. Here, the width (W4) of the exposed portion 7 is sufficiently larger than a diameter of the phosphor particle. As a consequence, the blue light emitted from the side surfaces of the light emitting layer 14 can appropriately excites the phosphor to be converted into yellow light. This reduces unevenness of color.

It is generally accepted that unevenness of color occurs only in a white LED that uses visible light having a spectral component of a wavelength within a range of 380 nm and 780 nm (purple to red) for an excitation light source. In other words, unevenness of color does not occur in a white LED having near-ultraviolet light as an excitation light source.

However, ultraviolet light with a peak emission wavelength of 370 nm also has a spectral component of a wavelength no less than 380 nm (visible light). Therefore, a white LED using near-ultraviolet light as an excitation light source can have a problem of unevenness of color, depending on a ratio of spectral components of a wavelength no less than 380 nm. Accordingly, the first embodiment is applicable to an LED having a light emitting layer that emits near-ultraviolet light to achieve the same effects of reducing unevenness of color for the same reasons stated above. Which is to say, the first embodiment of the present invention is applicable to an LED including a light emitting layer that emits light including a spectral component of a wavelength, at least, within a range of 380 nm and 780 nm to reduce unevenness of color. The application of the first embodiment is not limited to an LED including a light emitting layer that emits blue light having a peak emission wavelength of 460 nm as described above.

Figure 8:
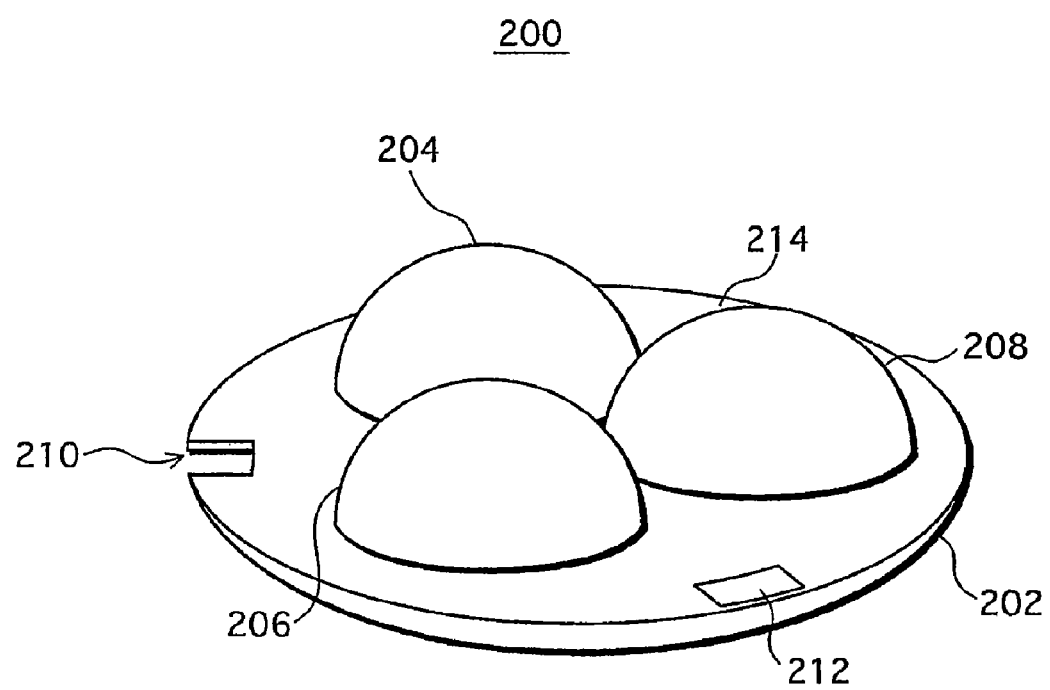
FIG. 8 is a perspective view illustrating an LED module relating to the first embodiment.

FIG. 8 is an external perspective view illustrating a white LED module 200 including LED array chips 2 described above (hereinafter simply referred to as "an LED module 200"). The LED module 200 is attached to a lighting unit 240 (mentioned later).

The LED module 200 includes a ceramics substrate 202 that is in a shape of a circle having a diameter of 5 cm and is made of aluminum nitride (AlN) and three lenses 204, 206 and 208 made of glass. A guiding depression 210 used to attach the LED module 200 to the lighting unit 240 and terminals 212 and 214 to receive a power supply from the lighting unit 240 are provided in the ceramics substrate 202.

Figure 9A:
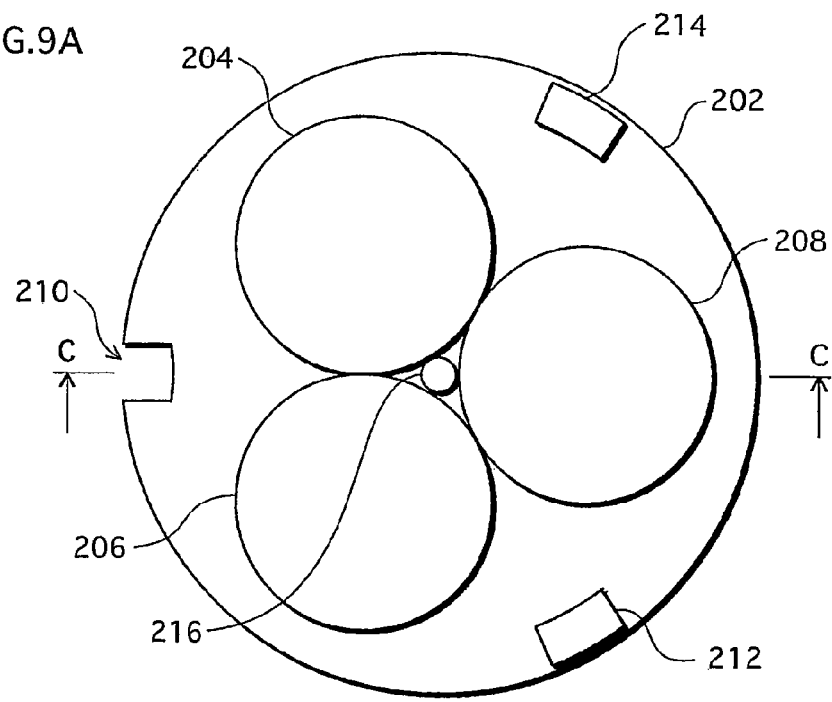
FIG. 9A is a plan view illustrating the LED module relating to the first embodiment.
Figure 9B:
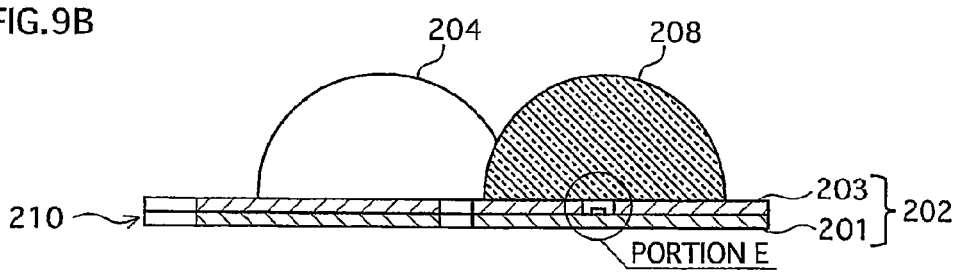
FIG. 9B illustrates a cross-section of the LED module along a line CC shown in FIG. 9A.
Figure 9C:
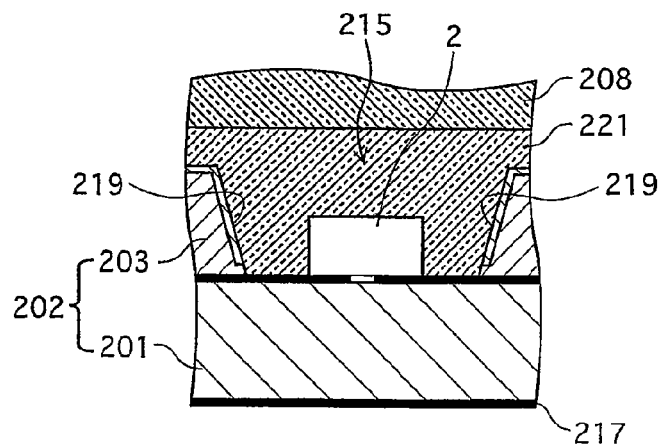
FIG. 9C is an enlargement view illustrating a portion E shown in FIG. 9B.

FIG. 9A is a plan view illustrating the LED module 200, FIG. 9B illustrates a cross-section of the LED module 200 along a line CC shown in FIG. 9A, and FIG. 9C is an enlargement view illustrating a portion E shown in FIG. 9B.

As shown in FIGS. 9A and 9B, a guiding hole (a through hole) 216 is provided in the center of the ceramics substrate 202 to attach the LED module 200 to the lighting unit 240. As shown in FIG. 9C, a gold plating 217 is applied to a lower surface of the ceramics substrate 202 for improving heat dissipation.

The LED array chip 2 is mounted at a location, on an upper surface of the ceramics substrate 202, corresponding to a center of each of the lenses 204, 206 and 208 having a shape of a circle as shown in FIG. 9A. In total, three LED array chips 2 are mounted on the ceramics substrate 202.

The ceramics substrate 202 is made up of two ceramics substrates 201 and 203 each of which has a thickness of 0.5 mm and is mainly made of AlN. The ceramics substrates 201 and 203 may be made of $Al_2O_3$, BN, MgO, ZnO, SiC and diamond, instead of AlN.

The LED array chips 2 are mounted on an upper surface of the lower ceramics substrate 201. Taper through holes 215 are provided in the upper ceramics substrate 203, so as to create spaces for mounting the LED array chips 2.

A cathode pad 218 and an anode pad 220 (shown in FIG. 10B) are provided at the location, on the upper surface of the ceramics substrate 201, where each LED array chip 2 is to be mounted. Each of the cathode pad 218 and the anode pad 220 is made up of nickel (Ni) plating and then gold (Au) plating applied on copper (Cu). The LED array chip 2 is mounted on the ceramics substrate 201 in such a manner that the SiC substrate 4 is adhered to the ceramics substrate 201. Here, the power supply terminals 36 and 38 are respectively connected to the cathode pad 218 and the anode pad 220 using solder. Instead of solder, a gold bump or a silver paste may be used.

Before being mounted on the ceramics substrate 201, the LED array chips 2 have been tested for their optical performance, such as unevenness of color, and have passed the test.

The LED array chips 2 can be tested for their optical performance before being mounted because the LED array chip 2 relating to the first embodiment includes the phosphor film 48, and can emit white light by itself. Thus, it can be prevented that the LED module 300 including the LED array chips 2 is rejected due to poor optical performance of the LED array chips 2. Consequently, a ratio of accepted finished products (LED modules 300) to all finished products is improved.

An aluminum reflection film 219 is formed on a wall of each through hole 215 provided in the upper ceramics substrate 203 and on an upper surface of the ceramics substrate 203.

The lenses 204, 206 and 208 are adhered to the ceramics substrate 203 using an adhesive agent 221. The adhesive agent 221 may be a silicone resin, an epoxy resin or the like.

The three LED array chips 2 are connected in parallel by a wiring pattern formed on the upper surface of the ceramics substrate 201.

Figure 10A:
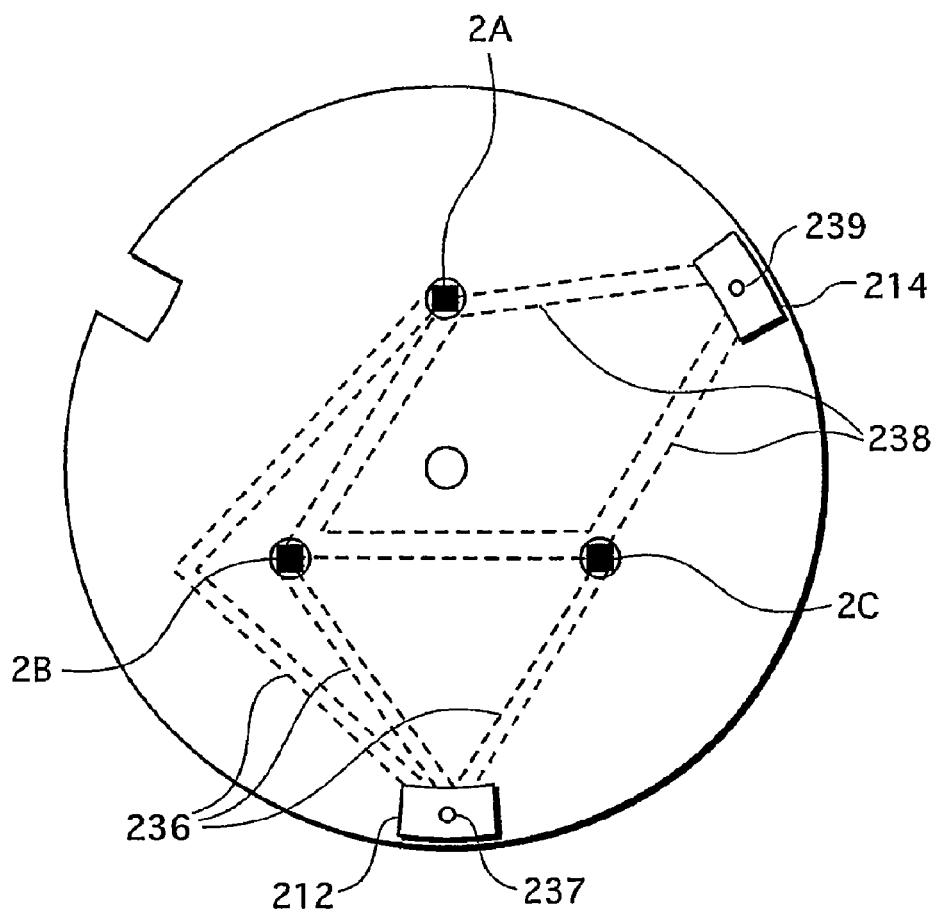
FIG. 10A illustrates the LED module relating to the first embodiment after removing a lens.
Figure 10B:
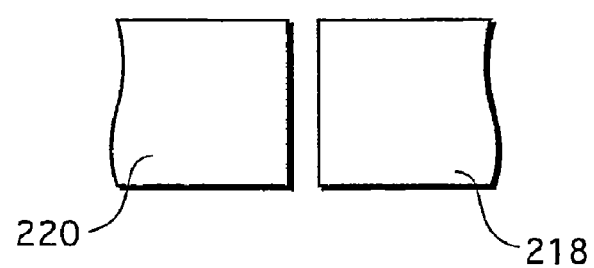
FIG. 10B illustrates a pad pattern formed on a ceramics substrate constituting the LED module relating to the first embodiment.

FIG. 10A is a plan view illustrating the LED module 200 after removing the lenses 204, 206 and 208. In FIG. 10A, the three LED array chips 2 are distinguished from each other by addition of marks of A, B and C.

As described above, the anode pad 220 and the cathode pad 218 (FIG. 10B) are provided at the location, on the upper surface of the ceramics substrate 201, where each of the LED array chips 2A, 2B and 2C is mounted.

The anode pads 220 that are respectively connected to the LED array chips 2A, 2B and 2C are electrically connected to each other by a wiring pattern 236. The wiring pattern 236 is connected to the positive terminal 212 at its end by a through hole 237. The cathode pads 218 that are respectively connected to the LED array chips 2A, 2B and 2C are electrically connected to each other by a wiring pattern 238. The wiring pattern 238 is connected to the negative terminal 214 at its end by a through hole 239. In other words, the LED array chips 2A, 2B and 2C are connected in parallel by the wiring patterns 236 and 238.

The LED module 200 described above is attached to the lighting unit 240. The LED module 200 and the lighting unit 240 constitute a lighting apparatus 242.

Figure 11A:
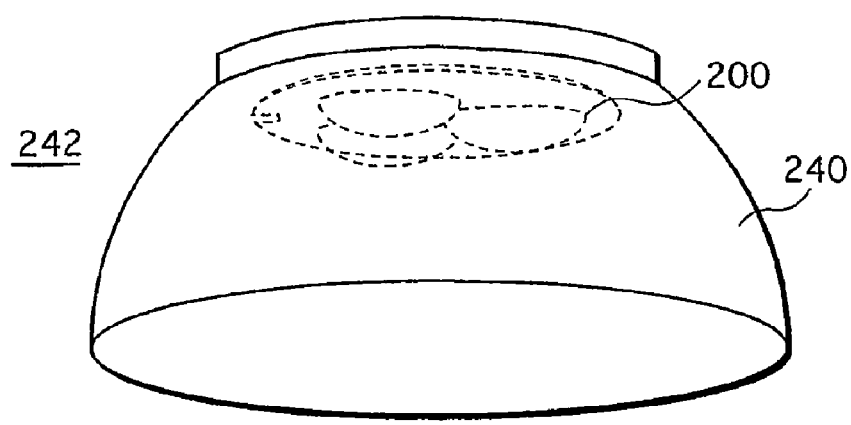
FIG. 11A is a perspective view illustrating a lighting apparatus relating to the first embodiment.
Figure 11B:
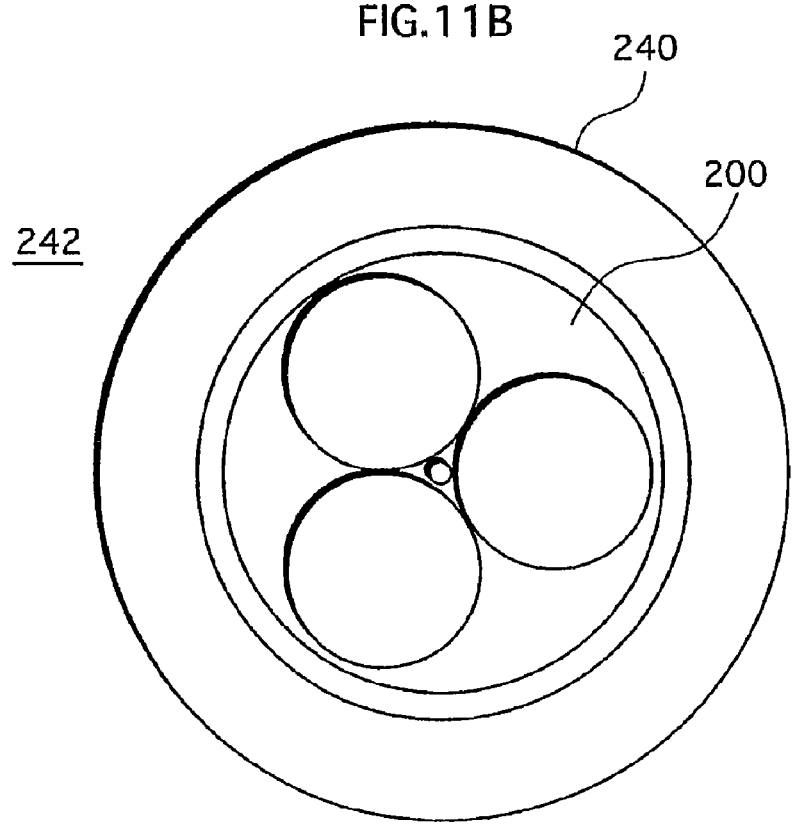
FIG. 11B is a bottom plan view illustrating the lighting apparatus.

FIG. 11A is a schematic perspective view illustrating the lighting apparatus 242, and FIG. 11B is a bottom plan view illustrating the lighting apparatus 242.

The lighting unit 240 is, for example, fixed on a ceiling of a room. The lighting unit 240 includes a power supply circuit (not shown in FIGS. 11A and 11B) that converts alternating-current power (e.g. 100 V, 50/60 Hz) supplied from a commercial power source into direct-current power required for driving the LED module 200.

Figure 12:
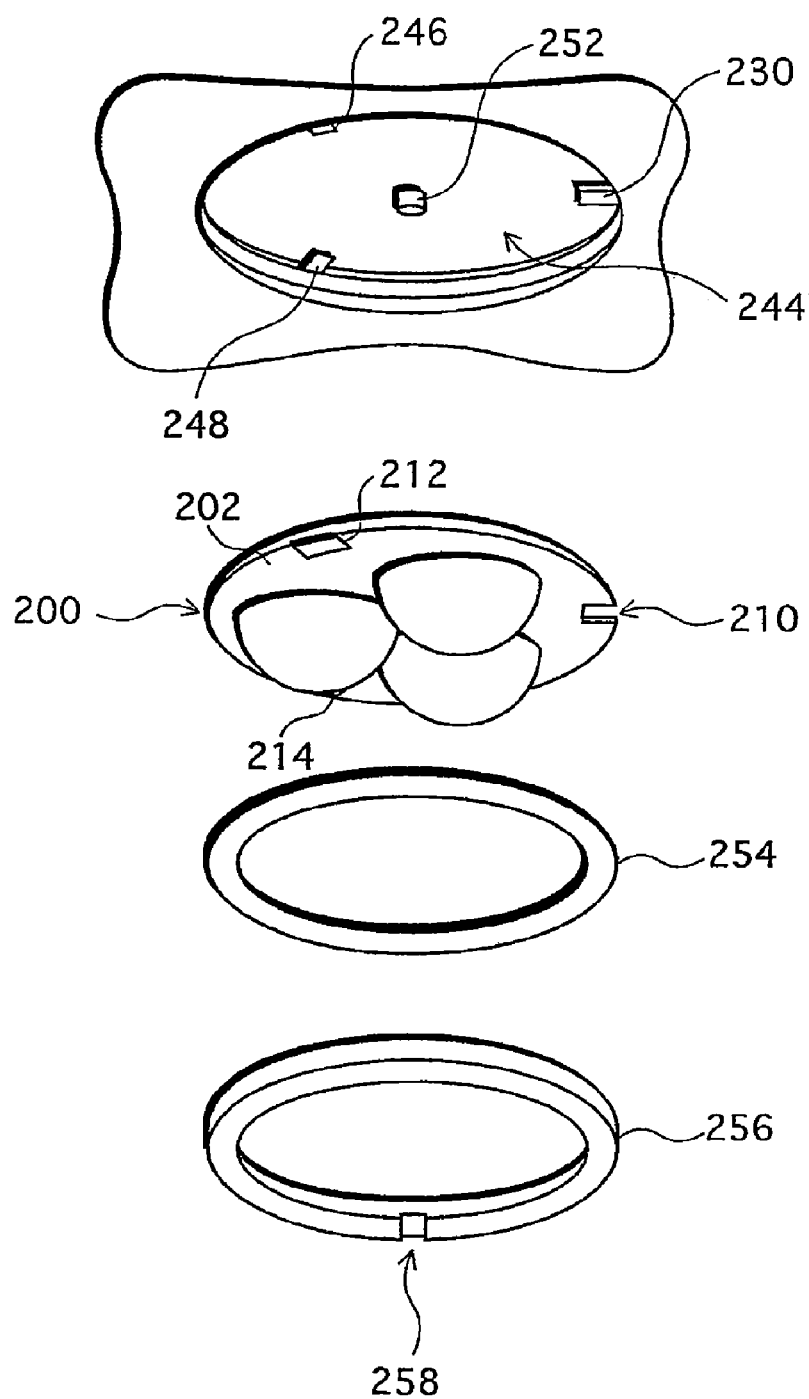
FIG. 12 is a perspective exploded view illustrating the lighting apparatus relating to the first embodiment.

The following part describes a construction to attach the LED module 200 to the lighting unit 240, with reference to FIG. 12.

The lighting unit 240 has a circular depression 244 in which the LED module 200 is to be fitted. A bottom surface of the circular depression 244 is flat. An internal thread (not shown in FIG. 12) is created, in the vicinity of an open end of the circular depression 244, on an inside wall of the circular depression 244. Flexible power supply terminals 246 and 248 and a guiding protrusion 230 protrude from the inside wall of the circular depression 244, between the internal thread and the bottom surface of the circular depression 244. The power supply terminals 246 and 248 are respectively positive and negative. A guiding pin 252 is provided in the center of the bottom surface of the circular depression 244.

An O-ring 254 made of silicon rubber and a ring screw 256 are used to attach the LED module 200 to the lighting unit 240. The ring screw 256 has a shape of a ring that has a substantially rectangular cross-section. An external thread (not shown in FIG. 12) is created on an outer surface of the ring screw 256, and a depression 258 is provided.

The following part describes a procedure of attaching the LED module 200 to the lighting unit 240.

To start with, the LED module 200 is fitted in the circular depression 244 in the following manner. The ceramics substrate 202 of the LED module 200 is positioned between the bottom surface of the circular depression 244 and the power supply terminals 246 and 248. The guiding pin 252 is fitted in the guiding hole 216, so as to align the center of the LED module 200 with the center of the circular depression 244. Furthermore, the guiding protrusion 230 is fitted in the guiding depression 210, so as to align the positive and negative terminals 212 and 214 with the power supply terminals 246 and 248 respectively.

After the LED module 200 is fitted in the circular depression 244, the ring screw 256 to which the O-ring 254 has been attached is screwed into the circular depression 244 and fixed. Thus, the positive and negative terminals 212 and 214 are respectively connected to the power supply terminals 246 and 248, so that the terminals 212 and 214 are electrically connected to the terminals 246 and 248 reliably. In addition, the substantially entire lower surface of the ceramics substrate 202 is connected to the flat bottom surface of the circular depression 244. This enables heat generated in the LED module 200 to be effectively conducted to the lighting unit 240, thereby improving a cooling effect of the LED module 200. Here, silicone grease may be applied to the lower surface of the ceramics substrate 202 and the bottom surface of the circular depression 244 to further improve the heat conduction efficiency from the LED module 200 to the lighting unit 240.

When power is supplied to this lighting apparatus 242 from a commercial power source, the LEDs 6 emit blue light in each LED array chip 2. Here, part of the blue light is converted into yellow light by the phosphor within the phosphor film 48. The blue light and the yellow light mix together, to generate white light. The white light is emitted through the lenses 204, 206 and 208.

Figure 13:
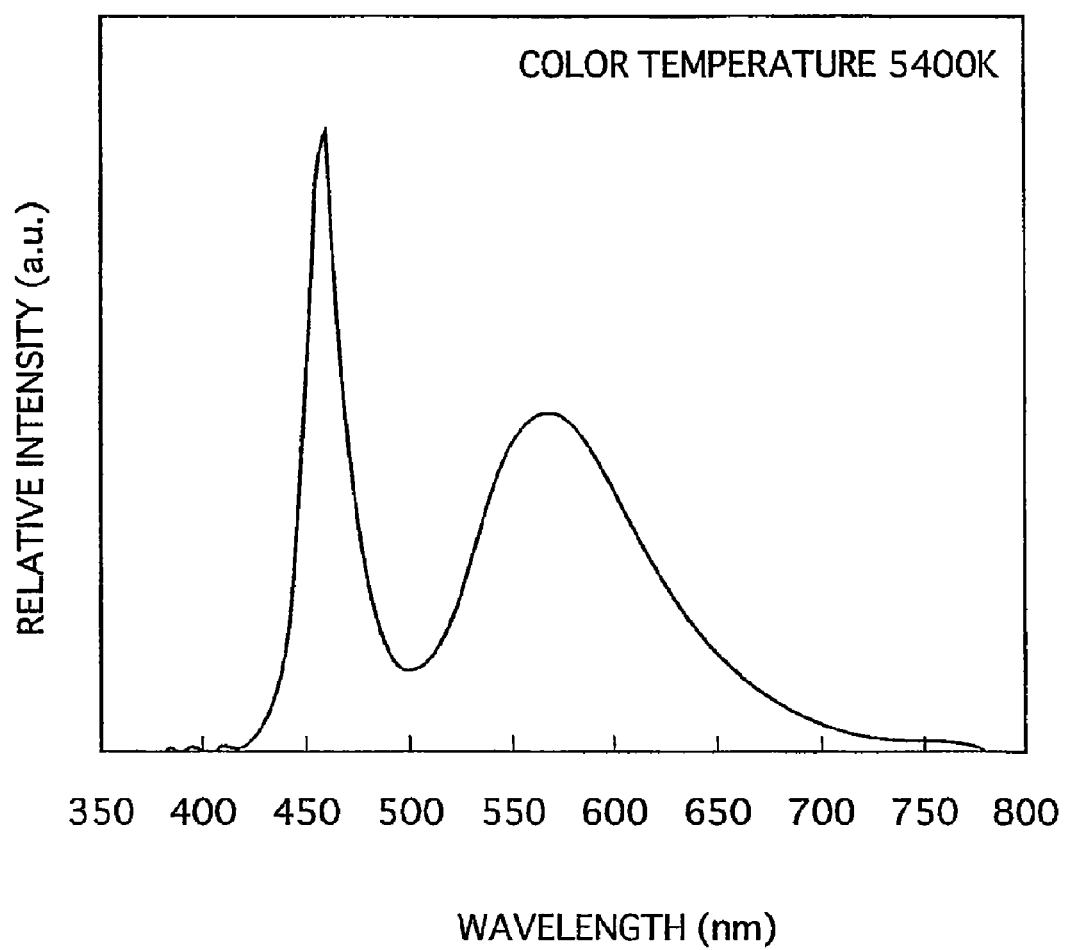
FIG. 13 shows an emission spectrum of the lighting apparatus relating to the first embodiment.

When an electric current of 150 mA is applied to the LED module 200, a total luminous flux of 800 lm, an on-axis luminous intensity of 1500 cd, and an emission spectrum shown in FIG. 13 are observed.

It should be noted that the first embodiment includes the following modification examples.

(1) According to the first embodiment, the removed multilayer portion includes all of the layers from 108 to 118 composing the multilayer epitaxial structure (see step C1 in FIG. 4). However, the first embodiment is not limited to such. It is acceptable as long as the removed multilayer portion includes the layers from an outmost layer (the n-GaN contact layer 118) to a conductive layer between the light emitting layer 114 and the SiC substrate 104 (the n-GaN clad layer 112). As long as this condition is satisfied, the phosphor film 48 can be formed at a large thickness not only on the upper surface of the multilayer epitaxial structure made up of the layers 108 to 118 but also on the side surfaces of the multilayer epitaxial structure which is created by the removed multilayer portion. As a result, unevenness of color can be reduced as described above.

(2) According to the first embodiment, the SiC substrate 104 is used as a base substrate on which the multilayer epitaxial structure made up of the layers from the n-AlGaN buffer layer 108 to the p-GaN contact layer 118 are formed by epitaxial growth. This is because the SiC substrate 104 has a higher heat conductivity than copper and aluminum, and can efficiently conduct heat generated by the light emitting layer 14 to the ceramics substrate 202 which is a printed-wiring board and on which the LED array chips 2 are mounted. The SiC substrate 104 may be replaced with one of an AlN substrate, a GaN substrate, a BN substrate and an Si substrate as they similarly have a high heat conductivity.

Alternatively, the first embodiment may be realized by employing a generally used sapphire substrate, which has a slightly lower heat conductivity.

(3) According to the first embodiment, the LED array chip 2 includes the 35 LEDs 6 (light emitting elements), and is a square approximately 2 mm on its side. However, the first embodiment is not limited to such. The LED array chip 2 may include any number of LEDs (light emitting elements).

Alternatively, the first embodiment may be realized by an LED chip constituted by one LED (light emitting element), instead of the LED array chip 2. If such is the case, the exposed portion 7 is formed so as to surround each LED in the step C1 of the manufacturing method.

(First Modification Example of Second Embodiment)

Figure 14A:
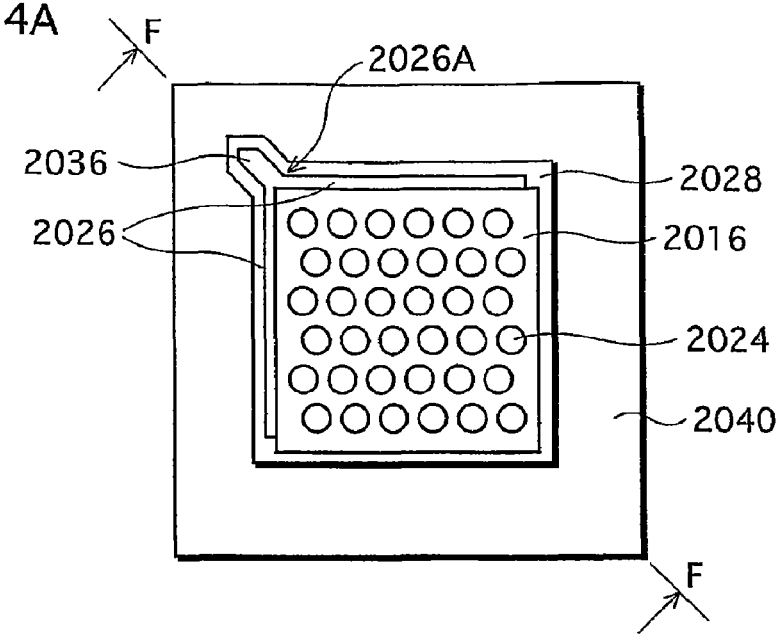
FIG. 14A is a plan view illustrating an LED chip relating to a first modification example of a second embodiment after removing a phosphor film.
Figure 14B:
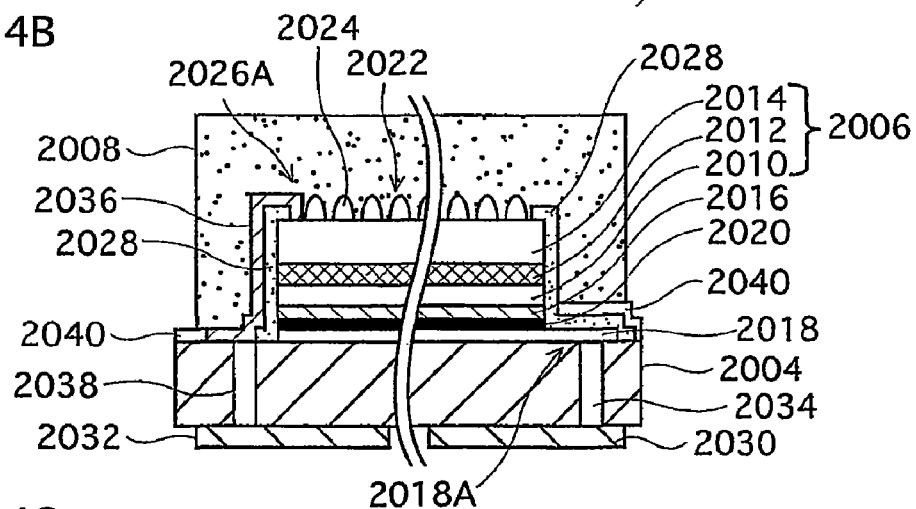
FIG. 14B illustrates a cross-section of the LED chip along a line FF shown in FIG. 14A.
Figure 14C:
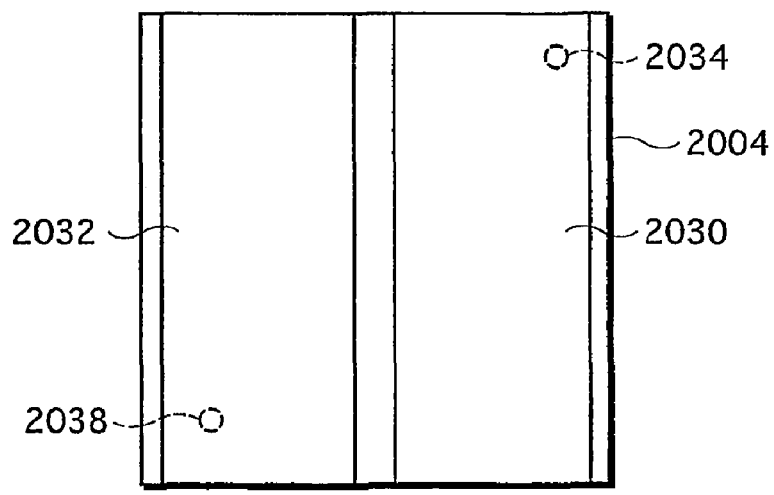
FIG. 14C is a bottom plan view illustrating the LED chip.

FIG. 14A is a plan view illustrating a white LED chip 2002 which is one type of a semiconductor light emitting device (hereinafter simply referred to as "an LED chip 2002"), FIG. 14B illustrates a cross-section of the LED chip 2002 along a line FF shown in FIG. 14A, and FIG. 14C is a bottom plan view illustrating the LED chip 2002. Here, FIG. 14A illustrates the LED chip 2002 after removing a phosphor film 2008 (shown in FIG. 14B and mentioned later). It should be noted that a reduced scale for each constituent is not uniform in any of the drawings including FIGS. 14A, 14B and 14C.

As shown in FIG. 14B, the LED chip 2002 is formed in such a manner that a multilayer epitaxial structure 2006 and the phosphor film 2008 are formed on a high-resistive Si substrate 2004 which is a base substrate (hereinafter referred to as "an Si substrate 2004"). A main surface of the Si substrate 2004 is slightly larger than a main surface of the multilayer epitaxial structure 2006. The multilayer epitaxial structure 2006 is formed on one of the main surfaces of the Si substrate 2004 with a space being retained along a periphery of the substrate 2004.

The multilayer epitaxial structure 2006 is made up of a p-AlGaN layer 2010 which is a conductive layer (having a thickness of 200 nm), a InGaN/AlGaN MQW light emitting layer 2012 (having a thickness of 40 nm), and an n-AlGaN layer 2014 which is a conductive layer (having a thickness of 2 μm). The layer 2010 is the closest to the Si Substrate 2004, and then the layers 2012 and 2014 are formed in the stated order. The multilayer epitaxial structure 2006 has a diode structure.

The LED chip 2002 is a 500-μm-square and has a thickness of 300 μm (the Si substrate 2004 has a thickness of 100 μm, and the phosphor film 2008 has a thickness of 200 μm with respect to an upper main surface of the Si substrate 2004). The multilayer epitaxial structure 2006 has the above-mentioned thickness and is a 420-μm-square.

A high-reflective Rh/Pt/Au electrode 2016 is formed on the entire lower main surface of the p-AlGaN layer 2010, which is opposite to a main surface on which the light emitting layer 2012 is formed. It should be noted that the multilayer epitaxial structure 2006 and the high-reflective electrode 2016 are first formed on a different sapphire substrate 2042 (shown in FIG. 15 and mentioned later) using a wafer fabrication process, and then transferred to the Si substrate 2004.

A conductive film 2018 which is made of a conductive material is formed, at least, in an area corresponding to the high-reflective electrode 2016 on an upper main surface of the Si substrate 2004. The conductive film 2018 is made of Ti/Pt/

Au, and connected to the high-reflective electrode 2016 by a connection layer 2020 which is made of a conductive material such as Au/Sn.

A light extraction surface of the multilayer epitaxial structure 2006 is an upper main surface of the n-AlGaN layer 2014, which is opposite to a main surface to which the light emitting layer 2012 is connected. Here, depressions 2022 are formed on the upper main surface of the layer 2014 to improve light extraction efficiency. The depressions 2022 are formed in such a manner that a tantalum oxide ($Ta_2O_5$) film 2024 formed at an even thickness on the upper main surface of the n-AlGaN layer 2014 is partially removed by etching. A Ti/Pt/Au electrode 2026 which is L-shaped is formed in an area on the upper main surface of the n-AlGaN layer 2014.

An insulating film 2028 made of silicon nitride is formed on the entire surface of each side surface of the multilayer epitaxial structure 2006 and in an area of the upper main surface of the multilayer epitaxial structure 2006 (so as to frame the upper main surface of the multilayer epitaxial structure 2006).

An anode power supply terminal 2030 and a cathode power supply terminal 2032 which are made of Ti/Au are formed on a lower main surface of the Si substrate 2004 which is opposite to a main surface on which the multilayer epitaxial structure 2006 is formed.

The conductive film 2018 has a portion which is not covered by the multilayer epitaxial structure 2006 (hereinafter referred to as an extended portion 2018A). The extended portion 2018A is used to electrically connect the conductive film 2018 to the anode power supply terminal 2030 by a through hole 2034 provided in the Si substrate 2004.

A wiring 2036 is connected at its one end to a corner portion 2026A of the L-shaped electrode 2026, and extends, from the corner portion 2025A, to a periphery of the upper main surface of the n-AlGaN layer 2014 (the light extraction surface of the multilayer epitaxial structure 2006) and then runs along a side surface of the multilayer epitaxial structure 2006, to reach the Si substrate 2004. The wiring 2036 is made up of a Ti/Pt/Au film, and electrically insulated from the multilayer epitaxial structure 2006 by means of the insulating film 2028. The wiring 2036 is electrically connected at the other end to the cathode power supply terminal 2032 by a through hole 2038 provided in the Si substrate 2004. Here, the through holes 2034 and 2038 are each formed by filling a through hole running in a thickness direction of the Si substrate 2004 with Pt.

The phosphor film 2008 covers the side surfaces and the light extraction surface of the multilayer epitaxial structure 2006 formed on the Si substrate 2004. The light extraction surface is the upper main surface of the multilayer epitaxial structure 2006 which is opposite to a main surface to which the Si substrate 2004 is connected. The phosphor film 2008 is made of a light-transmitting resin such as silicone in which particles of phosphors of four different colors and fine particles of metal oxide such as $SiO_2$ are dispersed. Such phosphors include a blue phosphor which contains at least one of $(Ba, Sr)MgAl_{10}O_{17}:Eu^{2+}$, $(Ba, Sr, Ca, Mg)_{10}(PO_4)_6Cl_2:Eu^{2+}$ and the like, a green phosphor which contains at least one of $BaMgAl_{10}O_{17}:Eu^{2+}Mn^{2+}$, $(Ba, Sr)_2SiO_4:Eu^{2+}$ and the like, a yellow phosphor which contains, for example, $(Sr, Ba)_2SiO_4:Eu^{2+}$, and a red phosphor which contains at least one of $La_2O_2S:Eu^{3+}$, $CaS:Eu^{2+}$, $Sr_2Si_5N_8:Eu^{2+}$ and the like. Instead of silicone, an epoxy resin or a polyimide resin may be used as the light-transmitting resin. The phosphor film 2008 is formed on and around the multilayer epitaxial structure 2006 at a substantially even thickness.

An Al light reflective film 2040 is formed between the phosphor film 2008 and an area, on the Si substrate 2004, in which the multilayer epitaxial structure 2006 is not formed.

When power is supplied to the LED chip 2002 described above through the anode and cathode power supply terminals 2030 and 2032, the light emitting layer 2012 of the multilayer epitaxial structure 2006 emits near-ultraviolet light having a wavelength of 390 nm. The near-ultraviolet light from the light emitting layer 2012 is, to a large extend, emitted from the n-AlGaN layer 2014 and absorbed in the phosphor film 2008. The phosphor film 2008 converts the near-ultraviolet light into white light.

As mentioned earlier, while the multilayer epitaxial structure 2006 only has a thickness of less than 3 μm, the phosphor film 2008 has a comparatively large thickness of 200 μm. In addition, the phosphor film 2008 is also formed on the side surfaces of the multilayer epitaxial structure 2006. Here, the phosphor film 2008 is formed on and around the multilayer epitaxial structure 2006 at a substantially even thickness. Accordingly, the LED chip 2002 can produce white light with little unevenness of color, which is caused by variance in thickness of the phosphor film 2008.

According to a first modification example of a second embodiment, the high-reflective electrode 2016 is formed as a p-electrode in the LED chip 2002. This significantly improves light extraction efficiency of the multilayer epitaxial structure 2006. The light extraction efficiency of the multilayer epitaxial structure 2006 can be also improved by the depressions 2022 formed in the tantalum oxide film 2024 on the upper main surface of the n-AlGaN layer 2014, which is the light extraction surface. Furthermore, the light reflective film 2040 improves the light extraction efficiency of the LED chip 2002.

Furthermore, a sapphire substrate or the like is not provided on the light extraction side of the multilayer epitaxial structure 2006 in the LED chip 2002. Accordingly, the LED chip 2002 has much higher light extraction efficiency than an LED chip in which light emitted from a light emitting layer is emitted outside through a sapphire substrate or the like. According to the first modification example of the second embodiment, the p-electrode (the high-reflective electrode 2016) is formed on the substantially entire surface of a p-type layer (the p-AlGaN layer 2010) which is difficult to be configured to have a low resistance. This enables an electric current to be evenly injected to the entire multilayer semiconductor layer 2006, thereby making it possible that the entire light emitting layer 2012 evenly emit light and that a lower operation voltage is achieved.

To mount the LED chip 2002, the power supply terminals 2030 and 2032 are directly connected to pads formed on a mounting substrate as described later. Here, having the phosphor film 2008, the LED chip 2002 can emit white light by itself. This makes it possible to test the LED chip 2002 for its optical performance as described above before the LED chip 2002 is mounted. As a result, it can be prevented that a finished product including the mounting board on which the LED chip 2002 has been mounted is rejected due to the optical performance of the LED chip 2002. In this way, the ratio of accepted finished products can be improved. In addition, the LED chip 2002 relating to the first modification example of the second embodiment can be made smaller, when compared with the above-mentioned conventional LED chip which requires an auxiliary mounting substrate in addition to a base substrate that directly supports a multilayer epitaxial structure.

Furthermore, the anode and cathode power supply terminals 2030 and 2032 are positioned below the multilayer epitaxial structure 2006 in the LED chip 2002. Therefore, when the LED chip 2002 is mounted, no components that block light, such as a bonding wire, exist on or above the light extraction surface of the multilayer epitaxial structure 2006. Therefore, light emitted from the LED chip 2002 does not contain shadow.

The following part explains a manufacturing method for the LED chip 2002 described above with reference to FIGS. 15 to 20. In FIGS. 15 to 20, a material to form each constituent of the LED chip 2002 is identified by a five-digit number whose first digit is one. The last four digits of the five-digit number represents a reference numeral identifying the corresponding constituent of the LED chip 2002.

Firstly, as shown in FIG. 15, an n-AlGaN layer 12014, an InGaN/AlGaN MQW light emitting layer 12012, and a p-AlGaN layer 12010 are formed by epitaxial growth on the sapphire substrate 2042, which is a single-crystal substrate, in the stated order using a MOCVD method (step A2). Here, the sapphire substrate 2042 has a diameter of two inches and a thickness of 300 μm.

After this, a mask is formed on a multilayer epitaxial structure 12006 composed of the layers 12014, 12012 and 12010, and an unmasked area of the multilayer epitaxial structure 12006 is removed by dry etching to such a depth that the sapphire substrate 2042 is exposed. Thus, multilayer epitaxial structures 2006, each of which constitutes the LED chip 2002 (shown in FIG. 14B), are formed on the sapphire substrate 2024 (step B2).

Subsequently, an Rh/Pt/Au film is formed by a technique such as an electron beam evaporation method, on the upper main surface of each multilayer epitaxial structure 2006 (i.e. on the p-AlGaN layer 2010). Thus, the high-reflective electrode 2016 is formed (step C2).

In parallel to the steps A2 to C2, steps D2 to E2 shown in FIG. 16 are conducted.

Holes 2044 and 2046 are created by dry etching in a high-resistive Si substrate 12004 in a thickness direction of the substrate 12004. The holes 2044 and 2046 are filled with Pt by electroless deposition, to form the through holes 2034 and 2038 (step D2).

After this, a Ti/Pt/Au film is applied in a predetermined area on an upper main surface of the Si substrate 12004, to form the conductive film 2018. In addition, an Au/Sn film is formed on a predetermined area on the conductive film 2018, to form the connection layer 2020 (step E2).

Subsequently, the sapphire substrate 2042 is placed on the Si substrate 12004 so as that the high-reflective electrode 2016 formed on the sapphire substrate 2042 is in contact with the connection layer 2020 formed on the Si substrate 12004. Then, while being pressed together, the sapphire substrate 2042 and the Si substrate 12004 are heated until the connection layer 2020 reaches 300° C. (step F2). Thus, the high-reflective electrode 2016 and the connection layer 2020 are eutectic-bonded.

After the high-reflective electrode 2016 and the connection layer 2020 are bonded together, a step of separating the sapphire substrate 2042 from the multilayer epitaxial structure 2006 is conducted (step G2). In detail, a YAG laser third harmonic beam LB having a wavelength of 355 nm is irradiated to the sapphire substrate 2042 and the Si substrate 12004 from a side of the sapphire substrate 2042 in such a manner that the beam scans the entire surface of the sapphire substrate 2042. The irradiated laser beam is not absorbed by the sapphire substrate 2042, but only by an interface between the sapphire substrate 2042 and the n-AlGaN layer 2014. Here, heat is generated locally and breaks AlGaN bond around the interface. As a consequence, the sapphire substrate 2042 is separated from the multilayer epitaxial structure 2006 in terms of crystal structure (step G2). However, the sapphire substrate 2042 is still adhered to the multilayer epitaxial structure 2006 by means of a layer including a metal Ga (a pyrolytic layer). To separate the sapphire substrate 2042 from the multilayer epitaxial structure 2006 completely, the sapphire substrate 2042 and the multilayer epitaxial structure 2006 are immersed into hydrochloride or the like to dissolve the interface portion (step H2). It should be noted that the YAG laser third harmonic beam can be replaced with a KrF excimer laser having a wavelength of 248 nm or a mercury emission line having a wavelength of 365 nm.

The multilayer epitaxial structure 2006 is transferred from the sapphire substrate 2042 to the Si substrate 12004 by separating the sapphire substrate 2042 in the above-described manner. This eliminates internal stress within the multilayer epitaxial structure 2006 generated by a difference in lattice constant between the n-AlGaN layer 2014 and the sapphire substrate 2042. As a result, distortion of the multilayer epitaxial structure 2006 can be reduced. Furthermore, instead of the substrate 2004 supporting the multilayer epitaxial structure 2006 in the LED chip 2002, a substrate selected from more extensive options including a substrate that has higher heat dissipation (higher heat conductivity) than a substrate used for epitaxial growth can be used as a base substrate.

In the following step I2, a silicon nitride film is formed by high-frequency sputtering or the like for insulation and surface protection, to form the insulating film 2028. Here, the silicon nitride film is formed on the upper main surface of the multilayer epitaxial structure 2006 (the n-AlGaN layer 2014) along its periphery, on the side surfaces of the multilayer epitaxial structure 2006, and on the extended portion 2018A of the conductive film 2018.

After this, a Ti/Pt/Au film is applied, to form the electrode 2026 and the wiring 2036 (step J2) as one unit.

An Al film is applied, to form the light reflective film 2040 (step K2).

After this, the tantrum oxide ($Ta_2O_5$) film 2024 is deposited by sputtering or the like on a part of the main surface of the n-AlGaN layer 2014 which is not covered by the electrode 2026, the insulating film 2028 and the wiring 2036. Then, the tantrum oxide film 2024 is partially removed by etching, to form the depressions 2022 (step L2).

Subsequently, a first macromolecule film 2048 is adhered to a front main surface, of the Si substrate 12004, on which the multilayer epitaxial structure 2006 is formed, by means of a polyester adhesive layer (not shown in FIG. 19) (step M2). When heated, the adhesive layer foams and loses adhesivity.

After this, a back main surface of the Si substrate 12004 is polished so that the thickness of the Si substrate 12004 becomes 100 μm (step N2). Thus, the through holes 2034 and 2038 are exposed on the back main surface of the Si substrate 12004.

Following this, a Ti/Au film is applied in a predetermined area on the back main surface of the Si substrate 12004, to form the anode and cathode power supply terminals 2030 and 2032 (step O2).

The first macromolecule film 2048 that has been adhered to the front main surface of the Si substrate 12004 is then removed. A second macromolecule film 2050 is adhered to the back main surface of the Si substrate 12004 as a dicing sheet (step P2).

Lastly, after the phosphor film 2008 is formed by screen printing (step Q2), the Si substrate 12004 is diced by a dicing blade (DB in FIG. 20) into individual LED chips 2002 (step R2). Thus, the LED chip 2002 is manufactured.

(Second Modification Example of Second Embodiment)

According to the first modification example of the second embodiment, the anode and cathode power supply terminals 2030 and 2032 are formed on the back main surface of the Si substrate 2004, which is a base substrate, in the LED chip 2002. In a white LED chip 2102 relating to a second modification example of the second embodiment, however, one power supply terminal (an anode power supply terminal in the second modification example) is formed on a back main surface of a base substrate, and the other power supply terminal (a cathode power supply terminal in the second modification example) is formed on a front main surface of the base substrate.

The LED chip 2102 is the same as the LED chip 2002, in terms of a composition and a thickness of each of layers constituting a multilayer epitaxial structure, and a composition of a phosphor film. However, the LED chip 2102 is different from the LED chip 2002 in terms of a construction of electrodes formed on both main surfaces of the multilayer epitaxial structure. In addition, the multilayer epitaxial structure of the LED chip 2102 is formed on the base substrate in the same manner as the multilayer epitaxial structure 2006. In detail, the multilayer epitaxial structure is first formed on a single-crystal substrate which is different from the base substrate, and then transferred to the base substrate.

Figure 21A:
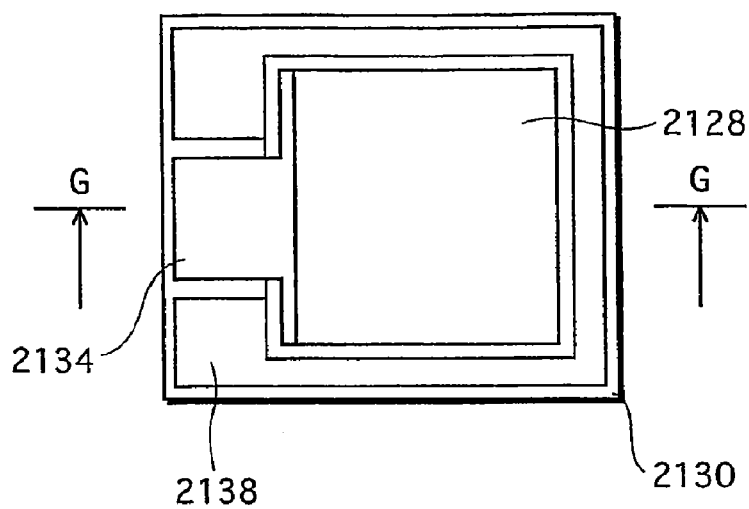
FIG. 21A is a plan view illustrating an LED chip relating to a second modification example of the second embodiment after removing a phosphor film.
Figure 21B:
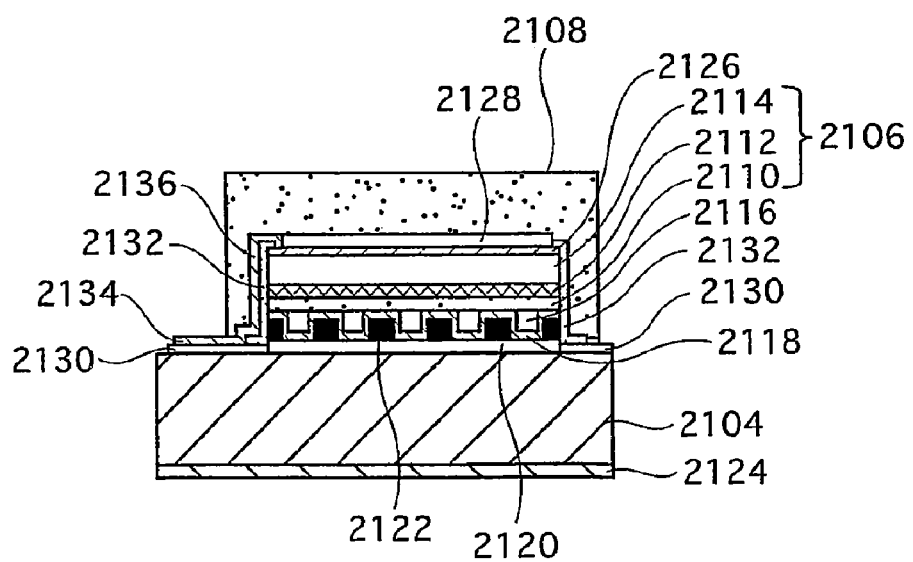
FIG. 21B illustrates a cross-section of the LED chip along a line GG shown in FIG. 21A.

FIG. 21A is a plan view illustrating the LED chip 2102 relating to the second modification example of the second embodiment, and FIG. 21B illustrates a cross-section of the LED chip 2102 along a line GG shown in FIG. 21A. FIG. 21A shows the LED chip 2102 after removing a phosphor film 2108 (shown in FIG. 21B).

As shown in FIGS. 21A and 21B, the LED chip 2102 is formed in such a manner that a multilayer epitaxial structure 2106 and the phosphor film 2108 are formed on an n-type SiC substrate 2104, which is a base substrate (hereinafter referred to as "an SiC substrate 2104"). A main surface of the SiC substrate 2104 is slightly larger than a main surface of the multilayer epitaxial structure 2106. The multilayer epitaxial structure 2106 is provided on one of the main surfaces of the SiC substrate 2104 with a space being retained along a periphery of the substrate 2104.

The multilayer epitaxial structure 2106 is made up of a p-AlGaN layer 2110, an InGaN/AlGaN MQW light emitting layer 2112, and an n-AlGaN layer 2114. The layer 2110 is the closest to the SiC Substrate 2104, and then the layers 2112 and 2114 are formed in the stated order. Thus, the multilayer epitaxial structure 2106 has a diode structure.

A multilayer dielectric film 2116 made of $SiO_2/Ta_2O_5$ and a high-reflective electrode 2118 made of Rh/Pt/Au are formed on a back main surface of the p-AlGaN layer 2110. The multilayer dielectric film 2116 is formed by partially removing a sheet-like multilayer dielectric film by etching with a predetermined pattern. The p-AlGaN layer 2110 is electrically connected to the high-reflective electrode 2118 in areas which are not covered by the multilayer dielectric film 2116. A conductive film 2120 is formed on an upper main surface of the SiC substrate 2104 so as to correspond to the high-reflective electrode 2118. The conductive film 2120 is made of Ti/Pt/Au, and is connected to the high-reflective electrode 2118 by a connection layer 2122 which is made of a conductive material such as Au/Sn. A Ti/Au anode power supply terminal 2124 is formed on the entire back main surface of the SiC substrate 2104. Thus, the high-reflective electrode 2118 is electrically connected to the anode power supply terminal 2124 by means of the connection layer 2122, the conductive film 2120 and the SiC substrate 2104.

An ITO transparent electrode 2126 and an $SiO_2/Ta_2O_5$ multilayer dielectric film 2128 are formed in this order on an upper main surface of the n-AlGaN layer 2114.

An $SiO_2$ insulating film 2130 is formed on an area, on the upper main surface of the SiC substrate 2104, in which the multilayer epitaxial structure 2106 is not formed. An insulating film 2132 made of silicon nitride is formed on the side surfaces of the multilayer epitaxial structure 2106 and on a part of an upper main surface of the multilayer epitaxial structure 2106 (so as to frame the upper main surface).

As shown in FIG. 21A, a rectangular cathode power supply terminal 2134 formed by a Ti/Pt/Al film is provided on the insulating film 2130.

A side of the ITO transparent electrode 2126 and a side of the cathode power supply terminal 2134 are connected to each other by means of a wiring 2136 that is formed along the side surface of the multilayer epitaxial structure 2106. The wiring 2136 is formed by a Ti/Pt/Al film, and electrically insulated from the multilayer epitaxial structure 2106 by the insulating film 2132.

A light reflective film 2138 of a Ti/Pt/Al film is formed so as to surround the multilayer epitaxial structure 2106 on the insulating film 2130. The light reflective film 2138 is substantially U-shaped.

The phosphor film 2108 covers the side surfaces of the multilayer epitaxial structure 2106 and a main surface (a light extraction surface) of the multilayer epitaxial structure 2106 which is opposite to a main surface to which the SiC substrate 2104 is connected. As shown in FIG. 21B, a large portion of the cathode power supply terminal 2134 is not covered by the phosphor film 2108.

When power is supplied to the LED chip 2102 described above through the anode and cathode power supply terminals 2124 and 2134, the light emitting layer 2112 in the multilayer epitaxial structure 2106 emits near-ultraviolet light having a wavelength of 390 nm.

In the LED chip 2102 relating to the second modification example of the second embodiment, the multilayer epitaxial structure 2106 is positioned between mirror structures, i.e. the multilayer dielectric films 2116 and 2128. The mirror structure closer to the p-AlGaN layer 2110 has a reflectance of 99% or over, and the mirror structure closer to the n-AlGaN layer 2114 has a reflectance of 90% or over. Thus, a resonant LED structure is formed. The near-ultraviolet light having a wavelength of 390 nm emitted from the light emitting layer 2112 is emitted through the multilayer dielectric film 2128, which is the mirror structure closer to the n-AlGaN layer 2114 and has a lower reflectance, and absorbed by the phosphor film 2108. The phosphor film 2108 converts the near-ultraviolet light into white light.

Having a resonant LED structure, the LED chip 2102 relating to the second modification example of the second embodiment has a better light extraction efficiency in a direction perpendicular to the light emitting layer 2112. Generally speaking, if the thickness of the p-AlGaN layer 2110 and that of the n-AlGaN layer 2114 are reduced, an electric current is likely to expand in a horizontal direction unevenly. This may cause light to be emitted unevenly from the light emitting layer 2112. The uneven light emission becomes more notable as a light emission area becomes large. According to the second modification example of the second embodiment, power is supplied to the p-AlGaN layer 2110 through the high-reflective electrode 2118. Here, the electrode 2118 is formed on the substantially entire surface of the p-AlGaN layer 2110 since the multilayer dielectric film 2116 is formed by partially etching a sheet-like multilayer dielectric film. Furthermore, power is supplied to the n-AlGaN layer 2114 through the ITO transparent electrode 2126. Here, the electrode 2126 is formed on the entire main surface of the n-AlGaN layer 2114. Thus, an electric current can be evenly injected to the entire light emitting layer 2112. This enables the entire light emitting layer 2112 evenly emit light, with it being possible to achieve a lower operation voltage. In addition, since the LED chip 2102 does not include an insulating substrate such as a sapphire substrate, an ability to withstand static electricity is improved.

To mount the LED chip 2102, the anode power supply terminal 2124 is directly connected to a pad formed on a mounting substrate, and the cathode power supply terminal 2134 is connected to another pad by a bonding wire. The second modification example of the second embodiment can achieve the same effects as the first modification example. In detail, having the phosphor film 2108, the LED chip 2102 can emit white light by itself. This makes it possible to test the LED chip 2102 for its optical performance as described above before the LED chip 2102 is mounted. As a result, it can be prevented that a finished product including the mounting board on which the LED chip 2102 is mounted is rejected due to the optical performance of the LED chip 2102. In this way, the ratio of accepted finished products can be improved. In addition, the LED chip 2102 relating to the second modification example of the second embodiment can be made smaller, when compared with the above-mentioned conventional LED chip which requires an auxiliary mounting substrate in addition to a base substrate that directly supports a multilayer epitaxial structure.

In the LED chip 2102, the anode power supply terminal 2124 is formed on the back main surface of the SiC substrate 2104, and the cathode power supply terminal 2134 is formed on the upper main surface of the SiC substrate 2104. Which is to say, the both anode and cathode power supply terminals 2124 and 2134 are positioned closer to the SiC substrate 2104 than the light extraction surface of the multilayer epitaxial structure 2106. The anode power supply terminal 2124 is electrically connected to a p-electrode (the high-reflective electrode 2118) by the SiC substrate 2104. The cathode power supply terminal 2134 is connected to an n-electrode (the ITO transparent electrode 2126) by the wiring 2136 that extends from the ITO transparent electrode 2126 towards the side surface of the n-AlGaN layer 2114. When the LED chip 2102 is mounted, no components that block light, such as a bonding wire, exist on or above the light extraction surface of the multilayer epitaxial structure 2106. Therefore, light emitted from the LED chip 2102 does not contain shadow.

The following part explains a manufacturing method for the LED chip 2102 described above, with reference to FIGS. 22 to 27. In FIGS. 22 to 27, a material to form each constituent of the LED chip 2102 is identified by a five-digit number whose first digit is one. The last four digits of the five-digit number represents a reference numeral identifying the corresponding constituent of the LED chip 2102.

Firstly, as shown in FIG. 22, an n-AlGaN layer 12114, an InGaN/AlGaN MQW light emitting layer 12112, and a p-AlGaN layer 12110 are formed by epitaxial growth on a sapphire substrate 2140, which is a single-crystal substrate, in the stated order using a MOCVD method (step A3). Here, the sapphire substrate 2140 has a diameter of two inches and a thickness of 300 μm.

After this, a mask is formed on a multilayer epitaxial structure 12106 composed of the layers 12114, 12112 and 12110, and an unmasked are of the multilayer epitaxial structure 12106 is removed by dry etching to such a depth that the sapphire substrate 2140 is exposed. Thus, multilayer epitaxial structures 2106, each of which constitutes the LED chip 2102 (shown in FIG. 21B) are formed on the sapphire substrate 2140 (step B3).

Subsequently, an $SiO_2/Ta_2O_5$ multilayer dielectric film is formed on an upper main surface of each multilayer epitaxial structure 2106 (the p-AlGaN layer 2110) by RF sputtering or the like. The $SiO_2/Ta_2O_5$ multilayer dielectric film is partially removed by etching to such a depth that the p-AlGaN layer 2110 is exposed, to form the multilayer dielectric film 2116 (step C3). On the multilayer dielectric film 2116, an Rh/Pt/Au film is applied by a technique such as an electron beam evaporation method. Thus, the high-reflective electrode 2118 is formed (step D3).

In parallel to the steps A3 to D3, a step E3 shown in FIG. 23 is conducted.

After an $SiO_2$ film is formed on one of main surfaces of an n-type SiC substrate 12104 so as to cover the entire surface, an area of the $SiO_2$ film in which the conductive film 2120 is to be formed is removed. Thus, the insulating film 2130 is formed 2120. After this, a Ti/Pt/Au film is applied in the $SiO_2$-film removed area, to form the conductive film 2120. On the conductive film 2120, an Au/Sn film 12122 is formed (step E3).

After this, the sapphire substrate 2140 is placed on the SiC substrate 12104 so as that the high-reflective electrode 2118 formed on the sapphire substrate 2140 is in contact with the Au/Sn film 12122 formed on the SiC substrate 12104. Then, while being pressed together, the sapphire substrate 2140 and the SiC substrate 12104 are heated until the Au/Sn film 12122 reaches 300° C. (step F3). Thus, the high-reflective electrode 2118 and the Au/Sn film 12122 are eutectic-bonded. Consequently, since the Au/Sn film 12122 is processed to be the connection layer 2122, the high-reflective electrode 2118 and the conductive film 2120 are physically and electrically connected together.

After the high-reflective electrode 2118 and the connection layer 2122 are bonded together, steps G3 and H3 (shown in FIG. 24) are conducted to separate the sapphire substrate 2140 from the multilayer epitaxial structure 2106. The steps G3 and H3 are the same as the steps G2 and H2 (shown in FIG. 17) described in the first modification example of the second embodiment, and therefore not repeatedly explained here.

In the steps G3 and H3, the sapphire substrate 2140 is separated, and the multilayer epitaxial structure 2106 and the like are transferred from the sapphire substrate 2140 to the SiC substrate 12104. In the next step I3, an upper main surface of the n-AlGaN layer 2114 which is opposite to a lower main surface to which the light emitting layer 2112 is connected is flattened using a mechanical or a chemical process. After this, an ITO film is applied on the upper main surface of the n-AlGaN layer 2114 by sputtering or the like, to form the ITO transparent electrode 2126.

On the ITO transparent electrode 2126, the multilayer dielectric film 2128 is formed by sputtering or the like (step J3).

The insulating film 2132 is formed by applying a silicon nitride film by sputtering or the like (step K3).

After this, a Ti/Pt/Al film is deposited in predetermined areas on the resulting surface after the step K3, to form the cathode power supply terminal 2134, the wiring 2136, and the light reflective film 2138 simultaneously (step L3).

Subsequently, a first macromolecule film 2142 is adhered to a front main surface, of the SiC substrate 12104, on which the multilayer epitaxial structure 2106 is formed, similarly to the first modification example of the second embodiment (step M3).

After this, a back main surface of the SiC substrate 12104 is polished so that the thickness of the SiC substrate 12104 becomes 100 μm. A Ti/Au film 12124 is then applied on the back main surface of the SiC substrate 12104, to form the anode power supply terminal 2124 (shown in FIG. 21B) (step N3).

The first macromolecule film 2142 that has been adhered to the front main surface of the SiC substrate 12104 is then removed. A second macromolecule film 2144 is adhered to the back main surface of the SiC substrate 12104 as a dicing sheet (step O3).

Lastly, after the phosphor film 2108 is formed by screen printing (step P3), the SiC substrate 12104 is diced by a dicing blade (DB in FIG. 27) into individual LED chips 2102 (step Q3). Thus, the LED chip 2102 is manufactured.

(Third Modification Example of Second Embodiment)

Figure 28A:
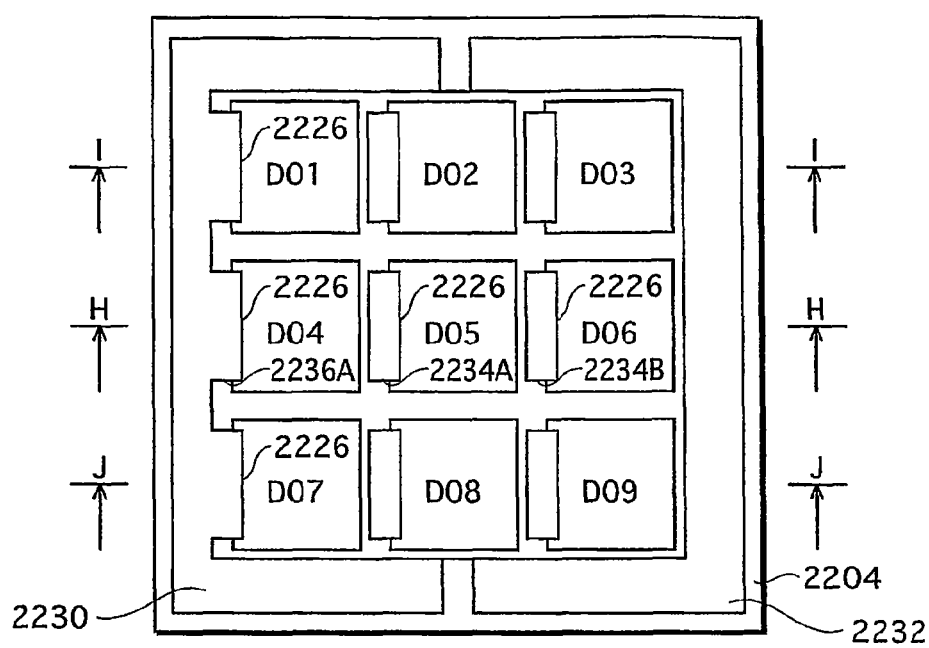
FIG. 28A is a plan view illustrating an LED array chip relating to a third modification example of the second embodiment after removing a phosphor film.
Figure 28B:
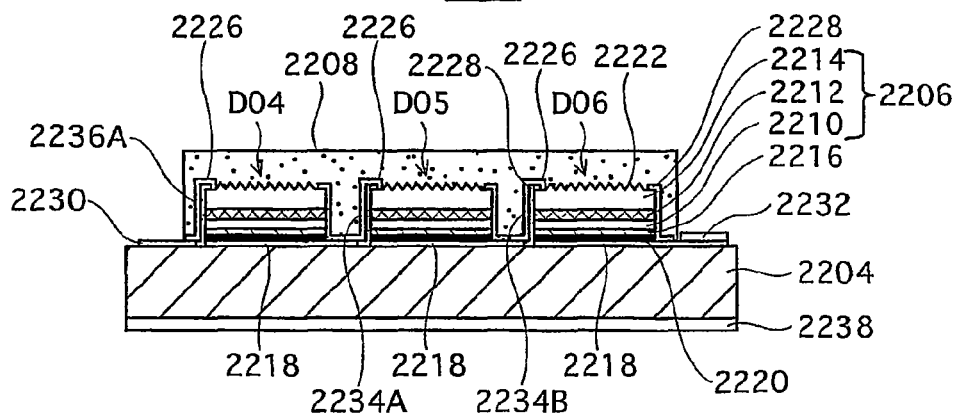
FIG. 28B illustrates a cross-section of the LED array chip along a line HH shown in FIG. 28A.
Figure 28C:
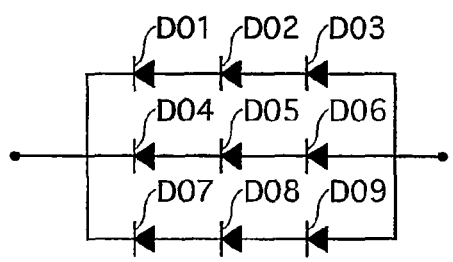
FIG. 28C illustrates how LEDs are connected in the LED array chip.

FIG. 28A is a plan view illustrating a white LED array chip 2202 which is one type of a semiconductor light emitting device (hereinafter referred to as "an LED array chip 2202"), FIG. 28B illustrates a cross-section of the LED array chip 2202 along a line HH shown in FIG. 28A, and FIG. 28C illustrates how LEDs are connected in the LED array chip 2202. FIG. 28A shows the LED array chip 2202 after removing a phosphor film 2208 (shown in FIG. 28B and mentioned later). A cross-section along each of a line II and a line JJ shown in FIG. 28A is the same as the cross-section shown in FIG. 28B.

The LED array chip 2202 is formed in such a manner that nine LED D01 to D09 are arranged in a matrix of 3×3 as shown in FIG. 28A. The LED array chip 2202 is a square approximately 1.2 mm on a side. The LEDs D01 to D09 each have the same construction as the LED chip 2002 relating to the first modification example of the second embodiment, except for a pattern of depressions formed in order to improve light extraction efficiency and a construction of an n-electrode. The LEDs D01 to D09 are connected in series-parallel in the LED array chip 2202 as shown in FIG. 28C. In detail, the LEDs D01 to D09 are divided into groups each of which has three LEDs connected in series in a row direction, and the groups are connected in parallel. It is mentioned later how adjacent LEDs are connected to each other in the LED array chip 2202.

As shown in FIG. 28B, the LED array chip 2202 includes an MN substrate 2204 as a base substrate to support a multilayer epitaxial structure 2206.

The multilayer epitaxial structure 2206 constituting each of the LEDs D01 to D09 is made up of a p-AlGaN layer 2210, an InGaN/AlGaN MQW light emitting layer 2212, and an n-AlGaN layer 2214 as in the LED chip 2002 relating to the first modification example of the second embodiment shown in FIG. 14B. The layer 2210 is the closest to the AlN substrate 2204, and then the layers 2212 and 2214 are formed in the stated order. On a lower main surface of the p-AlGaN layer 2210, an Rh/Pt/Au p-electrode 2216, which is a high-reflective electrode, is formed. On an upper main surface of the AlN substrate 2204, a Ti/Pt/Au conductive film 2218 is formed. The conductive film 2218 and the p-electrode 2216 are physically and electrically connected to each other by means of an Au/Sn connection layer 2220. An upper main surface of the n-AlGaN layer 2214 (i.e. a light extraction surface of the multilayer epitaxial structure 2206) is made uneven, to have depressions 2222. This is aimed at improving light extraction efficiency.

A Ti/Pt/Al n-electrode 2226 is formed along one side of the upper main surface of the n-AlGaN layer 2214 of each multilayer epitaxial structure 2206. An insulating film 2228 made of silicon nitride is formed so as to cover side surfaces and a part of an upper main surface of the multilayer epitaxial structure 2206.

The following part describes how the LEDs D04 to D06 are connected in series.

The LEDs 04, 05 and 06 are connected in series in this order in the following manner. A conductive film 2218 of the LED D04 is connected to an n-electrode 2226 of the LED D05 by a bridging wire 2234A. A conductive film 2218 of the LED D05 is connected to an n-electrode 2226 of the LED D06 by a bridging wire 2234B. In the same manner, the LEDs D01, 02 and 03 are connected in series in this order, and the LEDs D07, 08 and 09 are connected in series in this order.

A Ti/Pt/Al cathode power supply terminal 2230 is formed in a left-half area of the upper main surface of the AlN substrate 2204, and a Ti/Pt/Al anode power supply terminal 2232 is formed in a right-half area.

An n-electrode 2226 of the LED D04 is electrically connected to the cathode power supply terminal 2230 by a wiring 2236A. In the same manner, n-electrodes 2226 of the LEDs D01 and D07 are connected to the cathode power supply terminal 2230. Thus, the n-electrodes 2226 of the LEDs D01, D04 and D07 are electrically connected in parallel.

A conductive film 2218 of the LED D06 extends so as to overlap the anode power supply terminal 2232 and to be connected to the anode power supply terminal 2232 at the overlap. In the same manner, conductive films 2218 of the LEDs D03 and D09 are connected to the anode power supply terminal 2232. Thus, the p-electrodes 2216 of the LEDs D03, D06 and D09 are electrically connected in parallel.

As seen from the above description, the cathode and anode power supply terminals 2230 and 2232 also function as a wiring to connect, in parallel, the groups of the LEDs that are connected in series. The cathode and anode power supply terminals 2230 and 2232 cover a major part of an area, on the upper main surface of the AlN substrate 2204, in which the multilayer epitaxial structures 2206 are not formed, and also function as a light-reflective film.

As described above, the nine LEDs D01 to D09 are connected in series-parallel and arranged in a matrix on the AlN substrate 2204 so that a space is left along edges of the AlN substrate 2204. The phosphor film 2208 covers side surfaces and the light extraction surface of each of the LEDs D01 to D09 (the multilayer epitaxial structures 2206) formed on the AlN substrate 2204. Here, the phosphor film 2208 may have the same composition as the phosphor film 2008 relating to the first modification example of the second embodiment.

A Ti/Au film 2238 is formed on a back main surface of the AlN substrate 2204.

When power is supplied to the LED array chip 2202 described above through the cathode and anode power supply terminals 2230 and 2232, the light emitting layer 2212 of each of the LEDs D01 to D09 emits near-ultraviolet light having a wavelength of 390 nm. The near-ultraviolet light emitted from the light emitting layer 2212 is, to a large extent, emitted from the n-AlGaN layer 2214 and absorbed by the phosphor film 2208. The phosphor film 2208 converts the near-ultraviolet light into white light.

In the LED array chip 2202, the p-electrode 2216 is formed as a high-reflective electrode, and the depressions 2222 are formed on the upper main surface of the n-AlGaN layer 2214 (the light extraction surface). These constructions contribute to significantly improve the light extraction efficiency of the multilayer epitaxial structure 2206. The cathode and anode power supply terminals 2230 and 2232 function as a light-reflective film. This construction contributes to improve light extraction efficiency of the LED array chip 2202.

To mount the LED array chip 2202, the Ti/Au film 2238 is directly connected to a pad formed on a mounting substrate. The cathode power supply terminal 2230 and the anode power supply terminals 2232 are each connected to a power-supply pad formed on the mounting substrate by wire bonding.

Here, since the LED array chip 2202 includes the phosphor film 2208, the LED array chip 2202 can emit white light by itself. This and other features of the LED array chip 2202 produce the same effects as the first and second modification examples of the second embodiment.

The following part describes a manufacturing method for the LED array chip 2202 described above, with reference to FIGS. 29 to 32. In FIGS. 29 to 32, a material to form each constituent of the LED array chip 2202 is identified by a five-digit number whose first digit is one. The last four digits of the five-digit number represents a reference numeral identifying the corresponding constituent of the LED chip 2202.

Firstly, as shown in FIG. 29, an n-AlGaN layer 12214, an InGaN/AlGaN MQW light emitting layer 12212, and a p-AlGaN layer 12210 are formed by epitaxial growth on a sapphire substrate 2240, which is a single-crystal substrate, in the stated order using a MOCVD method (step A4). Here, the sapphire substrate 2240 has a diameter of two inches and a thickness of 300 μm.

After this, a mask is formed on a multilayer epitaxial structure 12206 composed of the layers 12214, 12212 and 12210, and an unmasked area of the multilayer epitaxial structure 12206 is removed by dry etching to such a depth that the sapphire substrate 2240 is exposed. Thus, multilayer epitaxial structures 2206, which constitute the LED array chip 2202 (shown in FIG. 28B), are formed on the sapphire substrate 2240 (step B4).

Subsequently, an Rh/Pt/Au film is formed by a technique such as an electron beam evaporation method, on the upper main surface of each multilayer epitaxial structure 2206 (i.e. the p-AlGaN layer 2210). Thus, the p-electrode 2216 is formed (step C4).

In parallel to the steps A4 to C4 in FIG. 29, a step D4 shown in FIG. 30 is conducted.

In the step D4 shown in FIG. 30, a Ti/Pt/Au film is applied in a predetermined area on an upper main surface of an AlN substrate 12204, to form the conductive film 2218. An Au/Sn film 12220 is applied on part of the conductive film 2218, to form the connection layer 2220. A Ti/Au film 12238 is plated on the entire back main surface of the AlN substrate 12204.

After this, the sapphire substrate 2240 is placed on the AlN substrate 12204 so as that the p-electrode 2216 formed on the sapphire substrate 2240 is in contact with the Au/Sn film 12220 formed on the AlN substrate 12204. Then, while being pressed together, the sapphire substrate 2240 and the AlN substrate 12204 are heated until the Au/Sn film 12220 reaches approximately 300° C. (step E4). Thus, the p-electrode 2216 and the Au/Sn film 12220 are eutectic-bonded together. Since the Au/Sn film 12220 is processed to be the connection layer 2220, the p-electrode 2216 and the conductive film 2218 are physically and electrically connected together.

After the p-electrode 2216 and the conductive film 2218 are bonded together by the connection layer 2220, steps F4 and G4 (shown in FIGS. 30 and 31) are conducted to separate the sapphire substrate 2240 from the multilayer epitaxial structure 2206. The steps F4 and G4 are the same as the steps G2 and H2 (shown in FIG. 17) described in the first modification example of the second embodiment, and therefore not repeatedly explained here.

After the sapphire substrate 2240 is separated and the multilayer epitaxial structure 2206 and the like are transferred from the sapphire substrate 2240 to the AlN substrate 12204 as describe above, a step H4 (shown in FIG. 31) is conducted. In the step H4, a silicon nitride film is formed by high-frequency sputtering or the like for insulation and surface protection, to form the insulating film 2228. Here, the silicon nitride film is formed along a periphery of the upper main surface of the multilayer epitaxial structure 2206 (the n-AlGaN layer 2214), and on the side surfaces of the multilayer epitaxial structure 2206.

After this, anisotropic etching is conducted, using KOH solution or the like, to an area of the upper main surface of the n-AlGaN layer 2214 in which the insulating film 2228 is not formed. Thus, the depressions 2222 are formed (step I4).

Subsequently, a Ti/Pt/Al film is applied in predetermined areas on the resulting surface after the step I4, to form the n-electrode 2226, the bridging wire 2234, the wiring 2236, and the cathode and anode power supply terminals 2230 and 2232 simultaneously (step J4).

After the phosphor film 2208 is formed by screen printing (step K4), a macromolecule film 2242 is adhered to the back main surface of the AlN substrate 12204 as a dicing sheet. Lastly, the AlN substrate 12204 is diced by a dicing blade (DB in FIG. 32) into individual LED array chips 2202 (step L4). Thus, the LED array chip 2202 is manufactured.

According to the third modification example of the second embodiment, the LED array chip 2202 includes the nine LEDs D01 to D9 (light emitting elements), and is a square approximately 1.2 mm on a side. However, the third modification example of the second embodiment is not limited to such. The LED array chip 2202 may include any number of LEDs (light emitting elements).

(Fourth Modification Example of Second Embodiment)

Figure 33:
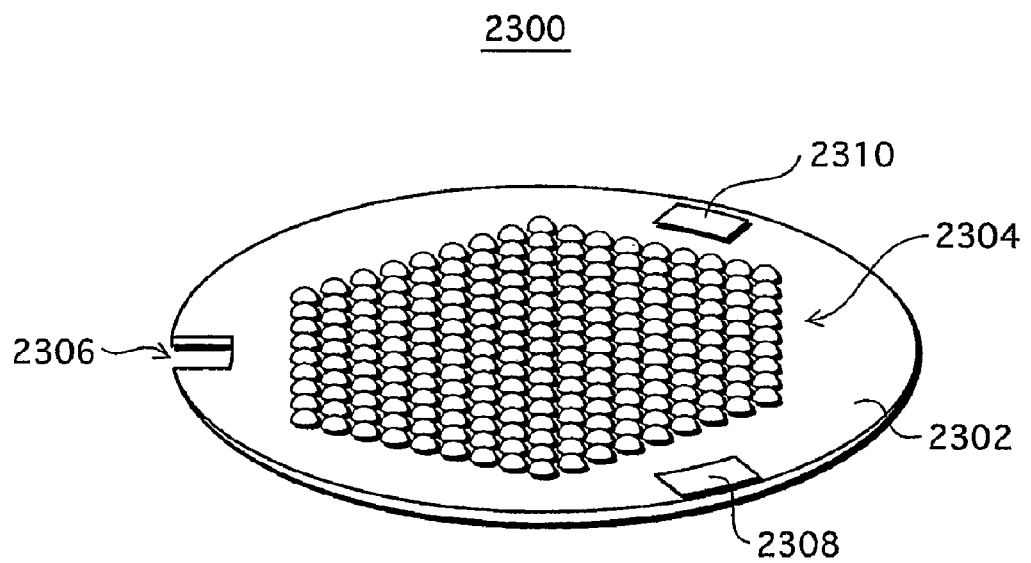
FIG. 33 is a perspective view illustrating a white LED module relating to a fourth modification example of the second embodiment.

FIG. 33 is an external perspective view illustrating a white LED module 2300 including LED chips 2002 relating to the first modification example of the second embodiment (shown in FIG. 14B). This LED module 2300 is attached to a lighting unit 2332 (mentioned later and shown in FIGS. 36A and 36B).

The LED module 2300 includes a ceramics substrate 2302 that is in a shape of a circle having a diameter of 5 cm and is made of AlN and 217 resin lenses 2304. A guiding depression 2306 used to attach the LED module 2300 to the lighting unit 2332 and terminals 2308 and 2310 to receive a power supply from the lighting unit 2332 are provided in the ceramics substrate 2302.

Figure 34A:
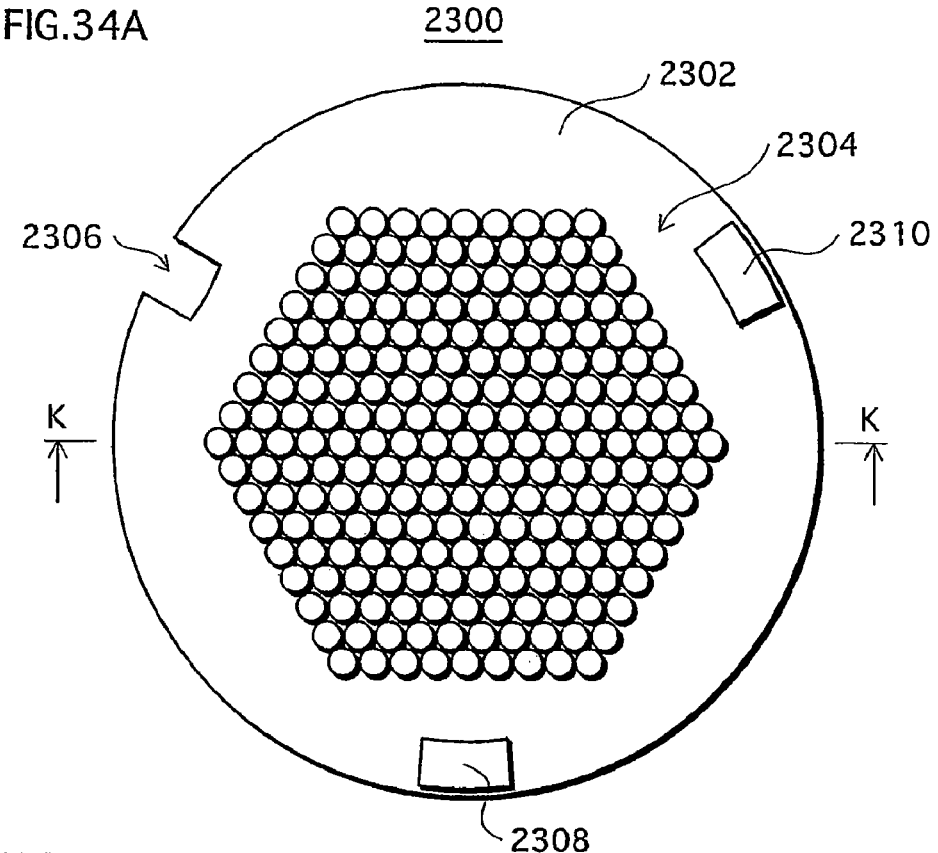
FIG. 34A is a plan view illustrating the white LED module relating to the fourth modification example of the second embodiment.
Figure 34B:
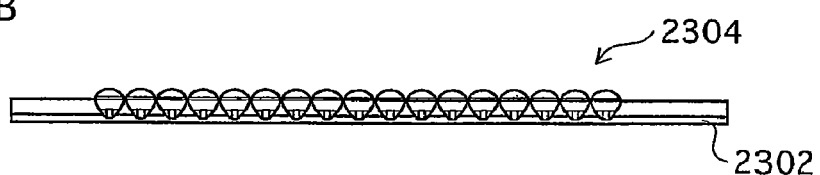
FIG. 34B illustrates a cross-section of the white LED module along a line KK shown in FIG. 34A.
Figure 34C:
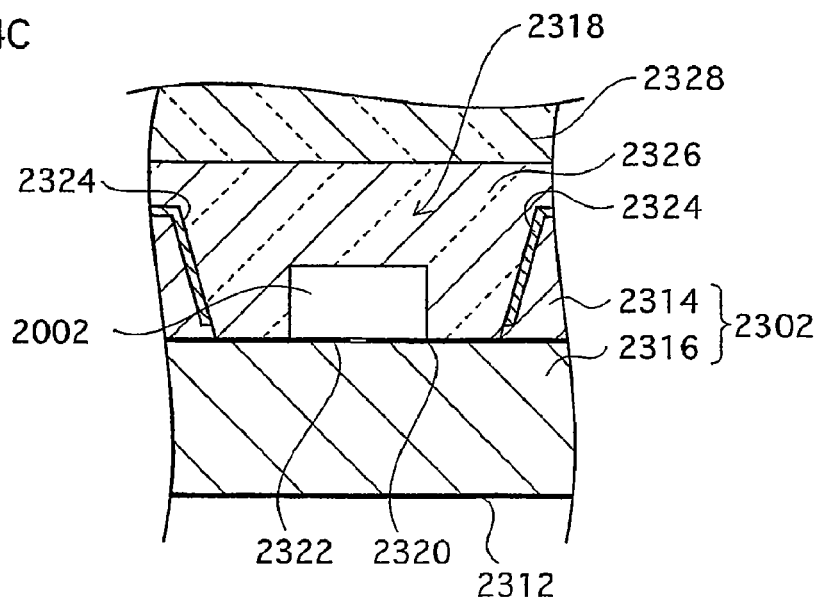
FIG. 34C is an enlargement view illustrating a chip-mounted area shown in FIG. 34B.

FIG. 34A is a plan view illustrating the LED module 2300, FIG. 34B illustrates a cross-section of the LED module 2300 along a line KK shown in FIG. 34A, and FIG. 34C is an enlargement view illustrating a chip mounted area shown in FIG. 34B.

As shown in FIG. 34C, a gold plating 2312 is applied to a back main surface of the ceramics substrate 2302 for improving heat dissipation.

The LED chip 2002 is mounted at a location, on an upper surface of the ceramics substrate 2302, corresponding to a center of each of the lenses 2304 having a shape of a circle as shown in FIG. 34A. In total, 217 LED chips 2002 are mounted on the ceramics substrate 2302.

The ceramics substrate 2302 is constituted by two ceramics substrates 2314 and 2316 each of which is 0.5 mm in thickness and mainly made of AlN. Other than AlN, the ceramics substrate 2314 and 2316 can be made of $Al_2O_3$, BN, MgO, ZnO, SiC or diamond.

The LED chips 2002 are mounted on the lower ceramics substrate 2316. Taper through holes 2318 are provided in the upper ceramics substrate 2314, so as to create spaces for mounting the LED chips 2002.

A cathode pad 2320 and an anode pad 2322 (shown in FIG. 35B) are provided at the location, on an upper surface of the ceramics substrate 2316, where each LED chip 2002 is to be mounted. Each of the cathode pad 2320 and the anode pad 2322 is made up of Au plating applied on copper (Cu). Here, the cathode power supply terminal 2032 and the anode power supply terminal 2030 of the LED chip 2002 (shown in FIG. 14B) are respectively connected to the cathode pad 2320 and the anode pad 2322 on which PbSn solder has been formed.

A step of forming the PbSn solder on the cathode pad 2320 and the anode pad 2322 can be omitted, if AuSn solder is plated beforehand on the cathode power supply terminal 2032 and the anode power supply terminal 2030. After all of the LED chips 2002 are mounted on pairs of the cathode pad 2320 and the anode pad 2322, the ceramics substrate 2302 is heated through a reflow furnace to a temperature equal to a melting point of the solder. Thus, the 217 LED chips 2002 can be simultaneously connected to the ceramics substrate 2302. This reflow soldering process can be conducted if a shape of each of the cathode pad 2320 and the anode pad 2322, an amount of the applied solder, and a shape of the anode power supply terminal 2030 and the cathode power supply terminal 2032 are optimized. Here, a silver paste or a bump may be used instead of the solder.

Before being mounted, the LED chips 2002 have been tested for their optical performance, such as unevenness of color and a color temperature, and have passed the test. According to the fourth modification example of the second embodiment, the LED chip 2002 includes the phosphor film 2008, and can emit white light by itself. As described above, this makes it possible to test the LED chip 2002 for its optical performance before mounting. Consequently, it can be prevented that the LED module 2300 including the LED chips 2002 is rejected due to poor optical performance of the LED chips 2002. Consequently, the ratio of accepted finished products (LED modules 2300) is improved.

An aluminum reflection film 2324 is formed on a wall of each through hole 2318 provided in the upper ceramics substrate 2314 and on an upper surface of the ceramics substrate 2314 as shown in FIG. 34C.

After mounted on the ceramics substrate 2316, the LED chips 2002 are covered by a first resin (e.g. a silicone resin 2326). Subsequently, the lenses 2304 are formed by injection molding with use of a second resin (e.g. an epoxy resin 2328).

The 217 LED chips 2002 are connected in series-parallel by a wiring pattern 2330 (shown in FIG. 35A) formed on the upper main surface of the ceramics substrate 2316.

Figure 35A:
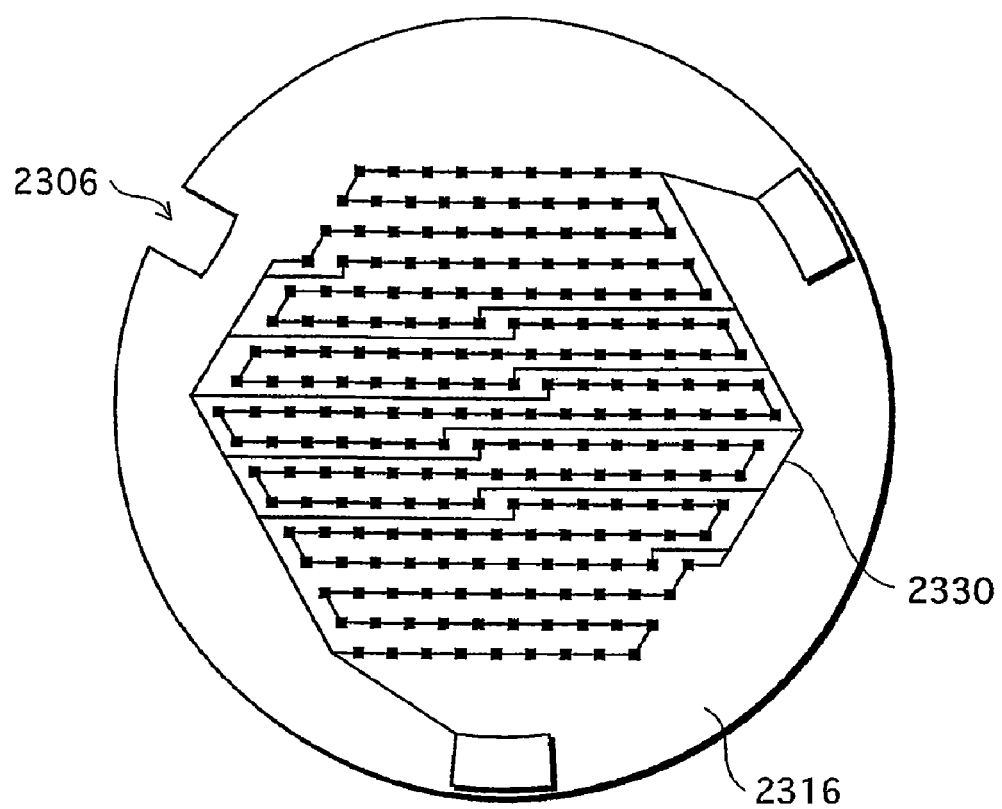
FIG. 35A illustrates a wiring pattern formed in the white LED module relating to the fourth modification example of the second embodiment.
Figure 35B:
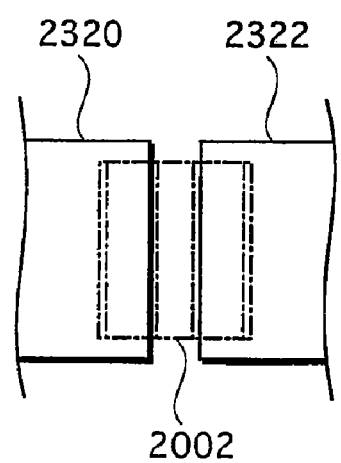
FIG. 35B illustrates a pad pattern formed on a ceramics substrate constituting the white LED module.

FIG. 35A is a plan view illustrating the LED module 2300 after removing the lenses 2304 and the upper ceramics substrate 2314. As describe above, the anode pad 2322 and the cathode pad 2320 (shown in FIG. 35B) are provided at the location, on the upper main surface of the ceramics substrate 2316, where each LED chip 2002 is to be mounted.

The anode pads 2322 and the cathode pads 2320 are connected by the wiring pattern 2330 in such a manner that 31 LED chips 2002 are connected in series and seven groups of the 31 LED chips 2002 are connected in parallel. The wiring pattern 2330 is connected at one end to the positive terminal 2308 (shown in FIG. 34A) by a through hole (not shown in FIG. 35A), and connected at the other end to the negative terminal 2310 (shown in FIG. 34A) by another through hole (not shown in FIG. 35A).

The LED module 2300 described above is attached to the lighting unit 2332. The LED module 2300 and the lighting unit 2332 constitute a lighting apparatus 2334.

Figure 36A:
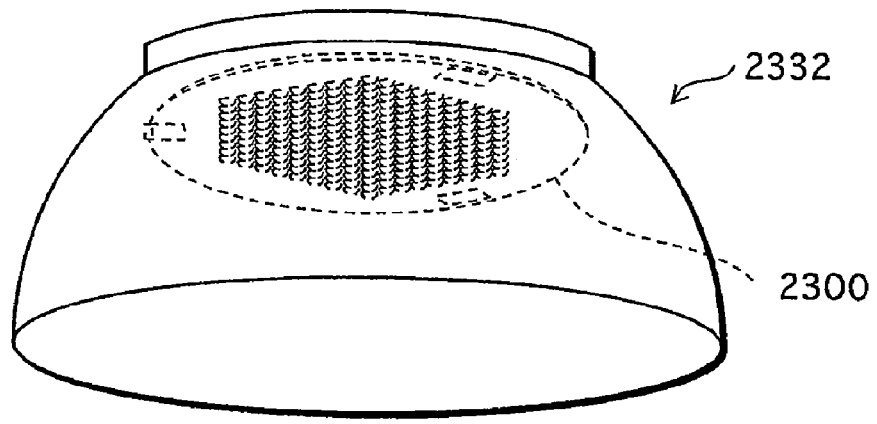
FIG. 36A is a perspective view illustrating a lighting apparatus relating to the fourth modification example of the second embodiment.
Figure 36B:
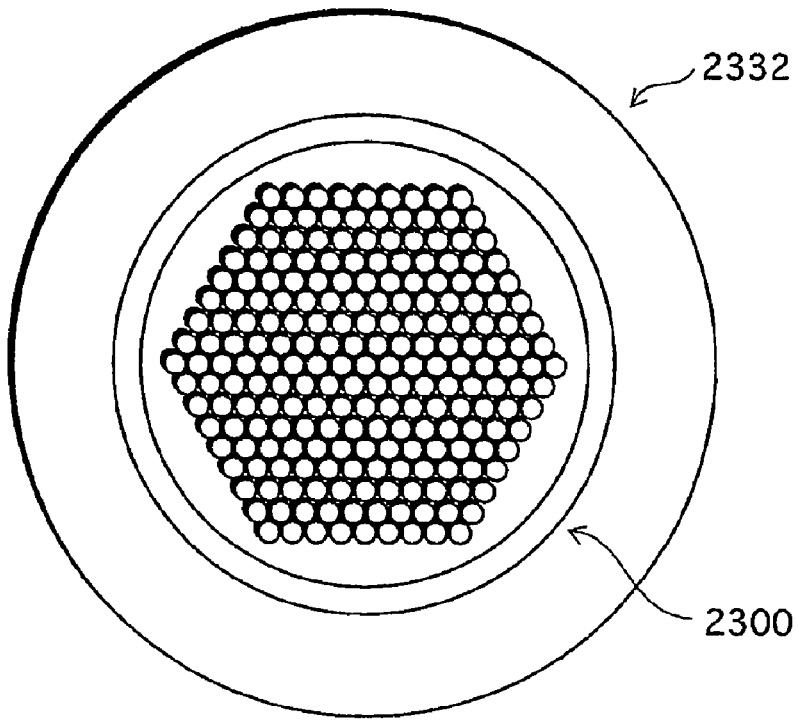
FIG. 36B is a bottom plan view illustrating the lighting apparatus.

FIG. 36A is a schematic perspective view illustrating the lighting apparatus 2334, and FIG. 34B is a bottom plan view illustrating the lighting apparatus 2334.

The lighting unit 2332 is, for example, fixed on a ceiling of a room. The lighting unit 2332 includes a power supply circuit (not shown in FIGS. 36A and 36B) that converts alternating-current power (e.g. 100 V, 50/60 Hz) supplied from a commercial power source into direct-current power required for driving the LED module 2300.

Figure 37:
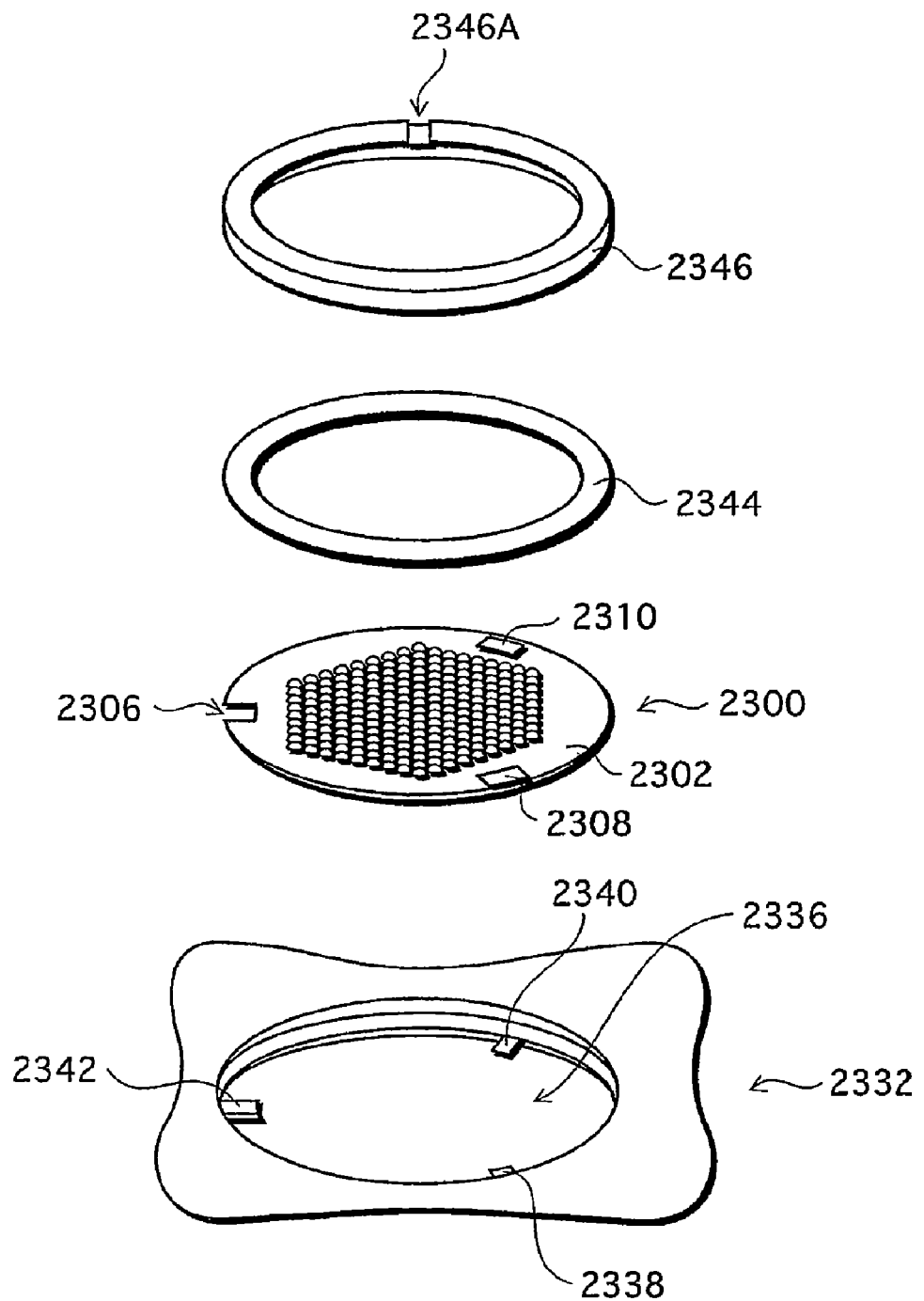
FIG. 37 is a perspective exploded view illustrating the lighting apparatus relating to the fourth modification example of the second embodiment.

The following part describes a construction to attach the LED module 2300 to the lighting unit 2332, with reference to FIG. 37.

The lighting unit 2332 has a circular depression 2336 in which the LED module 2300 is to be fitted. A bottom surface of the circular depression 2336 is flat. An internal thread (not shown in FIG. 37) is created, in the vicinity of an open end of the circular depression 2336, on an inside wall of the circular depression 2336. Flexible power supply terminals 2338 and 2340 and a guiding protrusion 2342 protrude from the inside wall of the circular depression 2336, between the internal thread and the bottom surface of the circular depression 2336. The power supply terminals 2338 and 2340 are respectively positive and negative.

An O-ring 2344 made of silicon rubber and a ring screw 2346 are used to attach the LED module 2300 to the lighting unit 2332. The ring screw 2346 has a shape of a ring that has a substantially rectangular cross-section. An external thread (not shown in FIG. 37) is created on an outer surface of the ring screw 2346, and a depression 2346A is provided.

The following part describes a procedure of attaching the LED module 2300 to the lighting unit 2332.

To start with, the LED module 2300 is fitted in the circular depression 2336 in the following manner. The ceramics substrate 2302 of the LED module 2300 is positioned between the bottom surface of the circular depression 2336 and the power supply terminals 2338 and 2340. The guiding protrusion 2342 is fitted in the guiding depression 2306, so as to align the positive terminal 2308 and the negative terminal 2310 with the power supply terminal 2338 and the power supply terminal 2340 respectively.

After the LED module 2300 is fitted in the circular depression 2336, the ring screw 2346 to which the O-ring 2344 has been attached is screwed into the circular depression 2336 and fixed. Thus, the positive and negative terminals 2308 and 2310 are respectively connected to the power supply terminals 2338 and 2340, so that the terminals 2308 and 2310 are electrically connected to the terminals 2338 and 2340 reliably. In addition, the substantially entire lower surface of the ceramics substrate 2302 is connected to the flat bottom surface of the circular depression 2336. This enables heat generated in the LED module 2300 to be effectively conducted to the lighting unit 2332, thereby improving a cooling effect of the LED module 2300. Here, silicone grease may be applied to the lower surface of the ceramics substrate 2302 and the bottom surface of the circular depression 2336 to further improve the heat conduction efficiency from the LED module 2300 to the lighting unit 2332.

When power is supplied to this lighting apparatus 2334 from a commercial power source, each LED chip 2002 emits white light in the manner described above. The white light is emitted through the lenses 2304.

Figure 38:
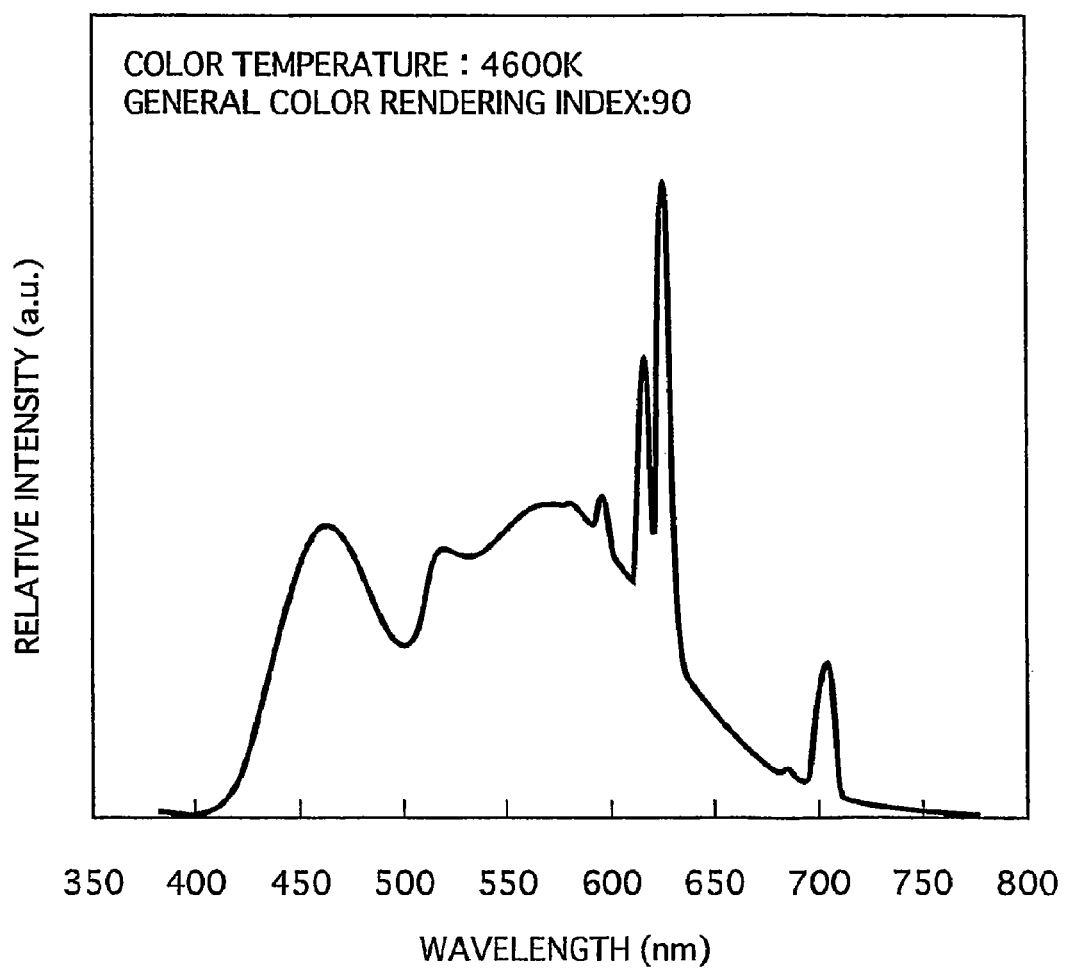
FIG. 38 shows an emission spectrum of the lighting apparatus relating to the fourth modification example of the second embodiment.

When an electric current of 1 A is applied to the LED module 2300, a total luminous flux of 4,000 lm, an on-axis luminous intensity of 10,000 cd, and an emission spectrum shown in FIG. 38 are observed.

In the above description of the second embodiment, the semiconductor light emitting devices relating to the first to third modification examples of the second embodiment are, as an example, used for lighting, such as a lighting module and a lighting apparatus. However, the semiconductor light emitting devices relating to the second embodiment may be also used for display, to be specific, as a light source in a display element. Such a display element includes a surface mounting device (SMD) LED which is formed in such a manner that a semiconductor light emitting device (e.g. an LED chip) is mounted on a ceramics substrate and sealed by a transparent epoxy resin.

For example, a single SMD LED may be used by itself. In this case, an SMD LED is mounted on a remote controller for a home electric appliance including a television, a video cassette recorder and an air conditioner, or used as a main switch lamp of such a home electric appliance. Alternatively, a plurality of SMD LEDs may be combined to be used as dots provided in a dot matrix display device for displaying a letter, a number, a symbol and the like.

The second embodiment of the present invention is not limited to the above modification examples. The second embodiment also includes the following modification examples.

(1) According to the first to third modification examples of the second embodiment, a multilayer epitaxial structure (12006, 12106 and 12206) is formed by epitaxial growth on a sapphire substrate which is a single-crystal substrate (2042, 2140 and 2240). In addition, the multilayer epitaxial structure is divided into individual LED (array) chips (2002, 2102 and 2202) on the sapphire substrate (see step B2 in FIG. 15, step B3 in FIG. 22, and step B4 in FIG. 29). However, the second embodiment is not limited to such. Alternatively, the multilayer epitaxial structure as a whole (12006, 12106 and 12206) may be first transferred to a base substrate (the high-resistive Si substrate 12004 in FIG. 16, the n-type SiC substrate 12104 in FIG. 23 and the AlN substrate 12204 in FIG. 30) which constitutes the LED (array) chip (2002, 2102 and 2202). The multilayer epitaxial structure is then divided into the individual LED (array) chips (2002, 2102 and 2202) on the base substrate.

(Third Embodiment)

Figure 39:
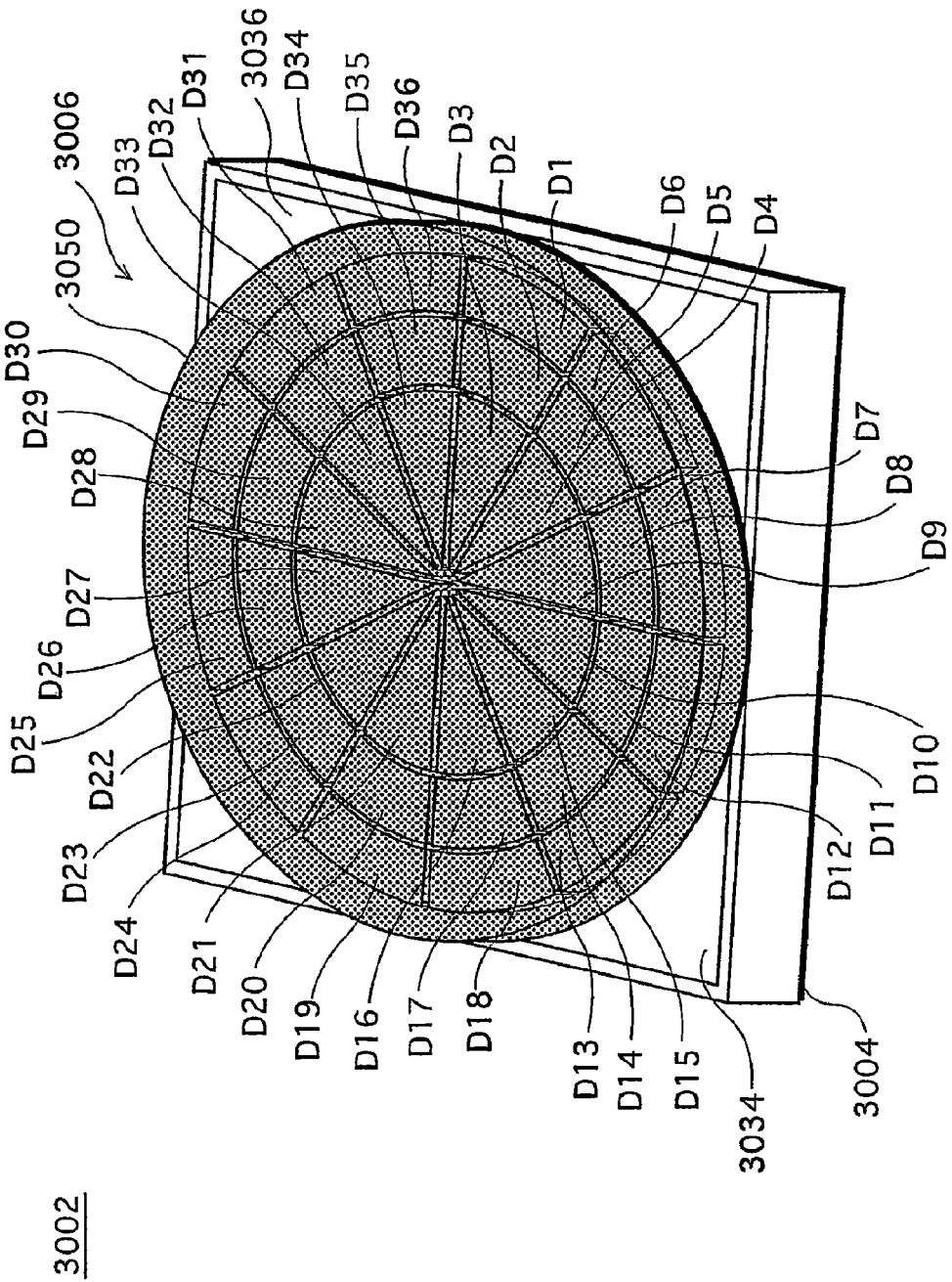
FIG. 39 is a perspective view illustrating an LED array chip relating to a third embodiment.
Figure 40:
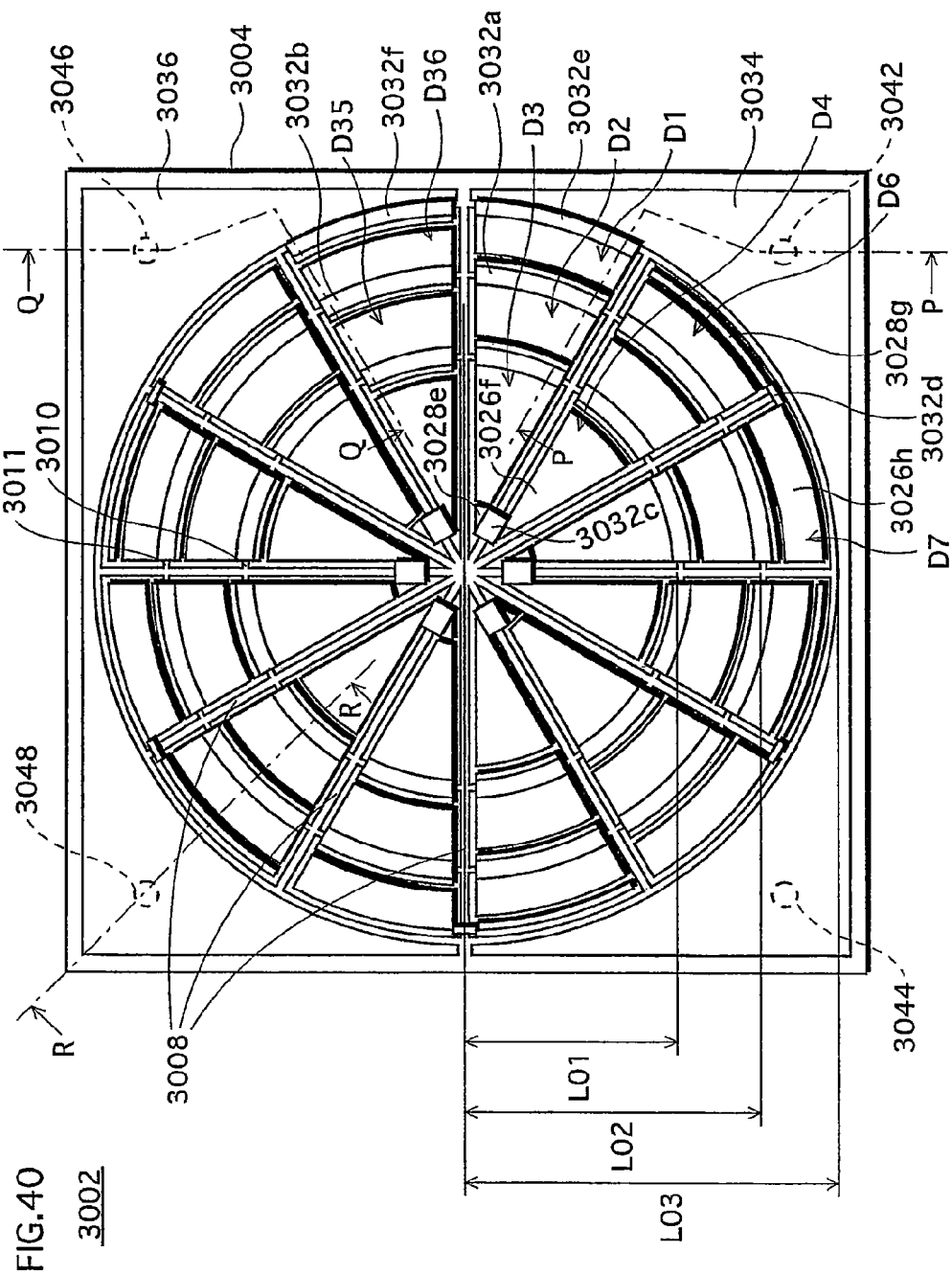
FIG. 40 is a plan view illustrating the LED array chip relating to the third embodiment.

FIG. 39 is an external perspective view illustrating a construction of an LED array chip 3002 which is one type of a semiconductor light emitting device. FIG. 40 is a plan view illustrating the LED array chip 3002. FIG. 39 mainly intends to illustrate how LEDs D1 to D36 (described later) are arranged, and therefore does not show minute depressions and protrusions on the surfaces of the LEDs. FIG. 40 does not show a phosphor film 3050 (shown in FIG. 39 and mentioned later) and depressions formed on a p-electrode (mentioned later).

As shown in FIGS. 39 and 40, the LED array chip 3002 is formed in such a manner that a multilayer epitaxial structure including a light emitting layer is formed on a non-doped (high-resistive) SiC substrate 3004 which is a semiconductor substrate (hereinafter referred to as "an SiC substrate 3004"). Here, the multilayer epitaxial structure is formed like a circular cylinder as a whole. The circular-cylinder-like multilayer epitaxial structure formed on the rectangular (square in the third embodiment) SiC substrate 3004 is hereinafter referred to as a cylinder member 3006. The cylinder member 3006 is divided into a plurality of areas (12 areas in the third embodiment) by division grooves 3008 that radiate equiangularly. Which is to say, the cylinder member 3006 is divided into 12 flabellate members with a central angle of around 30 degrees. Each flabellate member is further divided into a plurality of areas (three areas in the third embodiment) in a diameter direction by two division grooves 3010 and 3011 that are formed concentrically. As a result, the cylinder member 3006 formed by the multilayer epitaxial structure is divided into 36 areas (12×3), and each area constitutes an independent light emitting element, i.e. an LED. The 36 LEDs are respectively identified by reference marks D1 to D36 as shown in FIG. 39 to be distinguished from each other.

The concentrical division grooves 3010 and 3011 are respectively positioned so that a light emitting layer of each of the LEDs D1 to D36 has the substantially same area. This is achieved when the ratio of L01:L02:L03 (lengths L01, L02 and L03 are shown in FIG. 40) is $1:\sqrt{2}:\sqrt{3}$, irrespective of a size (a diameter) of the cylinder member 3006. The SiC substrate 3004 is a square approximately 2 mm on a side, and the cylinder member 3006 has a diameter of approximately 1.8 mm.

The following part describes a construction of each LED in the LED array chip 3002 with reference to cross-sectional views in FIG. 41.

FIG. 41A illustrates a cross-section of LEDs D1 and D2 in the LED array chip 3002 along a line PP shown in FIG. 40, and FIG. 41B illustrates a cross-section of LEDs D35 and D36 along a line QQ shown in FIG. 40. Each of the LEDs D1 to D36 is formed by a multilayer epitaxial structure having the same construction. The following description is made taking the LED D35 as an example.

Each LED is made up of an n-AlGaN buffer layer 3012 (having a thickness of 30 nm), a DBR layer 3014 composed of 30 periods of n-AlGaN/GaN (having a total thickness of 3 μm), an n-GaN clad layer 3016 (having an Si-doping amount of $3\times10^{18}$ cm$^{-3}$ and a thickness of 200 nm), an InGaN/GaN MQW light emitting layer 3018 composed of six periods of InGaN (having a thickness of 2 nm)/GaN (having a thickness of 8 nm), a p-GaN clad layer 3020 (having an Mg-doping amount of $1\times10^{19}$ cm$^{-3}$ and a thickness of 200 nm), a p-GaN contact layer 3022 (having an Mg-doping amount of $3\times10^{19}$ cm$^{-3}$ and a thickness of 200 nm), and an n$^+$-GaN regrowth layer 3024 (having an Si-doping amount of $1\times10^{19}$ cm$^{-3}$ and a thickness of 100 nm). These layers 3012, 3014, 3016, 3018, 3020, 3022 and 3024 are formed on the SiC substrate 3004 in the stated order. Which is to say, a light emitting layer (the MQW light emitting layer 3018) is sandwiched between a conductive layer (the n-GaN clad layer 3016 on a side of the SiC substrate 3004) and a conductive layer (the p-GaN clad layer 3020, the p-GaN contact layer 3022 and the n$^+$-GaN regrowth layer 3024 on a side of a light extraction surface) in each of the LEDs D1 to D36 relating to the third embodiment.

An Ni/Au p-electrode 3026 is formed on the n$^+$-GaN regrowth layer 3024 and the p-GaN contact layer 3022. A Ti/Au n-electrode 3028 is formed on the n-GaN clad layer 3016.

When power is supplied to this LED through the p-electrode 3026 and the n-electrode 3028, the light emitting layer 3018 emits blue light having a wavelength of 460 nm.

Depressions are formed at a predetermined interval on an upper surface of the p-electrode 3026, which is a light extraction surface, in order to improve light extraction efficiency. The depressions are provided by forming the n$^+$-GaN regrowth layer 3024 partially on the p-GaN contact layer 3022 in a manner described later.

It should be noted that each of the semiconductor layers 3012, 3014, 3016, 3018, 3020, 3022 and 3024 making up the multilayer epitaxial structure that emits blue light may have a different composition. Each layer may be made of a III-V nitride semiconductor which is generally represented by a chemical formula of $B_zAl_xGa_{1-x-y-z}In_yN_{1-v-w}As_vP_w$, where $0 \leq x \leq 1$, $0 \leq y \leq 1$, $0 \leq z \leq 1$, $0 \leq x+y+z \leq 1$, $0 \leq v \leq 1$, $0 \leq w \leq 1$, $0 \leq v+w \leq 1$ (generally represented as BAlGaInNAsP and hereinafter referred to as a GaN semiconductor material). It is known that the GaN semiconductor material can emit light having a wavelength within a wide range of 200 nm (ultraviolet light) and 1700 nm (infrared light) depending on its composition. In recent years, the GaN semiconductor material has been commonly used to produce light having a shorter wavelength than blue-green light.

The 36 LEDs D1 to D36 described above are connected in series on the SiC substrate 3004. The following part describes how the LEDs D1 to D36 are connected to each other.

Figure 42A:
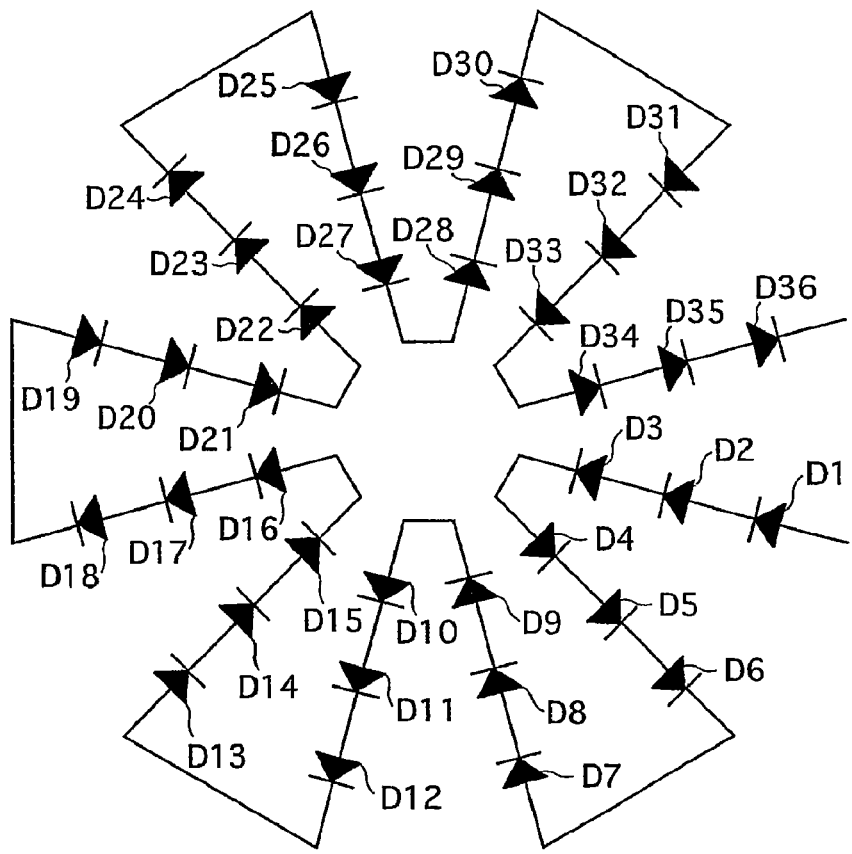
FIG. 42A illustrates how LEDs are connected in the LED array chip relating to the third embodiment.

As shown in FIGS. 41A and 41B, an $Si_3N_4$ insulating film 3030 is formed so as to cover side surfaces of the LEDs D1, D2, D35 and D36 and the division groove 3011. On the insulating film 3030, a wiring 3032a, which is formed by a Ti/Pt/Au metal thin film, is provided to connect an n-electrode 3028a of the LED D1 and a p-electrode 3026B of the LED D2. Likewise, a wiring 3032b is formed on the insulating film 3030 to connect an n-electrode 3028c of the LED D35 and a p-electrode 3026d of the LED D36. In the same manner, the LEDs D2 to D35 are connected by a wiring 3022. As shown in FIG. 40, for example, an n-electrode 3028e of the LED D3 and a p-electrode 3026f of the LED D4 are connected by a wiring 3032C. An n-electrode 3028g of the LED D6 and a p-electrode 3026h of the LED D7 are connected by a wiring 3032d. Thus, all of the LEDs D1 to D36 are connected in series as shown in FIG. 42A.

Out of the 36 LEDs that are connected in series in the LED array chip 3002, the LED D1 is an LED on a higher potential end. Therefore, a p-electrode 3026a of the LED D1 is an anode electrode of the LED array chip 3002. The LED D36 is an LED on a lower potential end. Therefore, an n-electrode 3028d of the LED D36 is a cathode electrode of the LED array chip 3002.

As shown in FIG. 40, Ti/Pt/Au conductive patterns 3034 and 3036 are formed, so as to surround the multilayer epitaxial structure, on a front main surface, of the SiC substrate 3004, on which the multilayer epitaxial structure is formed. The conductive pattern 3034 is connected to the p-electrode of the LED D1 by a wiring 3032e, and the conductive pattern 3036 is connected to the n-electrode 3028d of the LED D36 by a wiring 3032f.

Figure 42B:
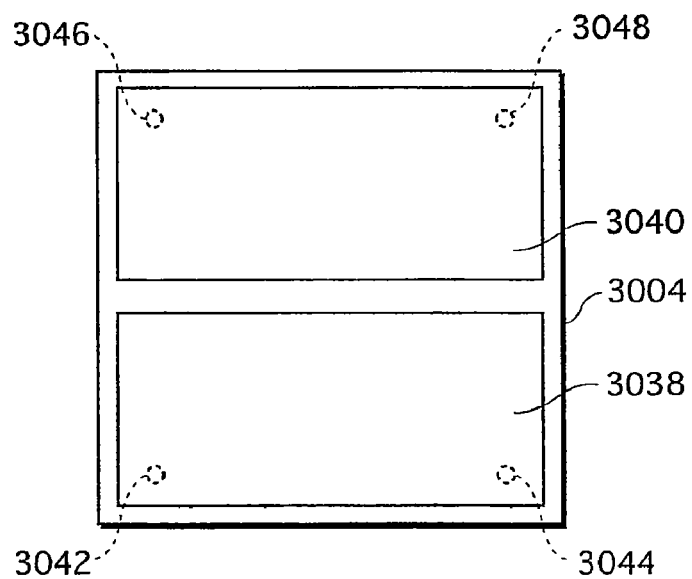
FIG. 42B is a bottom plan view illustrating the LED array chip relating to the third embodiment.

FIG. 42B illustrates a back main surface of the LED array chip 3002. As shown in FIG. 42B, two Ti/Pt/Au power supply terminals 3038 and 3040 are formed on a main surface of the SiC substrate 3004 which is opposite to the front main surface on which the LEDs D1 to D36 are formed.

The power supply terminal 3038 is connected to the conductive pattern 3034 by two through holes 3042 and 3044 provided in the SiC substrate 3004. Similarly, the power supply terminal 3040 is connected to the conductive pattern 3036 by two through holes 3046 and 3048 provided in the SiC substrate 3004. Thus, the power supply terminal 3038 is electrically connected to the p-electrode 3026a of the LED D1, and the power supply terminal 3040 is electrically connected to the n-electrode 3028d of the LED D36. The through holes 3042, 3044, 3046 and 3048 are each formed by filling a hole having a diameter of 30 μm provided in the SiC substrate 3004 with Pt. When an electric current of 50 mA is applied to the 36 LEDs that are connected in series through the power supply terminals 3038 and 3040 with heat dissipation being ensured, an operation voltage of 120 V is observed.

Furthermore, each of the LEDs D1 to D36 can produce an even amount of light. This is because the light emitting layer 3018 in each of the LEDs D1 to D36 has substantially the same area, and an electric density of each LED is therefore substantially the same. As a result, unevenness of illuminance on a surface to which light from the LED array chip 3002 is irradiated can be prevented.

The phosphor film 3050 is formed on the front main surface of the SiC substrate 3004 so as to cover an upper surface and a side surface of the cylinder member 3006 (the multilayer epitaxial structure). The phosphor film 3050 is made of a light-transmitting resin such as silicone in which particles of a yellow phosphor $(Sr, Ba)_2SiO_4:Eu^{2+}$ and fine particles of $SiO_2$ are dispersed. The phosphor film 3050 is applied at a substantially even thickness of approximately 50 μm on and around the cylinder member 3006. Here, the light-transmitting resin may be an epoxy resin or a polyimide resin instead of silicone.

The light emitting layer 3018 of each of the LEDs D1 to D36 emits blue light, and the phosphor within the phosphor film 3050 converts part of the blue light into yellow light. The blue light and the yellow light mix together, to generate white light.

In the LED array chip 3002, the multilayer epitaxial structure including a light emitting layer is formed like a circular cylinder, and the phosphor film 3050 is applied on and around the multilayer epitaxial structure, at a substantially even thickness. Which is to say, the phosphor film 3050 is formed like a circular-cylindrical case with bottoms. Thus, a spot shape of light emitted from the LED array chip 3002 is substantially circular. With this feature, the LED array chip 3002 is suitable as a light source for lighting. In addition, the DBR layer 3014, which is a light-reflective layer, is formed between the light emitting layer 3018 and the SiC substrate 3004. The DBR layer 3014 reflects, towards a light extraction surface, 99% or more of blue light emitted from the light emitting layer 3018 towards the SiC substrate 3004. This improves light extraction efficiency of each LED in the LED array chip 3002. The phosphor film 3050 covers, at the same thickness, not only the upper surfaces of the outmost LEDs D1, D6, D7, D12, D15, D18, D19, D24, D25, D30, D31 and D36 but also outer side surfaces of these outmost LEDs. Accordingly, the phosphor film 3050 converts, into yellow light, not only blue light emitted from the upper surface of each of these LEDs but also blue light emitted from the side surface of the light emitting layer 3018 of each of these LEDs. Thus, unevenness of color can be reduced. In this description, blue light indicates light having a wavelength from 400 nm inclusive to 500 nm exclusive, and yellow light indicates light having a wavelength from 550 nm inclusive to 600 nm exclusive. According to the above description, the LEDs D1 to D36 each emit light with a peak emission wavelength of 460 nm. However, the LEDs D1 to D36 may be configured to emit light with a different peak emission wavelength within the above-mentioned range.

It is generally accepted that unevenness of color occurs only in a white LED that uses visible light having a spectral component of a wavelength within a range of 380 nm and 780 nm (purple to red) for an excitation light source. In other words, unevenness of color does not occur in a white LED having near-ultraviolet light as an excitation light source. However, ultraviolet light with a peak emission wavelength of 370 nm also has a spectral component of a wavelength no less than 380 nm (visible light). Therefore, a white LED using near-ultraviolet light as an excitation light source can have a problem of unevenness of color, depending on a ratio of spectral components of a wavelength no less than 380 nm. Accordingly, the third embodiment is applicable to an LED having a light emitting layer that emits near-ultraviolet light to achieve the same effects of reducing unevenness of color for the same reasons stated above. Which is to say, the third embodiment of the present invention is applicable to an LED including a light emitting layer that emits light including a spectral component of a wavelength at least within a range of 380 nm and 780 nm to reduce unevenness of color. The application of the third embodiment is not limited to an LED including a light emitting layer that emits blue light having a peak emission wavelength of 460 nm as describe above.

The following part describes a manufacturing method for the LED array chip 3002 described above.

The manufacturing method of the LED array chip 3002 includes a variety of processes. The following part first describes a process of forming the cylinder member 3006 (shown in FIG. 39), with reference to FIGS. 43 to 47.

Figure 43A:
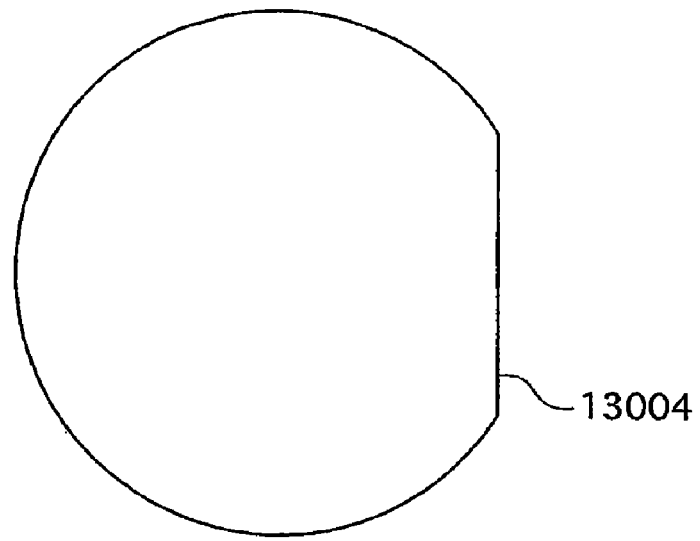
FIG. 43 is used to describe a manufacturing method of the LED array chip relating to the third embodiment.

To start with, a multilayer epitaxial structure is formed on an upper main surface of a non-doped SiC substrate 13004 shown in FIG. 43A (hereinafter simply referred to as "a substrate 13004").

Figure 43B:
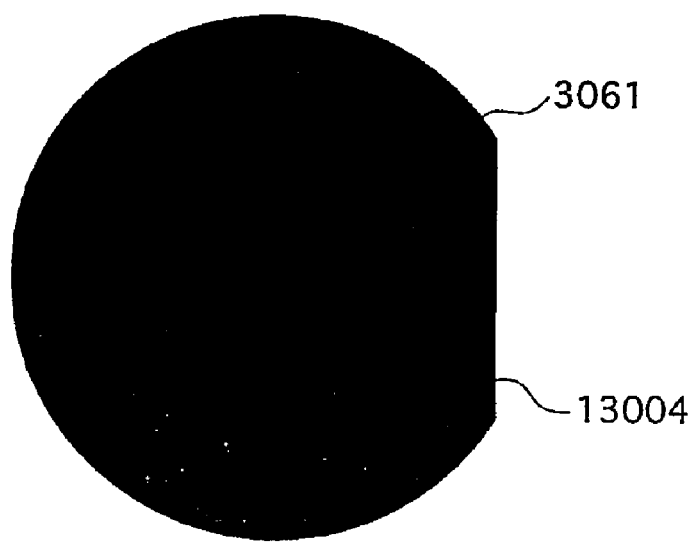

After this, an etching resist (a positive resist) is applied on the entire upper main surface, of the substrate 13004, on which the multilayer epitaxial structure is formed, and the etching resist is then heated to be cured. Thus, a resist film 3061 is formed as shown in FIG. 43B.

Figure 44:
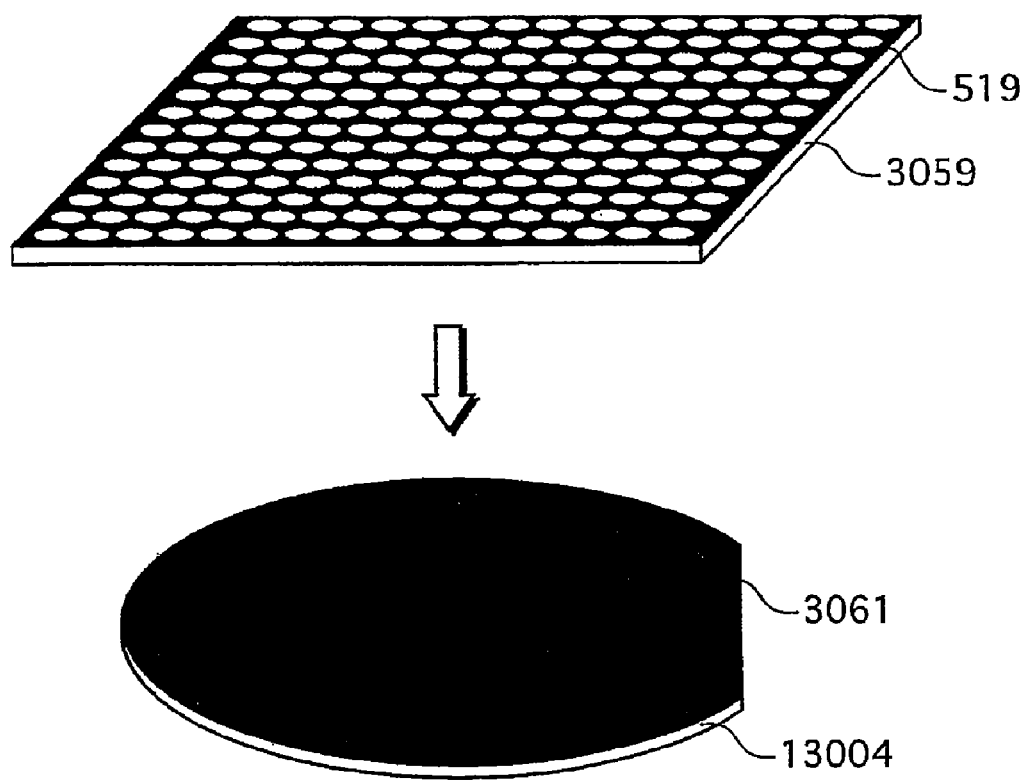
FIG. 44 is used to describe the manufacturing method of the LED array chip relating to the third embodiment.
Figure 45A:
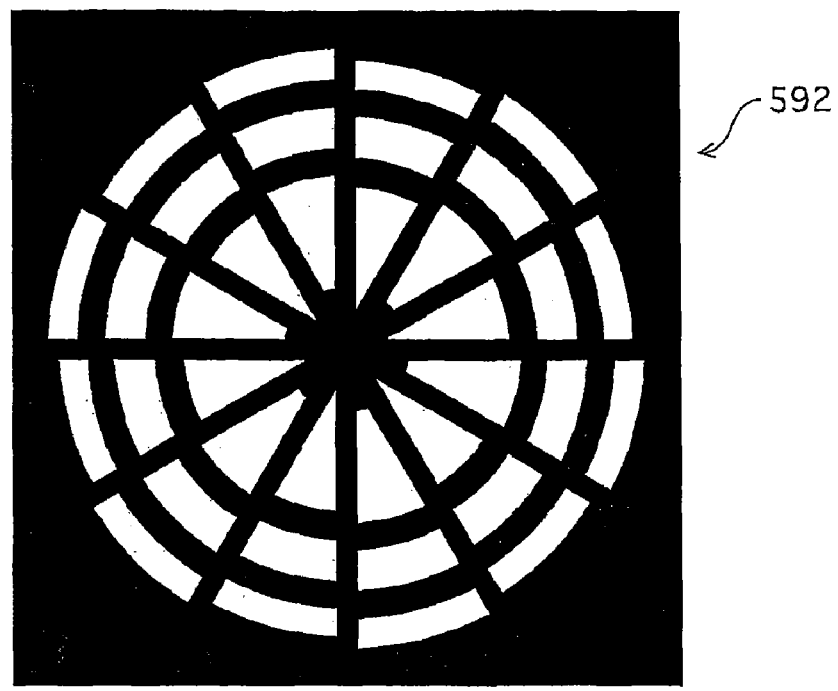
FIG. 45 is used to describe the manufacturing method of the LED array chip relating to the third embodiment.
Figure 46A:
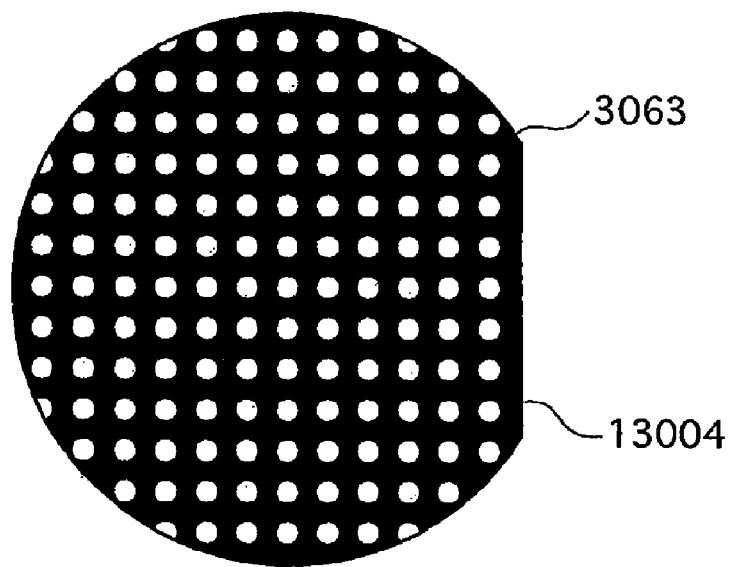
FIG. 46 is used to describe the manufacturing method of the LED array chip relating to the third embodiment.

After this, a photomask 3059 is placed on the substrate 13004 as shown in FIG. 44. The photomask 3059 is formed by printing a pattern 519 in black on a glass plate. The pattern 519 is formed in such a manner that a plurality of patterns 592 shown in FIG. 45A are closely arranged in a matrix. The resist film 3061 is exposed using a mercury lamp while the photomask 3059 is placed on the substrate 13004. Thus, areas of the resist film 3061 which correspond to not-printed transparent portions (white portions shown in FIG. 45A) of the photomask 3059 are softened. The softened areas of the resist film 3061 are dissolved by an organic solvent, to be removed. Thus, a resist mask 3063 shown in FIG. 46A is formed.

Figure 46B:
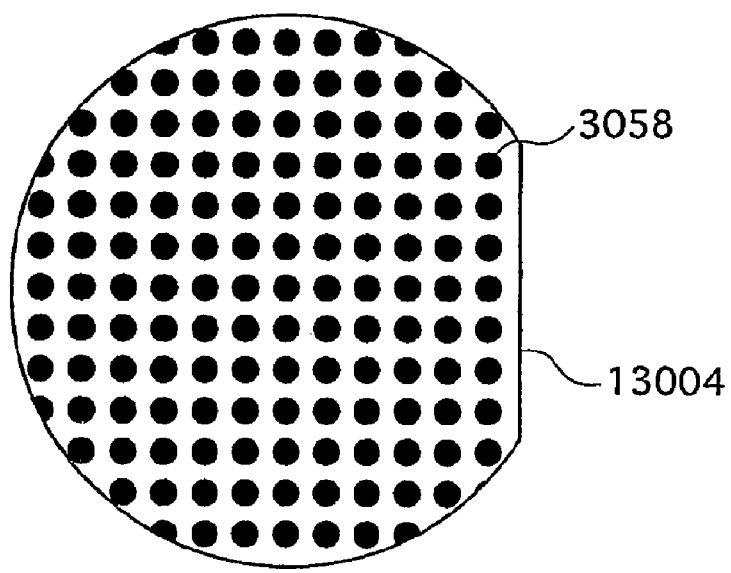

After the resist mask 3063 is formed, an Au film is formed on the entire upper main surface of the substrate 13004 by deposition. Subsequently, a portion of the Au film which is formed on the resist mask 3063 is removed together with the resist mask 3063 by an organic solvent that can dissolve the cured resist mask 3063. Thus, as shown in FIG. 46B, metal masks 3058 are formed at locations of white circles shown in FIG. 46A. Each metal mask 3058 masks an area in which the cylinder member 3006 is to be formed. In more detail, each metal mask 3058 masks the white portions shown in FIG. 45A. An unmasked area of the multilayer epitaxial structure formed on the substrate 13004 is removed by dry etching to such a depth that the n-GaN clad layer 3016 (shown in FIG. 41B) is exposed. The dry etching is conducted by leaving the substrate 13004 within a gas including chlorine ions for a predetermined time. Thus, cylinder members each having a substantially half height of the cylinder member 3006 (hereinafter referred to as half cylinder members 600 shown in FIGS. 47A and 47B) are formed. After the dry etching is completed, the metal masks 3058 are removed by an iodine solvent.

Figure 47A:
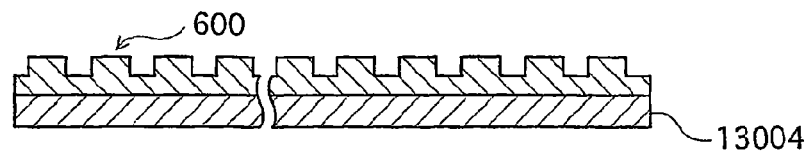
FIG. 47 is used to describe the manufacturing method of the LED array chip relating to the third embodiment.
Figure 47B:
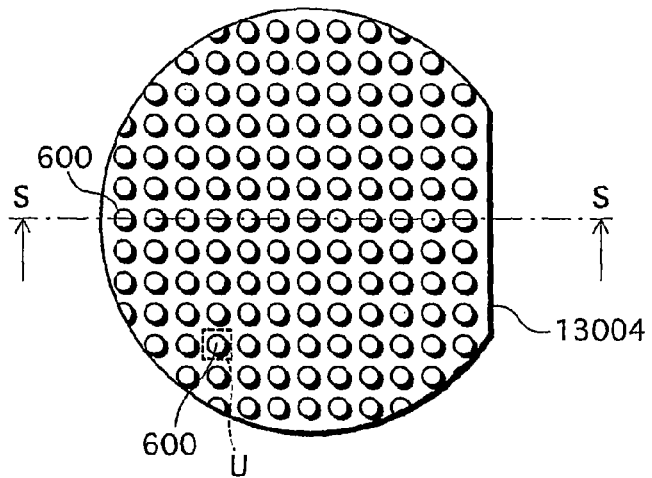
Figure 47C:
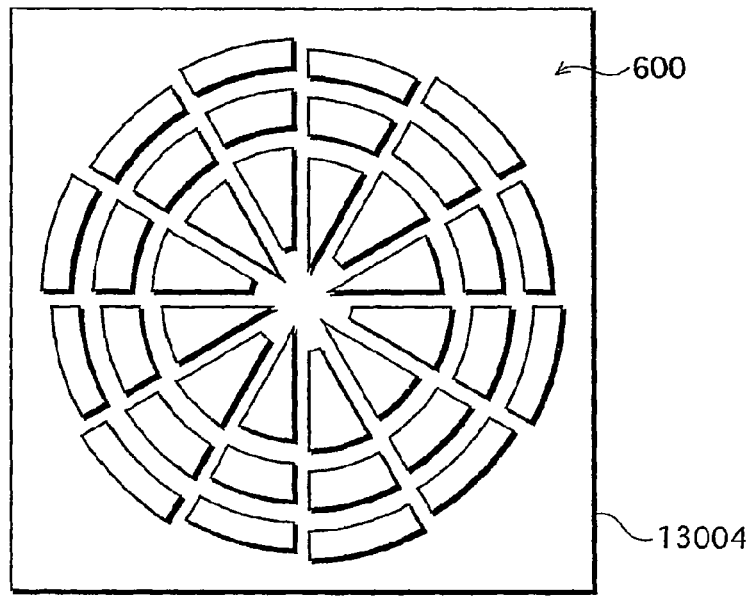

By the above-described etching step (hereinafter referred to as "a first etching step"), the half cylinder members 600 are formed as shown in FIGS. 47A and 47B. FIG. 47A illustrates part of a cross-section along a line SS shown in FIG. 47B, and FIG. 47C is an enlargement view illustrating a portion U shown in FIG. 47B.

After the first etching step, a second etching step is conducted to remove portions of the multilayer epitaxial structure which do not constitute the half cylinder members 600. Thus, cylinder members 3006 (shown in FIG. 39) are formed on the substrate 13004. The reason for conducting the first and second etching steps to form the cylinder members 3006 is explained later. The second etching step is the same as the first etching step except for that the photomask 3059 (shown in FIG. 44) has a different pattern. Accordingly, the second etching step is not repeatedly described in detail here, and only briefly mentioned in the following description of the manufacturing method of the LED array chip 3002. The following description is made with a particular focus on each one of the LED array chips 3002 on the substrate 13004.

The following part describes how each one of the LED array chips 3002 is manufactured on the substrate 13004, with reference to FIGS. 48 to 51.

In FIGS. 48 to 51, a material to form each constituent of the LED array chip 3002 is identified by a five-digit number whose first digit is one. The last four digits of the five-digit number represents a reference numeral identifying the corresponding constituent of the LED array chip 3002. FIGS. 48 to 51 each illustrate a cross-section along a line RR shown in FIG. 40.

Firstly, as shown in FIG. 48, an n-AlGaN buffer layer 13012, a DBR layer 13014 composed of 30 periods of n-AlGaN/GaN, an n-GaN clad layer 13016, an InGaN/GaN MQW light emitting layer 13018, a p-GaN clad layer 13020, and a p-GaN contact layer 13022 are formed on the non-doped SiC substrate 13004 in the stated order using a MOCVD method (step A5). Here, the non-doped SiC substrate 13004 has a diameter of two inches and a thickness of 300 μm.

After this, an SiO$_2$ film 3054 is formed on the p-GaN contact layer 13022, and a photoresist layer is then formed on the SiO$_2$ film 3054 in the following manner. A parallel-line pattern in which lines are arranged at a predetermined interval (e.g. 1200 lines/mm) is formed by interferometric exposure using a He—Cd laser beam. This is conducted three times, and any two of the three parallel-line patterns intersect with each other at an angle of 120 degrees. Thus, a resist mask 3056 is formed (step B5).

A portion of the SiO$_2$ film 3054 which is not masked by the resist mask 3056 is removed by etching (step C5). Then, the resist mask 3056 is removed (step D5).

After this, an n$^+$-GaN layer 13024 is regrown using a MOCVD method (step E5). Here, a portion of the n$^+$-GaN layer 13024 formed on the SiO$_2$ film 3054 is not shown in the step E5 shown in FIG. 49.

The portion of the n$^+$-GaN layer 13024 formed on the SiO$_2$ film 3054 is then removed together with the SiO$_2$ film 3054 (step F5).

The next step G5 is the first etching step described above. The step G5 is conducted to create a surface to connect the n-electrode 3028 (shown in FIG. 41). Firstly, the Au metal mask 3058 is formed in the above-described manner.

The metal mask 3058 masks an area in which the p-electrode 3026 of each LED is to be formed. An unmasked area of a lamination composed of the layers 13012 to 13024 is removed by dry etching to a depth of an approximately half of the thickness of the n-GaN clad layer 13016 (step G5). Thus, a surface 3060 to connect the n-electrode 3028 is created. The metal mask 3058 is removed prior to the next step H5.

The step H5 is the second etching step mentioned above, and conducted to create a surface to form the conductive patterns 3034 and 3036, and the division grooves 3008, 3010 and 3011. To be specific, a metal mask 3062 is formed so as to mask the resulting surface after the step G5 except for areas in which the conductive patterns 3034 and 3036 and the division grooves 3008, 3010 and 3011 are to be formed. As mentioned above, this metal mask 3062 formation step (step H5) is the same as the first etching step (the step G5) except for that the photomask 3059 (shown in FIG. 44) which is used for exposure of the resist film 3061 has a different pattern.

Figure 45B:
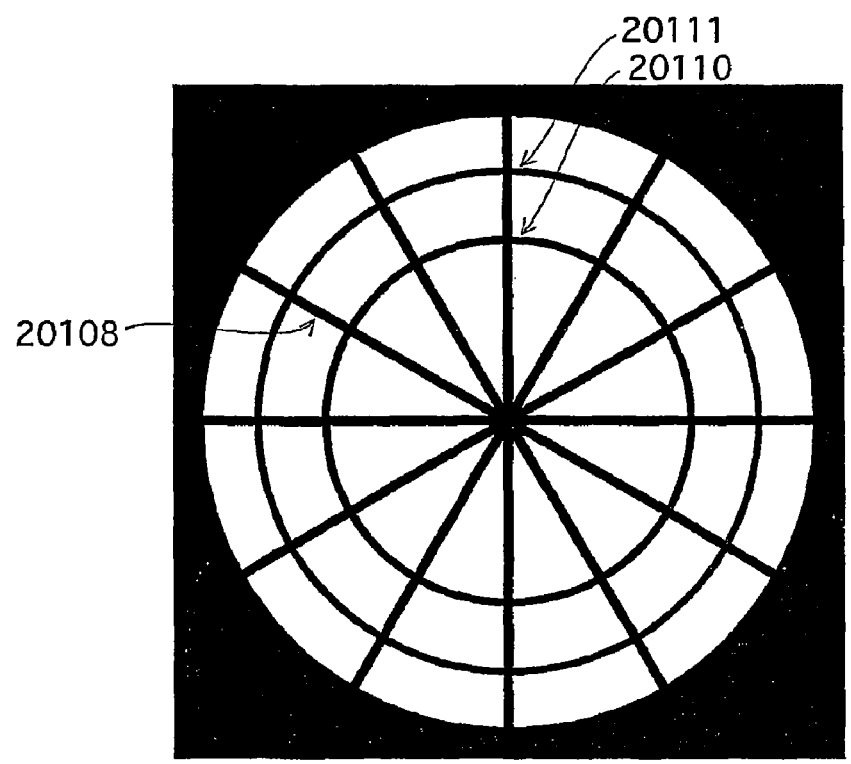

FIG. 45B illustrates a pattern used in the metal mask 3062 formation step. Regarding FIG. 45B, 12 radiating bold lines 20108 correspond to areas in which the division grooves 3008 (see FIG. 40) are to be formed. Two bold concentric circles 20110 and 20111 respectively correspond to areas in which the division grooves 3010 and 3011 (see FIG. 40) are to be formed. A black area surrounding a white area formed like a circle corresponds to an area in which a surface to form the conductive patterns 3034 and 3036 is to be created. Which is to say, the metal mask 3062 is formed so as to mask areas which correspond to constituents of the cylinder member 3006.

Unmasked areas of a lamination composed of the rest of the layer 13016 and the layers 13014 and 13012 are removed by dry etching to such a depth that the substrate 13004 is exposed, to create the conductive pattern formation surface 3064 and the division groove 3011 (3008 and 3010). At the same time, the cylinder member 3006 (see FIG. 39) is formed (step H5). After the dry etching, the metal mask 3062 is removed prior to the next step. As seen from the above description of the steps G5 and H5, the cylinder member 3006 is formed by conducting two different etching steps to create the surface to form the n-electrode 3028, which is positioned on the n-GaN clad layer 3016.

Subsequent to the step H5, an $Si_3N_4$ insulating film 13030 is formed by sputtering or the like for insulation and surface protection (step I5).

A mask 3066 is then formed so as to mask the $Si_3N_4$ film 13030 except for an area in which the p-electrode 3026 is to be formed. An unmasked area of the $Si_3N_4$ film 13030 is removed by etching. After this, an Ni/Au thin film 13026 is applied by deposition. Thus, the Ni/Au p-electrode 3026 is formed (step J5). A portion of the Ni/Au thin film 13026 formed on the mask 3066 (not shown in FIG. 50) is removed together with the mask 3066 prior to the next step. Here, the p-electrode 3026 may be formed by an ITO transparent thin film, instead of the Ni/Au thin film.

The same procedure as in the step J5 is conducted to form the n-electrode 3028. Specifically speaking, a mask 3068 is formed so as to mask the resulting surface after the step J5, except for an area in which the n-electrode 3028 is to be formed. An unmasked area of the $Si_3N_4$ film 13030 is removed by etching, and then a Ti/Au thin metal film 13028 is formed by deposition. Thus, the n-electrode 3028 is formed (step K5). A portion of the Ti/Au film 13028 formed on the mask 3068 (not shown in FIG. 50) is removed together with the mask 3068 prior to the next step.

After this, a mask 3070 is formed so as to mask the resulting surface after the step K5 except for an area in which each of the through holes 3042, 3044, 3046 and 3048 is to be formed. An unmasked area is removed by etching, to form an opening 3072 that is 200 μm in depth. Then, the opening 3072 is filled with Pt by electroless deposition or the like (step L5). The mask 3070 is removed prior to the next step.

Subsequently, a mask 3074 is formed so as to mask the resulting surface after the step L5, except for areas in which the conductive patterns 3034 and 3036 and the wiring 3032 are to be formed. Then, a Ti/Pt/Au thin metal film is formed by deposition. Thus, the Ti/Pt/Au conductive patterns 3034 and 3036 and the Ti/Pt/Au wiring 3032 are formed (step M5). A portion of the Ti/Pt/Au film which is formed on the mask 3074 (not shown in FIG. 51) is removed together with the mask 3074 prior to the next step.

After this, a lower main surface of the SiC substrate 13004 is polished, so that the thickness of the SiC substrate 13004 becomes 150 μm and the through holes 3042, 3044, 3046 and 3048 are exposed on the lower main surface of the SiC substrate 13004 (step N5).

Subsequently, a mask 3076 is formed so as to mask the lower main surface of the SiC substrate 13004 except for areas in which the power supply terminals 3038 and 3040 are to be formed. Then, a Ti/Pt/Au thin metal film is formed on the lower main surface of the SiC substrate 13004 by deposition. Thus, the Ti/Pt/Au power supply terminals 3038 and 3040 are formed (step O5). A portion of the Ti/Pt/Au film which is formed on the mask 3076 (not shown in FIG. 51) is removed together with the mask 3076 prior to the next step.

After this, the phosphor film 3050 is formed in the following manner. A silicone resin in which particles of a yellow phosphor $(Sr, Ba)_2SiO_4:Eu^{+2}$ and fine particles of $SiO_2$ are dispersed is applied by printing, and then heated to be cured. After being cured, the phosphor film 3050 is polished so that a thickness of the phosphor film 3050 in a direction perpendicular to the upper main surface of the SiC substrate 13004 becomes 50 μm (step P5). Here, a color temperature of white light emitted from the LED array chip 3002 is determined by a ratio between a quantity of blue light from the light emitting layer 3018 and that of yellow light from the phosphor film 3050. The ratio is adjusted by a percentage of the phosphor particles in the silicone resin and the thickness of the phosphor film 3050. To be specific, when the percentage of the phosphor particles is higher or the thickness of the phosphor film 3050 is larger, the ratio of the yellow light is higher. Here, a high ratio of the yellow light means that the white light has a lower color temperature. As described above, the phosphor film 3050 is formed in such a manner that the silicone resin including the phosphor is first applied at a thickness larger than a designed thickness, and then polished to have the designed thickness. This enables the phosphor film 3050 to be formed at an even thickness and to have the designed thickness. As a result, unevenness of color can be reduced, and a desired color temperature can be exactly achieved.

Lastly, the substrate 13004 is divided into individual LED array chips 3002 by dicing. In this way, the LED array chip 3002 (shown in FIG. 39) is manufactured.

Figure 52:
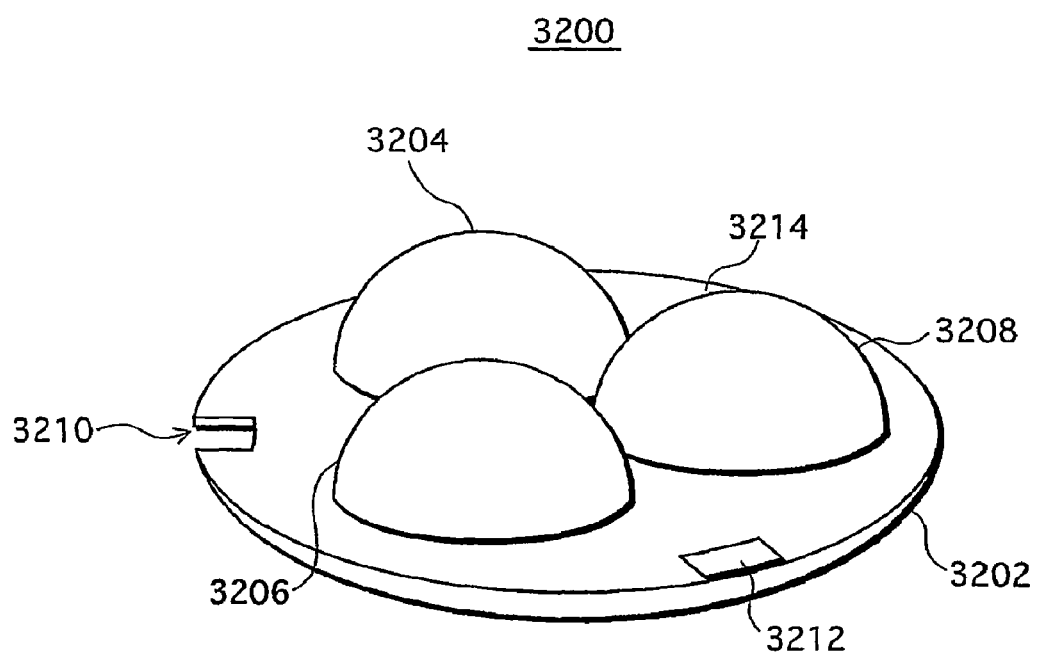
FIG. 52 is a perspective view illustrating an LED module relating to the third embodiment.

FIG. 52 is an external perspective view illustrating a white LED module 3200 including LED array chips 3002 described above (hereinafter simply referred to as "an LED module 3200"). The LED module 3200 is attached to a lighting unit 3240 (mentioned later).

The LED module 3200 includes a ceramics substrate 3202 that is in a shape of a circle having a diameter of 5 cm and is made of AlN and three lenses 3204, 3206 and 3208 made of glass. A guiding depression 3210 used to attach the LED module 3200 to the lighting unit 3240 and terminals 3212 and 3214 to receive a power supply from the lighting unit 3240 are provided in the ceramics substrate 3202.

FIG. 53A is a plan view illustrating the LED module 3200, FIG. 53B illustrates a cross-section of the LED module 3200 along a line XX shown in FIG. 53A, and FIG. 53C is an enlargement view illustrating a portion Y shown in FIG. 53B.

As shown in FIGS. 53A and 53B, a guiding hole (a through hole) 3216 is provided in the center of the ceramics substrate 3202 to attach the LED module 3200 to the lighting unit 3240. As shown in FIG. 53C, a gold plating 3217 is applied to a lower surface of the ceramics substrate 3202 for improving heat dissipation.

The LED array chip 3002 is mounted at a location, on an upper surface of the ceramics substrate 3202, corresponding to a center of each of the lenses 3204, 3206 and 3208 having a shape of a circle as shown in FIG. 53A. In total, three LED array chips 3002 are mounted on the ceramics substrate 3202.

The ceramics substrate 3202 is made up of two ceramics substrates 3201 and 3203 each of which has a thickness of 0.5 mm and is mainly made of AlN. The ceramics substrates 3201 and 3203 may be made of $Al_2O_3$, BN, MgO, ZnO, SiC and diamond, instead of AlN.

The LED array chips 3002 are mounted on the lower ceramics substrate 3201. Taper through holes 3215 are provided in the upper ceramics substrate 3203, so as to create spaces for mounting the LED array chips 3002.

A cathode pad 3218 and an anode pad 3220 (shown in FIG. 54B) are provided at the location, on an upper surface of the ceramics substrate 3201, where each LED array chip 3002 is to be mounted. Each of the cathode pad 3218 and the anode pad 3220 is made up of nickel (Ni) plating and then gold (Au) plating applied on copper (Cu). The LED array chip 3002 is mounted on the ceramics substrate 3201 in such a manner that the SiC substrate 3004 is adhered to the ceramics substrate 3201. Here, the power supply terminals 3036 and 3038 are respectively connected to the cathode pad 3218 and the anode pad 3220 using solder. Instead of solder, a gold bump or a silver paste may be used.

In the LED array chip 3002, no components that block light, such as a bonding wire, exist on or above a light extraction surface. Therefore, light emitted from the LED array chip 3002 does not contain shadow. This feature is highly valuable for a light source used for lighting.

Before being mounted, the LED array chips 3002 have been tested for their optical performance, such as unevenness of color, and have passed the test. According to the third embodiment, the LED array chip 3002 includes the phosphor film 3050, and can emit white light by itself. As describe above, this makes it possible to test the LED array chip 3002 for its optical performance before the LED array chip 3002 is mounted. Consequently, it can be prevented that the LED module 3200 including the LED array chips 3002 is rejected due to poor optical performance of the LED array chips 3002. As a result, the ratio of accepted finished products (LED modules 3200) to all finished products can be improved.

An aluminum reflection film 3219 is formed on a wall of each through hole 3215 provided in the upper ceramics substrate 3203 and on an upper surface of the ceramics substrate 3203.

The lenses 3204, 3206 and 3208 are adhered to the ceramics substrate 3203 using an adhesive agent 3221. The adhesive agent 3221 may be a silicone resin, an epoxy resin or the like.

The three LED array chips 3002 are connected in parallel by a wiring pattern formed on the upper surface of the ceramics substrate 3201.

Figure 54A:
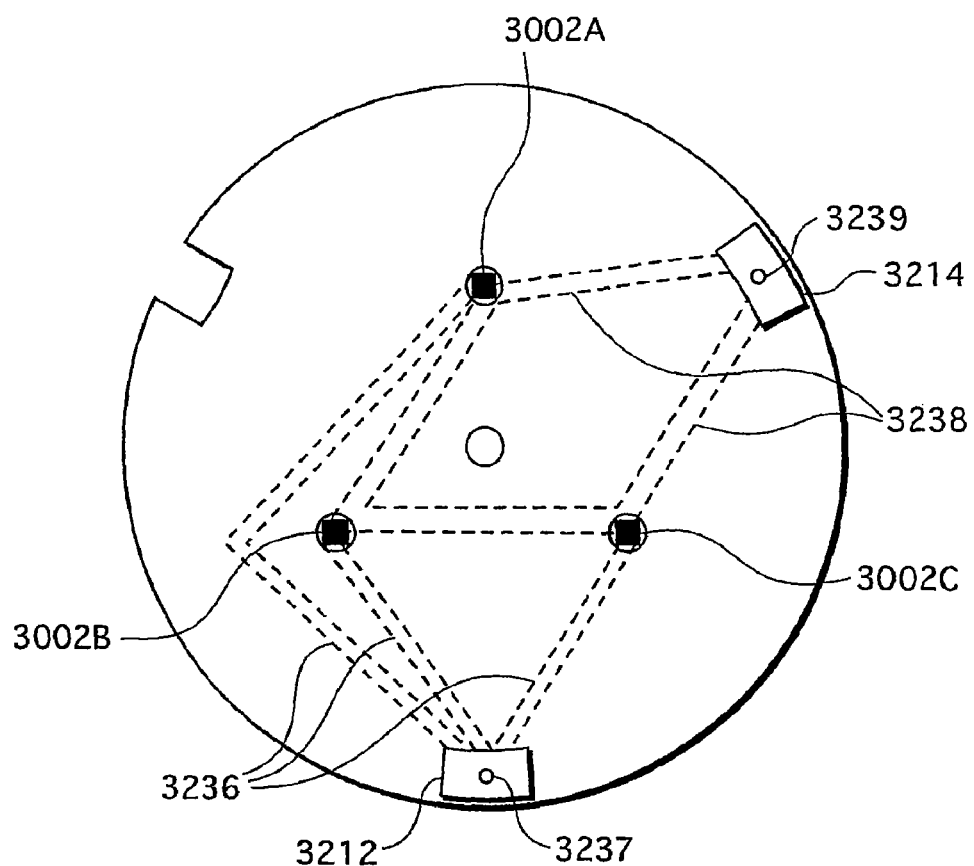
FIG. 54A illustrates the LED module relating to the third embodiment after removing a lens.
Figure 54B:
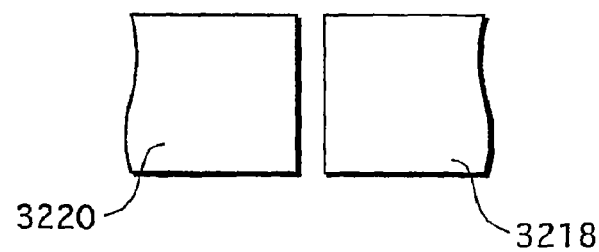
FIG. 54B illustrates a pad pattern formed on a ceramics substrate constituting the LED module relating to the third embodiment.

FIG. 54A is a plan view illustrating the LED module 3200 after removing the lenses 3204, 3206 and 3208. In FIG. 54A, the three LED array chips 3002 are distinguished from each other by addition of marks of A, B and C.

As described above, the anode pad 3220 and the cathode pad 3218 (FIG. 54B) are provided at the location, on the upper surface of the ceramics substrate 3201, where each of the LED array chips 3002A, 3002B and 3002C is mounted.

The anode pads 3220 that are respectively connected to the LED array chips 3002A, 3002B and 3002C are electrically connected to each other by a wiring pattern 3236. The wiring pattern 3236 is connected to the positive terminal 3212 at its end by a through hole 3237. The cathode pads 3218 that are respectively connected to the LED array chips 3002A, 3002B and 3002C are electrically connected to each other by a wiring pattern 3238. The wiring pattern 3238 is connected to the negative terminal 3214 at its end by a through hole 3239. In other words, the LED array chips 3002A, 3002B and 3002C are connected in parallel by the wiring patterns 3236 and 3238.

The LED module 3200 described above is attached to the lighting unit 3240. The LED module 3200 and the lighting unit 3240 constitute a lighting apparatus 3242.

Figure 55A:
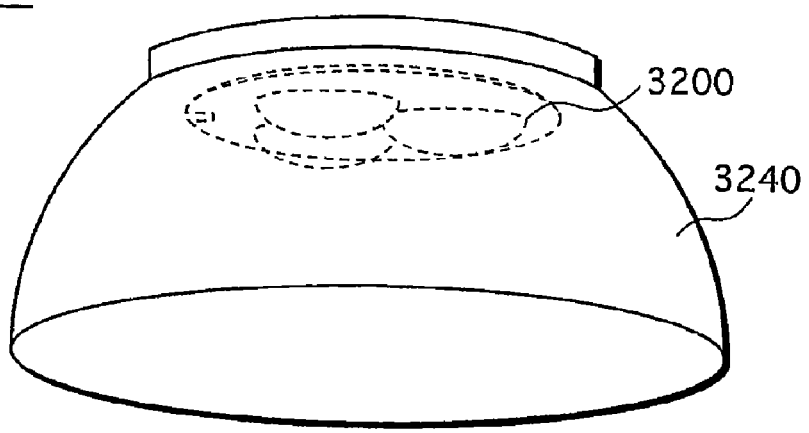
FIG. 55A is a perspective view illustrating a lighting apparatus relating to the third embodiment.
Figure 55B:
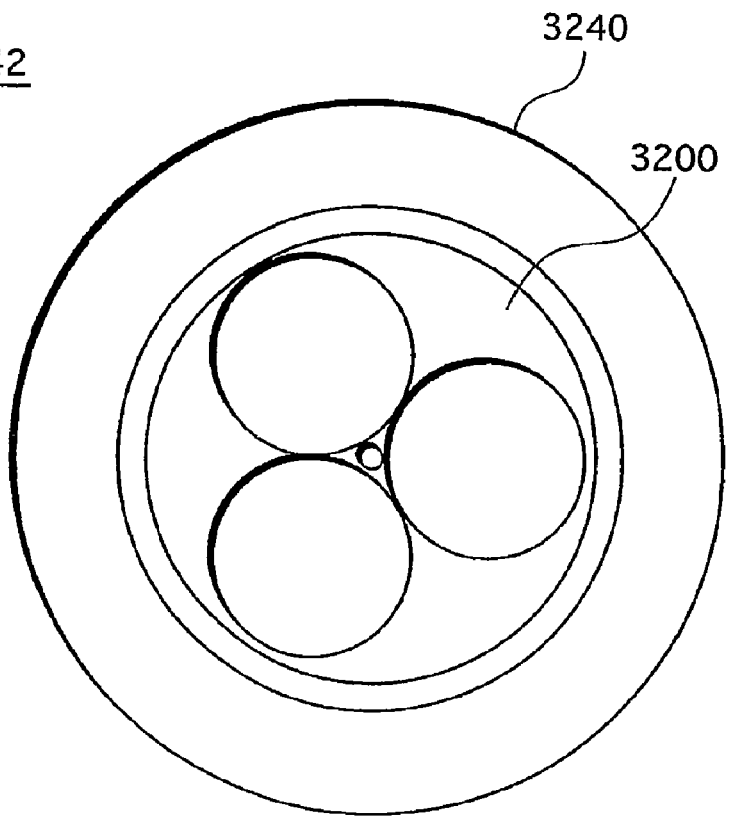
FIG. 55B is a bottom plan view illustrating the lighting apparatus relating to the third embodiment.

FIG. 55A is a schematic perspective view illustrating the lighting apparatus 3242, and FIG. 55B is a bottom plan view illustrating the lighting apparatus 3242.

The lighting unit 3240 is, for example, fixed on a ceiling of a room. The lighting unit 3240 includes a power supply circuit (not shown in FIGS. 55A and 55B) that converts alternating-current power (e.g. 100 V, 50/60 Hz) supplied from a commercial power source into direct-current power required for driving the LED module 3200.

Figure 56:
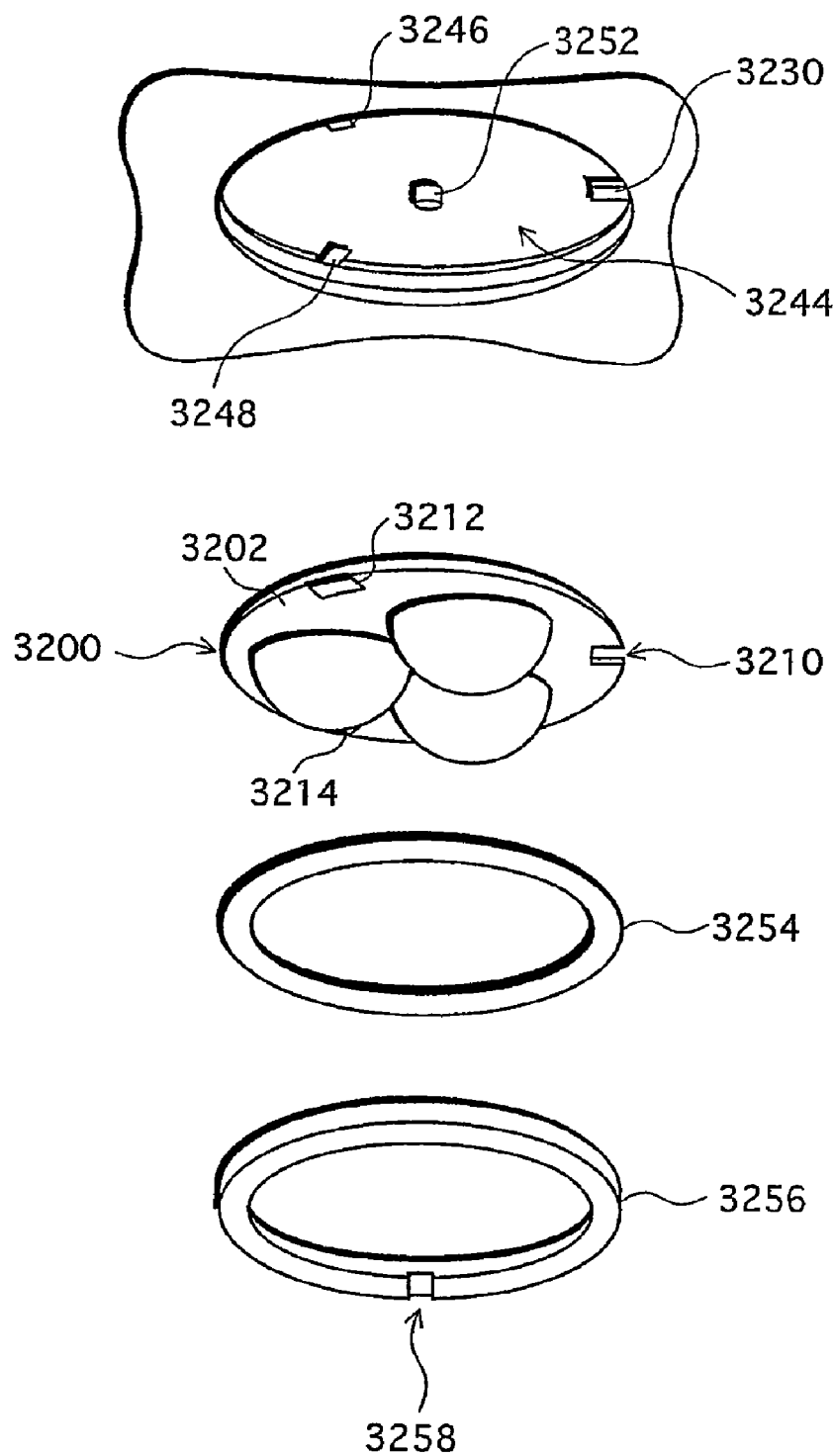
FIG. 56 is a perspective exploded view illustrating the lighting apparatus relating to the third embodiment.

The following part describes a construction to attach the LED module 3200 to the lighting unit 3240, with reference to FIG. 56.

The lighting unit 3240 has a circular depression 3244 in which the LED module 3200 is to be fitted. A bottom surface of the circular depression 3244 is flat. An internal thread (not shown in FIG. 56) is created, in the vicinity of an open end of the circular depression 3244, on an inside wall of the circular depression 3244. Flexible power supply terminals 3246 and 3248 and a guiding protrusion 3230 protrude from the inside wall of the circular depression 3244, between the internal thread and the bottom surface of the circular depression 3244. The power supply terminals 3246 and 3248 are respectively positive and negative. A guiding pin 3252 is provided in the center of the bottom surface of the circular depression 3244.

An O-ring 3254 made of silicon rubber and a ring screw 3256 are used to attach the LED module 3200 to the lighting unit 3240. The ring screw 3256 has a shape of a ring that has a substantially rectangular cross-section. An external thread (not shown in FIG. 56) is created on an outer surface of the ring screw 3256, and a depression 3258 is provided.

The following part describes a procedure of attaching the LED module 3200 to the lighting unit 3240.

To start with, the LED module 3200 is fitted in the circular depression 3244 in the following manner. The ceramics substrate 3202 of the LED module 3200 is positioned between the bottom surface of the circular depression 3244 and the power supply terminals 3246 and 3248. The guiding pin 3252 is fitted in the guiding hole 3216, so as to align the center of the LED module 3200 with the center of the circular depression 3244. Furthermore, the guiding protrusion 3230 is fitted in the guiding depression 3210, so as to align the positive and negative terminals 3212 and 3214 with the power supply terminals 3246 and 3248 respectively.

After the LED module 3200 is fitted in the circular depression 3244, the ring screw 3256 to which the O-ring 3254 has been attached is screwed into the circular depression 3244 and fixed. Thus, the positive and negative terminals 3212 and 3214 are respectively connected to the power supply terminals 3246 and 3248, so that the terminals 3212 and 3214 are electrically connected to the terminals 3246 and 3248 reliably. In addition, the substantially entire lower surface of the ceramics substrate 3202 is connected to the flat bottom surface of the circular depression 3244. This enables heat generated in the LED module 3200 to be effectively conducted to the lighting unit 3240, thereby improving a cooling effect of the LED module 3200. Here, silicone grease may be applied to the lower surface of the ceramics substrate 3202 and the bottom surface of the circular depression 3244 to further improve the heat conduction efficiency from the LED module 3200 to the lighting unit 3240.

When power is supplied to this lighting apparatus 3242 from a commercial power source, the light emitting layer 3018 of each LED in the LED array chip 3002 emits blue light. Here, part of the blue light is converted into yellow light by the phosphor within the phosphor film 3050. The blue light and the yellow light mix together, to generate white light. The white light is emitted through the lenses 3204, 3206 and 3208.

As described above, a spot shape of the white light generated by the LED array chip 3002 is substantially circular. The lighting apparatus 3242 including a plurality of LED array chips 3002 (three chips 3002 in the third embodiment) can also produce light which has a substantially circular spot shape when irradiated to a surface positioned distant enough from the lighting apparatus 3242 in relation to a diameter of each of the lenses 3204, 3206 and 3208 and an interval between any two of the lenses 3204, 3206 and 3208.

Figure 57:
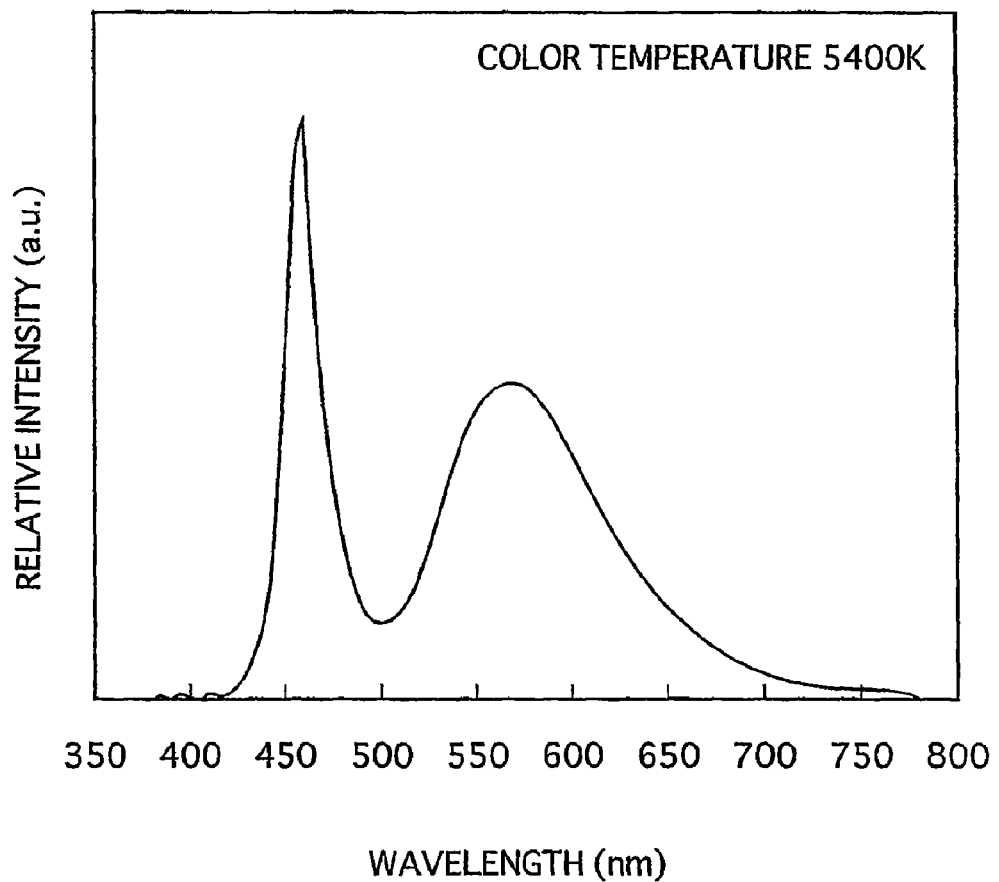
FIG. 57 shows an emission spectrum of the lighting apparatus relating to the third embodiment.

When an electric current of 150 mA is applied to the LED module 3200, a total luminous flux of 800 lm, an on-axis luminous intensity of 1500 cd, and an emission spectrum shown in FIG. 57 are observed.

(Fourth Embodiment)

The following part describes an SMD LED including one of the LED chips (2, 2002, 2102, 2202 and 3002) relating to the first to third embodiments.

An SMD LED relating to a fourth embodiment may include any one of the LED chips 2, 2002, 2102, 2202 and 3002. The following description is made taking the LED array chip 2 relating to the first embodiment as an example.

Figure 58A:
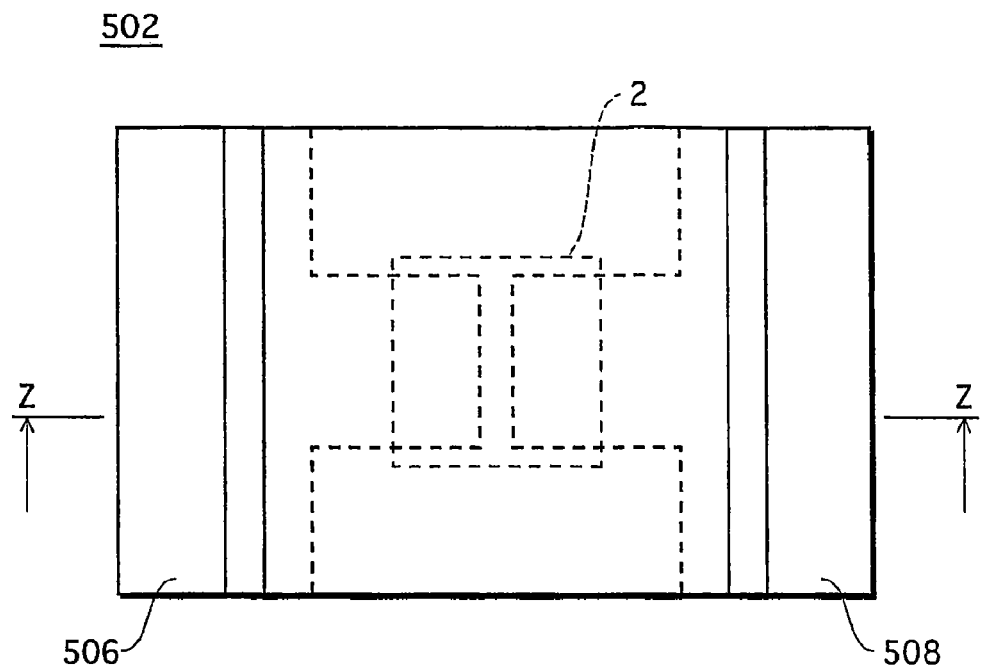
FIG. 58A is a plan view illustrating a surface mounting device (SMD) LED relating to a fourth embodiment.
Figure 58B:
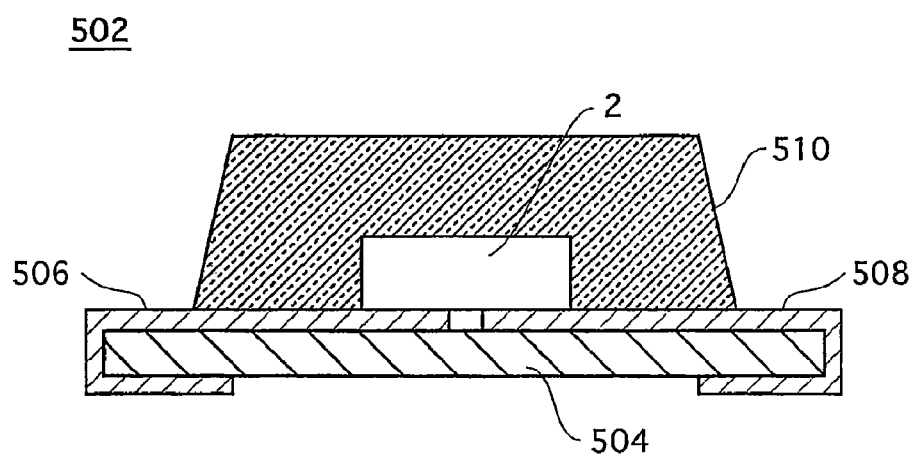
FIG. 58B illustrates a cross-section of the SMD LED along a line ZZ shown in FIG. 58A.

FIG. 58A is a plan view illustrating an SMD LED 502 relating to the fourth embodiment (hereinafter referred to as "an LED 502"), and FIG. 58B illustrates a cross-section of the LED 502 along a line ZZ shown in FIG. 58A.

The LED 502 includes a rectangular ceramic substrate 504, and a pair of power supply terminals 506 and 508 each of which is formed so as to partially cover both upper and lower main surfaces of the ceramic substrate 504. The LED array chip 2 is mounted so as to extend over edge portions, on the upper main surface of the ceramic substrate 504, of the power supply terminals 506 and 508. The LED array chip 2 is sealed using an epoxy resin 510 as a sealing member.

When power is supplied to the LED 502 described above through the power supply terminals 506 and 508, the LED array chip 2 emit white light. The white light is emitted outward through the epoxy resin 510.

The LED 502 is surface-mounted on an electronic device in such a manner that edge portions, on the lower main surface of the ceramic substrate 504, of the power supply terminals 506 and 508 are electrically connected to a wiring pattern formed on a printed-wiring board of the electronic device.

It should be noted that the present invention is not limited to the above-described embodiments. The present invention includes the following modification examples.

(1) According to the third embodiment, the multilayer epitaxial structure is formed like a circular cylinder. However, the third embodiment is not limited to such. The multilayer epitaxial structure may be formed like a cylinder with N-sided polygons for bases, where N is an integer equal to or larger than five. In this way, a spot shape of light emitted from the LED array chip 3002 is more like a circle than a rectangle. In addition, it is preferable that the multilayer epitaxial structure is formed as a cylinder with regular N-sided polygons for bases, where N is an even integer. In this way, the spot shape of light emitted from the LED array chip 3002 can be point-symmetric, such as a circle.

(2) According to the third embodiment, light emitted from the light emitting module 3200 or the lighting apparatus 3242 has a circular (point-symmetric) spot shape, as a circular spot shape of light emitted from each LED array chip 3002 (semiconductor light emitting device) is scarcely worsened. However, the light emitted from the light emitting module 3200 or the lighting apparatus 3242 may be required to have a point-asymmetric spot shape, depending on use of the light emitting module 3200 or the lighting apparatus 3242. The semiconductor light emitting device relating to the third embodiment can easily produce light having a desired point-asymmetric spot shape since it is comparatively easy to convert light with a point-symmetric spot shape into light with a desired point-asymmetric spot shape. This conversion is achieved by providing a known mechanism for converting a point-symmetric spot shape into a desired spot shape, on the light extraction side of the semiconductor light emitting device. When such a mechanism is provided, the lighting apparatus 3242 is, for example, used for a head lamp of a car.

(3) According to the third embodiment, the circular-cylinder-like multilayer epitaxial structure is divided into 36 portions, to form 36 independent LEDs (light emitting elements). However, the number of the independent LEDs is not limited to 36.

Alternatively, the cylinder-like multilayer epitaxial structure may not be divided. Which is to say, an LED chip that is constituted by one LED (light emitting element) may be obtained, instead of the LED array chip 3002.

(4) According to the third embodiment, the cylinder member 3006 is formed by removing an unnecessary area of all of the layers 13012, 13014, 13016, 13018, 13020, 13022 and 13024 making up the multilayer epitaxial structure (see step H5 in FIG. 49). However, it may not be all of these layers which are removed. (However, the division grooves 3008, 3010 and 3011 need to be formed by removing corresponding areas of all of these layers.) Alternatively, the cylinder member 3006 can be formed by removing an unnecessary area of the layers from an outmost layer (the $n^+$-GaN layer 13024) to a conductive layer between the light emitting layer 13018 and the SiC substrate 13004 (the n-GaN clad layer 13016). As long as the unnecessary area of these layers 13024, 13022, 13020, 13018 and 13016 is removed, a side surface of the light emitting layer is exposed on a side surface of the cylinder member 3006. Furthermore, the phosphor film 3050 can be formed, at a large thickness, not only on the upper main surface of the outmost layer 13024 but also on the side surface of the cylinder member 3006. As a consequence, unevenness of color can be reduced.

(5) According to the third embodiment, the SiC substrate 13004 is used as a base substrate for forming, by epitaxial growth, the multilayer epitaxial structure made up of the n-AlGaN buffer layer 13012 to the p-GaN contact layer 13022. The reason for this is explained in the following. The SiC substrate 13004 has equal or higher heat conductivity compared with copper and aluminum. This feature enables heat generated within the light emitting layer 3018 to be effectively conducted to the ceramics substrate 3201, which is a printed-wiring board on which the LED array chips 3002 are mounted. Accordingly, the SiC substrate 13004 can be replaced with any of an MN substrate, a GaN substrate, a BN substrate and an Si substrate which similarly have high heat conductivity.

Alternatively, the SiC substrate 13004 can be replaced with a common sapphire substrate to realize the present invention, even though the sapphire substrate has slightly lower heat conductivity.

(6) According to the third embodiment, the LED array chip 3002 is a square approximately 2 mm on a side. However, the third embodiment is not limited to such.

(7) According to the third embodiment, depressions are formed by providing the n⁺-GaN regrowth layer 3024, in order to improve light extraction efficiency. However, the third embodiment is not limited to such. The depressions may be formed in a different manner. For example, a pattern mask is formed on the p-GaN contact layer 3022 and etching is then conducted. Alternatively, a dielectric layer made of, for example, $Ta_2O_5$ is formed on the p-GaN contact layer 3022. After this, a pattern mask is formed on the dielectric layer and etching is then conducted.

(8) According to the third embodiment, the cylinder member 3006 (the multilayer epitaxial structure) is formed by epitaxial growth on the SiC substrate 3004 which is a constituent of the LED array chip 3002. However, the third embodiment is not limited to such. Similarly to the first to third modification examples of the second embodiment, the cylinder member 3006 (the multilayer epitaxial structure) is first formed by epitaxial growth on a single-crystal substrate (e.g. a sapphire substrate) which is different from the SiC substrate 3004, and then transferred to the SiC substrate 3004. In other words, the SiC substrate 3004 which is a base substrate constituting the LED array chip 3002 may or may not be a substrate on which the cylinder member 3006 (the multilayer epitaxial structure) is formed by epitaxial growth.

Industrial Applicability

As describe above, a semiconductor light emitting device relating to an embodiment of the present invention is applicable to a lighting apparatus. This is because a light emitting device used for a lighting apparatus needs to be tested for its optical performance, for example, unevenness of color, before being mounted on the lighting apparatus.

The invention claimed is:

1. A semiconductor light emitting device comprising:
a base substrate;
a multilayer epitaxial structure that (i) includes a first conductive layer, a second conductive layer and a light emitting layer that is formed between the first conductive layer and the second conductive layer, (ii) has a shape of a cylinder with a substantially circular or N-sided polygonal cross-section, where N is an integer equal to or larger than five, (iii) is formed on the base substrate in such a manner that the first conductive layer is positioned closer to the base substrate than the second conductive layer is, and (iv) is divided into a plurality of portions which are a plurality of independent light emitting elements, the plurality of portions being formed by (a) equiangularly spaced division grooves radially extending from a center of the cylinder and dividing the cylinder into sector forms and (b) division grooves dividing the sector forms in a circumferential direction of the cylinder, the light emitting layer included in each independent light emitting element having a substantially same area; and
a phosphor film that covers a main surface of the multiplayer epitaxial structure which faces away from the base substrate, and every side surface of the multilayer epitaxial structure from a layer including the main surface to include at least the light emitting layer.

2. The semiconductor light emitting device of claim 1, wherein the phosphor film is applied at a substantially same thickness.

3. The semiconductor light emitting device of claim 1, wherein the multilayer epitaxial structure further includes a light reflective layer which is formed between the first conductive layer and the base substrate.

4. The semiconductor light emitting device of claim 1, wherein
in each of the plurality of independent light emitting elements,
a first electrode is formed on a part of a main surface of the first conductive layer, the part being created by partially removing the second conductive layer and the light emitting layer, and a second electrode is formed on a main surface of the second conductive layer, and
the plurality of independent light emitting elements are connected with each other in series in such a manner that a first electrode of one independent light emitting element is connected to a second electrode of another independent light emitting element using a wiring formed by a thin metal film.

5. A semiconductor light emitting device comprising:
a base substrate;
a multilayer epitaxial structure that (i) includes a first conductive layer, a second conductive layer and a light emitting layer that is formed between the first conductive layer and the second conductive layer, (ii) has a shape of a circular cylinder, (iii) is formed on the base substrate in such a manner that the first conductive layer is positioned closer to the base substrate than the second conductive layer is, and (iv) is divided into a plurality of portions by equiangularly spaced division grooves radially extending from a center of the cylinder and X number of circumferential division grooves positioned in a circumferential direction of the cylinder, the plurality of portions being a plurality of independent light emitting elements, a ratio of a radius of the cylinder to a radius of a $Y^{th}$ circumferential division groove counted from the center of the cylinder being $\sqrt{(X+1)}\sqrt{Y}$; and
a phosphor film that covers a main surface of the multiplayer epitaxial structure which faces away from the base substrate, and every side surface of the multilayer epitaxial structure from a layer including the main surface to include at least the light emitting layer.

6. The semiconductor light emitting device of claim 5, wherein the phosphor film is applied at a substantially same thickness.

7. The semiconductor light emitting device of claim 5, wherein the multilayer epitaxial structure further includes a light reflective layer which is formed between the first conductive layer and the base substrate.

8. The semiconductor light emitting device of claim 5, wherein
in each of the plurality of independent light emitting elements,
a first electrode is formed on a part of a main surface of the first conductive layer, the part being created by partially removing the second conductive layer and the light emitting layer, and a second electrode is formed on a main surface of the second conductive layer, and
the plurality of independent light emitting elements are connected with each other in series in such a manner that a first electrode of one independent light emitting element is connected to a second electrode of another independent light emitting element using a wiring formed by a thin metal film.

9. A semiconductor light emitting device comprising:
base substrate;
a multilayer epitaxial structure that (i) includes a first conductive layer, a second conductive layer and a light emitting layer that is formed between the first conductive layer and the second conductive layer, (ii) has a shape of a circular cylinder, (iii) is formed on the base substrate in such a manner that the first conductive layer is positioned closer to the base substrate than the second conductive layer is, and (iv) is divided into a plurality of portions by equiangularly spaced division grooves radially extending from a center of the cylinder and a $1^{st}$ and a $2^{nd}$ circumferential division groove positioned in a circumferential direction of the cylinder, the plurality of portions being a plurality of independent light emitting elements, a radius of the cylinder, a radius of the $1^{st}$ circumferential division groove, and a radius of the $2^{nd}$ circumferential division groove being at a ratio of $\sqrt{3}:\sqrt{2}:1$; and a phosphor film that covers a main surface of the multiplayer epitaxial structure which faces away from the base substrate, and every side surface of the multilayer epitaxial structure from a layer including the main surface to include at least the light emitting layer.

10. The semiconductor light emitting device of claim 9, wherein the phosphor film is applied at a substantially same thickness.

11. The semiconductor light emitting device of claim 9, wherein the multilayer epitaxial structure further includes a light reflective layer which is formed between the first conductive layer and the base substrate.

12. The semiconductor light emitting device of claim 9, wherein
in each of the plurality of independent light emitting elements,
a first electrode is formed on a part of a main surface of the first conductive layer, the part being created by partially removing the second conductive layer and the light emitting layer, and a second electrode is formed on a main surface of the second conductive layer, and
the plurality of independent light emitting elements are connected with each other in series in such a manner that a first electrode of one independent light emitting element is connected to a second electrode of another independent light emitting element using a wiring formed by a thin metal film.

* * * * *